United States Patent
Lee et al.

(10) Patent No.: US 10,672,959 B2
(45) Date of Patent: Jun. 2, 2020

(54) LIGHT EMITTING DEVICE PACKAGE AND LIGHT SOURCE APPARATUS

(71) Applicant: LG INNOTEK CO., LTD., Seoul (KR)

(72) Inventors: Tae Sung Lee, Seoul (KR); June O Song, Seoul (KR); Chang Man Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 54 days.

(21) Appl. No.: 15/766,444

(22) PCT Filed: Sep. 29, 2017

(86) PCT No.: PCT/KR2017/011082
§ 371 (c)(1),
(2) Date: Apr. 6, 2018

(87) PCT Pub. No.: WO2019/004518
PCT Pub. Date: Jan. 3, 2019

(65) Prior Publication Data
US 2019/0088837 A1    Mar. 21, 2019

(30) Foreign Application Priority Data
Jun. 26, 2017    (KR) .................. 10-2017-0080781

(51) Int. Cl.
*H01L 33/56*    (2010.01)
*H01L 33/62*    (2010.01)
(Continued)

(52) U.S. Cl.
CPC ............ *H01L 33/56* (2013.01); *F21V 23/007* (2013.01); *H01L 24/16* (2013.01); *H01L 33/40* (2013.01);
(Continued)

(58) Field of Classification Search
CPC ...... H01L 33/48; H01L 33/483; H01L 33/486; H01L 33/62; H01L 33/64; H01L 33/644
See application file for complete search history.

(56) References Cited

U.S. PATENT DOCUMENTS

| 8,987,022 B2 * | 3/2015 | Yoo ................. H01L 33/486 438/27 |
| 2010/0059785 A1 * | 3/2010 | Lin ................. H01L 23/3121 257/99 |

(Continued)

FOREIGN PATENT DOCUMENTS

| EP | 3116037 A1 | 1/2017 |
| JP | 2011-44593 A | 3/2011 |

(Continued)

*Primary Examiner* — Sue A Purvis
*Assistant Examiner* — Scott Stowe
(74) *Attorney, Agent, or Firm* — Birch, Stewart, Kolasch & Birch, LLP

(57) ABSTRACT

A light emitting device package can include first and second frames spaced apart from each other; a package body including a body portion between the first and second frames; a light emitting device including first and second electrode pads; first and second through holes in the first and second frames, respectively; a first resin between the body portion and the light emitting device; and a conductive material in the first and second through holes, in which the first and second electrode pads of the light emitting device respectively overlap with the first and second through holes, the first and second electrode pads are spaced apart from each other, and the conductive material in the first and second through holes respectively contacts the first and second electrode pads, and a first side surface of the first electrode pad and a second side surface of the second electrode pad facing the first side surface both contact the first resin.

19 Claims, 29 Drawing Sheets

(51) Int. Cl.
*H01L 33/48* (2010.01)
*H01L 23/00* (2006.01)
*F21V 23/00* (2015.01)
*H01L 33/40* (2010.01)
*H01L 33/60* (2010.01)

(52) U.S. Cl.
CPC ............ *H01L 33/486* (2013.01); *H01L 33/62* (2013.01); *H01L 33/60* (2013.01); *H01L 2224/16257* (2013.01); *H01L 2224/26175* (2013.01); *H01L 2224/73204* (2013.01)

(56) References Cited

U.S. PATENT DOCUMENTS

2011/0260186 A1 10/2011 Jeong
2015/0228873 A1 8/2015 Gebuhr et al.
2016/0149103 A1 5/2016 Oh et al.

FOREIGN PATENT DOCUMENTS

| JP | 2014-146848 A | 8/2014 |
| KR | 10-2009-0010445 A | 1/2009 |
| KR | 10-2011-0069319 A | 6/2011 |
| KR | 10-2011-0111173 A | 10/2011 |
| KR | 10-2012-0084553 A | 7/2012 |

\* cited by examiner

LIGHT EMITTING DEVICE PACKAGE AND LIGHT SOURCE APPARATUS

CROSS REFERENCE TO THE RELATED APPLICATIONS

This application is the National Phase of PCT International Application No. PCT/KR2017/011082, filed on Sep. 29, 2017, which claims priority under 35 U.S.C. § 119(a) to Patent Application No. 10-2017-0080781, filed in Republic of Korea on Jun. 26, 2017, all of which are hereby expressly incorporated by reference into the present application.

TECHNICAL FIELD

Embodiments relate to a semiconductor device package, a method of manufacturing a semiconductor device package, and a light source apparatus.

BACKGROUND ART

A semiconductor device including compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using group III-V or group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using group III-V or group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using the group III-V or group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescent lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For example, since a nitride semiconductor has high thermal stability and wide bandgap energy, it has received great attention in the field of development of optical devices and high power electronic devices. Particularly, a blue light emitting device, a green light emitting device, an ultraviolet (UV) light emitting device, and a red light emitting device using the nitride semiconductor are commercialized and widely used.

For example, the ultraviolet light emitting device refers to a light emitting diode that generates light distributed in a wavelength range of 200 nm to 400 nm. In the above wavelength range, a short wavelength may be used for sterilization, purification or the like and a long wavelength may be used for a stepper, a curing apparatus or the like.

Ultraviolet rays may be classified into UV-A (315 nm to 400 nm), UV-B (280 nm to 315 nm) and UV-C (200 nm to 280 nm) in an order of the long wavelength. The UV-A (315 nm to 400 nm) domain is applied to various fields such as industrial UV curing, curing of printing ink, exposure machine, discrimination of counterfeit money, photocatalytic sterilization, special lighting (such as aquarium/agriculture), the UV-B (280 nm to 315 nm) domain is applied to medical use, and the UV-C (200 nm to 280 nm) domain is applied to air purification, water purification, sterilization products and the like.

In addition, as a semiconductor device capable of providing a high output has been requested, studies on a semiconductor device capable of increasing an output power by applying a high-power source have been proceeding.

In addition, as for a semiconductor device package, studies on a method of improving the light extraction efficiency of a semiconductor device and improving the light intensity in a package stage have been proceeding. In addition, as for the semiconductor device package, studies on a method of improving bonding strength between a package electrode and a semiconductor device have been proceeding.

In addition, as for the semiconductor device package, studies on a method of reducing the manufacturing cost and improving the manufacturing yield by improving the process efficiency and changing the structure have been proceeding.

SUMMARY OF THE INVENTION

The embodiments may provide a semiconductor device package capable of improving the light extraction efficiency and electrical characteristics, a method of manufacturing the semiconductor device package, and a light source apparatus.

The embodiments may provide a semiconductor device package capable of reducing the manufacturing cost and improving the manufacturing yield, a method of manufacturing the semiconductor device package, and a light source apparatus.

Embodiments provide a semiconductor device package and a method of manufacturing a semiconductor device package that may prevent a re-melting phenomenon from occurring in a bonding region of the semiconductor device package during a process of re-bonding the semiconductor device package to a substrate or the like.

According to an embodiment, a light emitting device package may include: first and second frames spaced apart from each other; a body disposed between the first and second frames; a light emitting device including first and second electrodes; and an adhesive disposed between the body and the light emitting device, in which first and second opening parts may be provided through upper and lower surfaces of the first and second frames, respectively, the body may include a recess concavely provided from an upper surface toward a lower surface of the body, the adhesive may be disposed in the recess, the first electrode may be disposed on the first opening part, and the second electrode may be disposed on the second opening part.

According to an embodiment, the adhesive may make direct contact with the upper surface of the body and a lower surface of the light emitting device.

According to an embodiment, a light emitting device package may include a first conductive layer provided in the first opening part in direct contact with a lower surface of the first electrode, and a second conductive layer provided in the second opening part in direct contact with a lower surface of the second electrode.

According to an embodiment, the first conductive layer may include a first upper conductive layer provided in an upper region of the first opening part and a first lower conductive layer provided in a lower region of the first opening part, and the first upper conductive layer and the first lower conductive layer may include mutually different materials.

According to an embodiment, the first frame and the second frame may be conductive frames.

According to an embodiment, the first frame and the second frame may be insulating frames.

According to an embodiment, a light emitting device package may include a first upper recess provided in the upper surface of the first frame while being spaced apart from the first opening part, and a second upper recess provided in the upper surface of the second frame while being spaced apart from the second opening part.

According to an embodiment, a light emitting device package may include a first resin part provided in the first upper recess and a second resin part provided in the second upper recess, in which the first resin part and the second resin part may include white silicone.

According to an embodiment, a light emitting device package may include a first lower recess provided in the lower surface of the first frame while being spaced apart from the first opening part, and a second lower recess provided in the lower surface of the second frame while being spaced apart from the second opening part.

According to an embodiment, a light emitting device package may include a first resin part provided in the first lower recess and a second resin part provided in the second lower recess, in which the first resin part and the second resin part may include a material same to a material of the body.

According to an embodiment, the first and second lower recesses may be provided with a material same to a material of the first and second conductive layers and/or the body.

The semiconductor device package and the method of manufacturing the semiconductor device package according to the embodiment can improve light extraction efficiency, electrical characteristics and reliability.

The semiconductor device package and the method of manufacturing the semiconductor device package according to the embodiment can improve the process efficiency and propose a new package structure, thereby reducing manufacturing cost and improving manufacturing yield.

According to embodiments, the semiconductor device package is provided with a body having high reflectance, so that a reflector can be prevented from being discolored, thereby improving reliability of the semiconductor device package.

According to embodiments, the semiconductor device package and the method of manufacturing a semiconductor device can prevent a re-melting phenomenon from occurring in a bonding region of the semiconductor device package during a process of re-bonding the semiconductor device package to a substrate or the like.

DETAILED DESCRIPTION OF THE EMBODIMENTS

Hereinafter, embodiments will be described with reference to the accompanying drawings. In the description of the embodiments, in the situation that each layer (film), region, pattern or structure may be referred to as provided "on/over" or "under" a substrate, each layer (film), region, pad, or pattern, the terms "on/over" and "under" include both "directly" and "indirectly interposed with another layer." In addition, "on/over" or "under" of each layer will be described based on the drawings, but the embodiments are not limited thereto.

Hereinafter, a semiconductor device package and a method of manufacturing the semiconductor device package according to the embodiment will be described in detail with reference to the accompanying drawings. Hereinafter, the description will be based on a situation where a light emitting device is applied as an example of the semiconductor device.

First, a light emitting device package according to an embodiment of the present invention will be described with reference to FIGS. 1 to 3.

Figure 1:
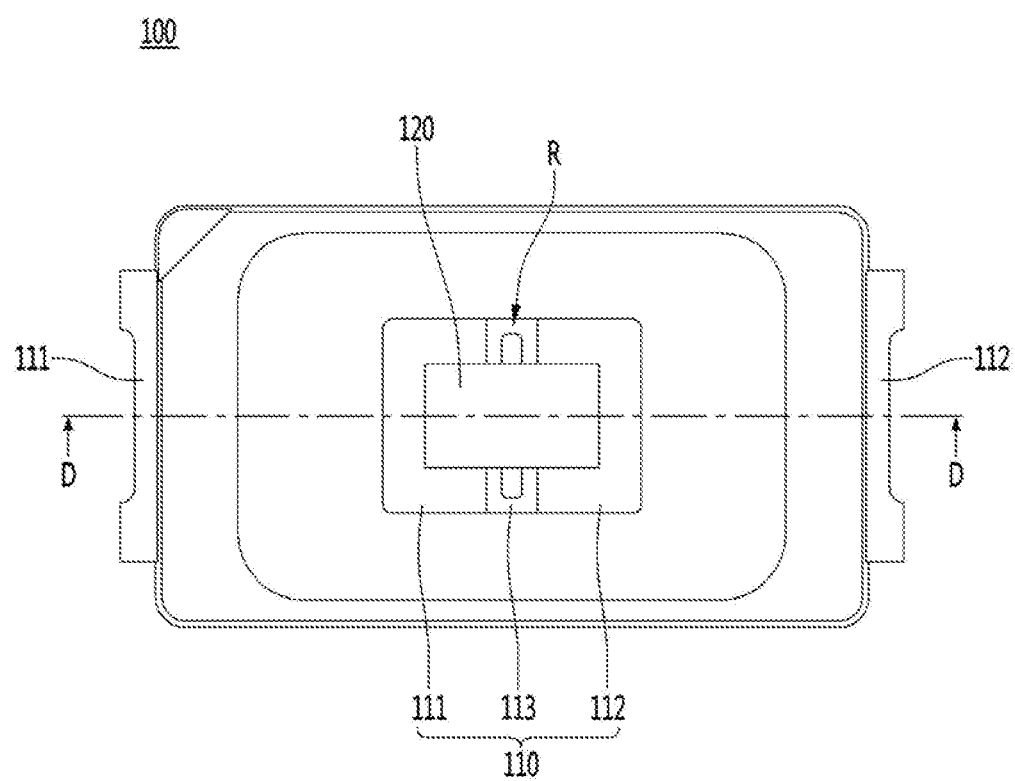
FIG. 1 is a plan view showing a light emitting device package according to an embodiment of the present invention.
Figure 2:
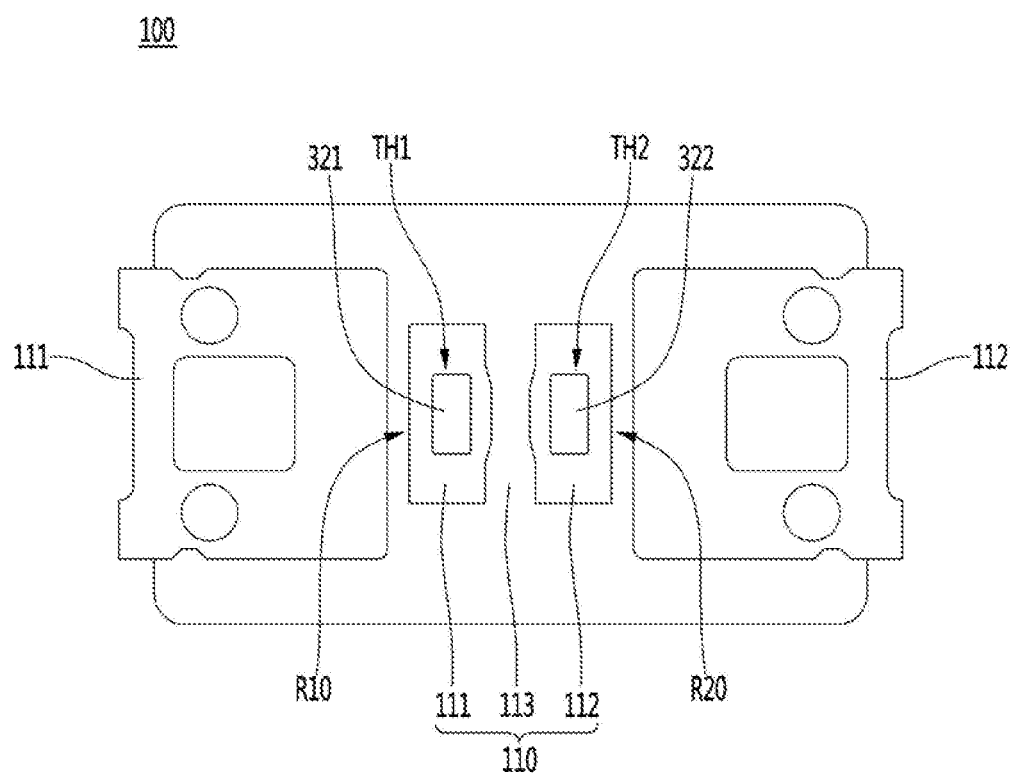
FIG. 2 is a bottom view showing the light emitting device package shown in FIG. 1.
Figure 3:
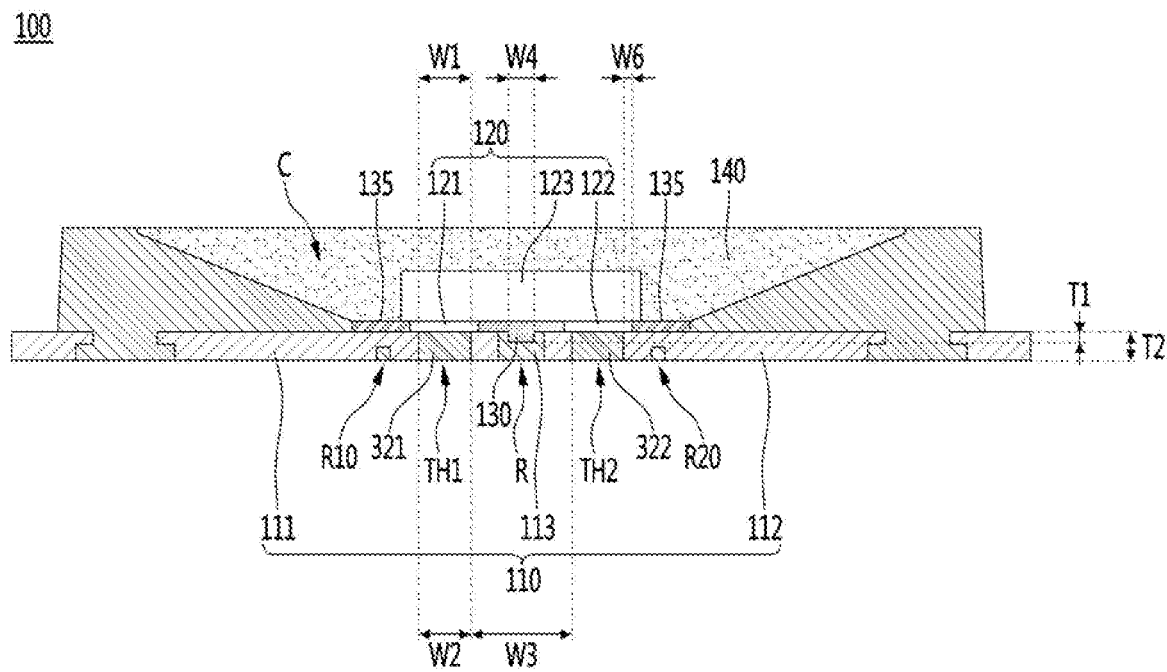
FIG. 3 is a sectional view showing the light emitting device package taken along line D-D of FIG. 1.

FIG. 1 is a plan view showing a light emitting device package according to an embodiment of the present invention, FIG. 2 is a bottom view showing the light emitting device package shown in FIG. 1, and FIG. 3 is a sectional view showing the light emitting device package taken along line D-D of FIG. 1.

According to an embodiment, as shown in FIGS. 1 to 3, a light emitting device package 100 may include a package body 110 and a light emitting device 120.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line. The body 113 may be also referred to as an insulating member.

The body 113 may be disposed on the first frame 111. In addition, the body 113 may be disposed on the second frame 112.

The body 113 may be provided with an inclined surface disposed on the first frame 111 and the second frame 112. Due to the inclined surface of the body 113, a cavity C may be provided over the first frame 111 and the second frame 112.

According to an embodiment, the package body 110 may have a structure provided with the cavity C, or may have a structure provided with a flat upper surface without the cavity C.

For example, the body 113 may be formed of a material selected from the group consisting of polyphthalamide (PPA), polychloro tri phenyl (PCT), liquid crystal polymer (LCP), polyamide9T (PA9T), silicone, an epoxy molding compound (EMC), a silicone molding compound (SMC), ceramic, a photo sensitive glass (PSG), a sapphire ($Al_2O_3$), and the like. In addition, the body 113 may include a high refractive filler such as $TiO_2$ and $SiO_2$.

The first frame 111 and the second frame 112 may be insulating frames. The first frame 111 and the second frame 112 may provide stable structural strength to the package body 110.

In addition, the first frame 111 and the second frame 112 may be conductive frames. The first frame 111 and the second frame 112 may provide stable the structural strength to the package body 110, and may be electrically connected to the light emitting device 120.

The difference between a situation where the first frame 111 and the second frame 112 are insulating frames and a situation where the first frame 111 and the second frame 112 are conductive frames will be described later.

According to the embodiment, the light emitting device 120 may include a first electrode 121, a second electrode 122, and a semiconductor layer 123.

The semiconductor layer 123 may include a first conductive semiconductor layer, a second conductive semiconductor layer, and an active layer disposed between the first conductive semiconductor layer and the second conductive semiconductor layer. The first electrode 121 may be electrically connected to the first conductive semiconductor layer. In addition, the second electrode 122 may be electrically connected to the second conductive semiconductor layer.

The light emitting device 120 may be disposed over the package body 110. The light emitting device 120 may be disposed over the first frame 111 and the second frame 112. The light emitting device 120 may be disposed in the cavity C provided by the package body 110.

The first electrode 121 may be disposed on a lower surface of the light emitting device 120. The second electrode 122 may be disposed on the lower surface of the light emitting device 120. The first electrode 121 and the second electrode 122 may be spaced apart from each other on the lower surface of the light emitting device 120.

The first electrode 121 may be disposed on the first frame 111. The second electrode 122 may be disposed on the second frame 112.

The first electrode 121 may be disposed between the semiconductor layer 123 and the first frame 111. The second electrode 122 may be disposed between the semiconductor layer 123 and the second frame 112.

The first electrode 121 and the second electrode 122 may be provided in a single layer or multiple layers using at least one material or an alloy selected from the group including Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, and Ni/IrOx/Au/ITO.

In addition, as shown in FIGS. 1 to 3, the light emitting device package 100 according to the embodiment may include a first opening part TH1 and a second opening part TH2. The first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The first opening part TH1 may be arranged under the first electrode 121 of the light emitting device 120. The first opening part TH1 may overlap with the first electrode 121 of the light emitting device 120. The first opening part TH1 may overlap with the first electrode 121 of the light emitting device 120 in the first direction, which is directed from the upper surface toward the lower surface of the first frame 111.

The second opening part TH2 may be provided in the second frame 112. The second opening part TH2 may be provided through the second frame 112. The second opening part TH2 may be provided through an upper surface and a lower surface of the second frame 112 in the first direction.

The second opening part TH2 may be arranged under the second electrode 122 of the light emitting device 120. The second opening part TH2 may overlap with the second electrode 122 of the light emitting device 120. The second opening part TH2 may overlap with the second electrode 122 of the light emitting device 120 in the first direction, which is directed from the upper surface toward the lower surface of the second frame 112.

The first opening part TH1 and the second opening part TH2 may be spaced apart from each other. The first opening part TH1 and the second opening part TH2 may be spaced apart from each other under the lower surface of the light emitting device 120.

According to the embodiment, the width W1 of an upper region of the first opening part TH1 may be less than or equal to the width of the first electrode 121. In addition, the width of an upper region of the second opening part TH2 may be less than or equal to the width of the second electrode 122.

Therefore, the first electrode 121 of the light emitting device 120 can be attached to the first frame 111 more firmly. In addition, the second electrode 122 of the light emitting device 120 can be attached to the second frame 112 more firmly.

The distance W6 from the upper region of the second opening part TH2 to a side end of the second electrode 122 may be tens of micrometers. For example, the distance W6 from the upper region of the second opening part TH2 to the side end of the second electrode 122 may be in the range of 40 micrometers to 60 micrometers.

When the distance W6 is 40 micrometers or more, it is possible to ensure a process margin for preventing the second electrode 122 from being exposed at a bottom surface of the second opening part TH2. In addition, when the distance W6 is 60 micrometers or less, an area of the second electrode 122 exposed at the second opening part TH2 can be ensured, and a resistance of the second electrode 122 exposed by the second opening part TH2 can be reduced, so that a current can be smoothly injected to the second electrode 122 exposed by the second opening part TH2.

In addition, the width W1 of the upper region of the first opening part TH1 may be less than or equal to the width W2 of a lower region of the first opening part TH1. In addition, the width of the upper region of the second opening part TH2 may be less than or equal to the width of a lower region of the second opening part TH2.

The first opening part TH1 may be provided in an inclined shape having the width gradually decreased from the lower region to the upper region of the first opening part TH1. The second opening part TH2 may be provided in an inclined shape having the width gradually decreased from the lower region to the upper region of the second opening part TH2.

However, the embodiment is not limited thereto, and the inclined surfaces between the upper and lower regions of the first and second opening parts TH1 and TH2 may have inclined surfaces having different slopes and the inclined surfaces may be arranged to have a curvature.

A width W3 between the first opening part TH1 and the second opening part TH2 in a lower surface region of the first frame 111 and the second frame 112 may be several hundreds of micrometers. The width W3 between the first opening part TH1 and the second opening part TH2 in the lower surface region of the first frame 111 and the second frame 112 may be, for example, 100 micrometers to 150 micrometers.

When the light emitting device package 100 is mounted on a circuit board later, a sub-mount or the like, the width W3 between the first opening part TH1 and the second opening part TH2 in the lower surface region of the first frame 111 and the second frame 112 may be selected to be a predetermined distance or more so as to prevent an electrical short between pads.

According to an embodiment, the light emitting device package 100 may include an adhesive 130.

The adhesive 130 may be disposed between the body 113 and the light emitting device 120. The adhesive 130 may be disposed between an upper surface of the body 113 and a lower surface of the light emitting device 120.

In addition, according to an embodiment, as shown in FIGS. 1 to 3, the light emitting device package 100 may include a recess R.

The recess R may be provided in the body 113. The recess R may be provided between the first opening part TH1 and the second opening part TH2. The recess R may be concavely provided from an upper surface toward a lower surface of the body 113. The recess R may be arranged under the light emitting device 120. The recess R may overlap with the light emitting device 120 in the first direction.

For example, the adhesive 130 may be disposed in the recess R. The adhesive 130 may be disposed between the light emitting device 120 and the body 113. The adhesive 130 may be disposed between the first electrode 121 and the second electrode 122. For example, the adhesive 130 may make contact with a side surface of the first electrode 121 and a side surface of the second electrode 122.

The adhesive 130 may provide stable fixing strength between the light emitting device 120 and the package body 110. The adhesive 130 may provide the stable fixing strength between the light emitting device 120 and the body 113. The adhesive 130 may make, for example, direct contact with the upper surface of the body 113. In addition, the adhesive 130 may make direct contact with the lower surface of the light emitting device 120.

For example, the adhesive 130 may include at least one of an epoxy-based material, a silicone-based material, a hybrid material including the epoxy-based material and the silicone-based material. In addition, for example, if the adhesive 130 includes a reflection function, the adhesive may include white silicone.

The adhesive 130 may provide the stable fixing strength between the body 113 and the light emitting device 120, and if light is emitted through the lower surface of the light emitting device 120, the adhesive 130 may provide a light diffusion function between the light emitting device 120 and the body 113. When the light is emitted from the light emitting device 120 through the lower surface of the light emitting device 120, the adhesive 130 may improve light extraction efficiency of the light emitting device package 100 by the light diffusion function. In addition, the adhesive 130 may reflect the light emitted from the light emitting device 120. In the situation of the adhesive 130 including a reflection function, the adhesive 130 may be formed of a material including $TiO_2$, silicone or the like.

According to an embodiment, a depth T1 of the recess R may be smaller than a depth T2 of the first opening part TH1 or a depth T2 of the second opening part TH2.

The depth T1 of the recess R may be determined in consideration of adhesive strength of the adhesive 130. The depth T1 of the recess R may be determined in consideration of stable strength of the body 113 and/or determined to prevent a crack from being generated on the light emitting device package 100 due to heat emitted from the light emitting device 120.

The recess R may provide a space suitable for performing a sort of an under fill process at a lower portion of the light emitting device 120. The under fill process may be a process of disposing the adhesive 130 at the lower portion of the light emitting device 120 after mounting the light emitting device 120 on the package body 110, or a process of disposing the light emitting device 120 after disposing the adhesive 130 in the recess R to mount the light emitting device 120 on the package body 110 through the adhesive 130 during a process of mounting the light emitting device 120 on the package body 110. The recess R may have a first depth or more to sufficiently provide the adhesive 130 between the lower surface of the light emitting device 120 and the upper surface of the body 113. In addition, the recess R may have a second depth or less to provide the stable strength to the body 113.

The depth T1 and a width W4 of the recess R may influence a position and fixing strength of the adhesive 130. The depth T1 and the width W4 of the recess R may be determined such that sufficient fixing strength is provided by the adhesive 130 disposed between the body 113 and the light emitting device 120.

For example, the depth T1 of the recess R may be several tens of micrometers. The depth T1 of the recess R may be 40 micrometers to 60 micrometers.

In addition, the width W4 of the recess R may be several tens of micrometers to several hundreds of micrometers. In this situation, the width W4 of the recess R may be defined in a long axis direction of the light emitting device 120.

The width W4 of the recess R may be narrower than a distance between the first electrode 121 and the second electrode 122. The width W4 of the recess R may be 140 micrometers to 160 micrometers. For example, the width W4 of the recess R may be 150 micrometers.

The depth T2 of the first opening part TH1 may be determined corresponding to a thickness of the first frame 111. The depth T2 of the first opening part TH1 may be determined such that the first frame 111 may maintain stable strength.

The depth T2 of the second opening part TH2 may be determined corresponding to a thickness of the second frame 112. The depth T2 of the second opening part TH2 may be determined such that the second frame 112 may maintain stable strength.

The depth T2 of the first opening part TH1 and the depth T2 of the second opening part TH2 may be determined corresponding to a thickness of the body 113. The depth T2 of the first opening part TH1 and the depth T2 of the second opening part TH2 may be determined such that the body 113 may maintain the stable strength.

For example, the depth T2 of the first opening part TH1 may be hundreds of micrometers. The depth T2 of the first opening part TH1 may be provided in the range of 180 micrometers to 220 micrometers. For example, the depth T2 of the first opening part TH1 may be 200 micrometers.

For example, the T2-T1 thickness may be selected to be at least 100 micrometers. This is based on the thickness of the injection process that may provide crack free in the body 113.

According to the embodiment, the ratio of T2/T1 may be provided in the range of 2 to 10. For example, when the thickness of T2 is provided as 200 micrometers, the thickness of T1 may be provided in the range of 20 micrometers to 100 micrometers.

In addition, as shown in FIGS. 1 to 3, the light emitting device package 100 according to the embodiment may include a molding part 140.

The molding part 140 may be provided on the light emitting device 120. The molding part 140 may be disposed on the first frame 111 and the second frame 112. The molding part 140 may be disposed in the cavity C provided by the package body 110.

The molding part 140 may include an insulating material. In addition, the molding part 140 may include a wavelength conversion unit for receiving light emitted from the light emitting device 120 to provide wavelength-converted light. For example, the molding part 140 may include at least one selected from the group consisting of a fluorescent substance, a quantum dot, and the like.

In addition, according to an embodiment, as shown in FIGS. 1 to 3, the light emitting device package 100 may include a first conductive layer 321 and a second conductive layer 322. The first conductive layer 321 may be spaced apart from the second conductive layer 322.

The first conductive layer 321 may be provided in the first opening part TH1. The first conductive layer 321 may be disposed under the first electrode 121. A width of the first conductive layer 321 may be smaller than a width of the first electrode 121.

The first electrode 121 may have a width defined in a second direction perpendicular to the first direction along which the first opening part TH1 is provided. The width of the first electrode 121 may be larger than the width of the first opening part TH1 in the second direction.

The first conductive layer 321 may make direct contact with a lower surface of the first electrode 121. The first conductive layer 321 may be electrically connected to the first electrode 121. The first conductive layer 321 may be surrounded by the first frame 111.

The second conductive layer 322 may be provided in the second opening part TH2. The second conductive layer 322 may be disposed under the second electrode 122. A width of the second conductive layer 322 may be smaller than a width of the second electrode 122.

The second electrode 122 may have a width defined in the second direction perpendicular to the first direction along which the second opening part TH2 is provided. The width of the second electrode 122 may be larger than the width of the second opening part TH2 in the second direction.

The second conductive layer 322 may make direct contact with a lower surface of the second electrode 122. The second conductive layer 322 may be electrically connected to the second electrode 122. The second conductive layer 322 may be surrounded by the second frame 112.

The first conductive layer 321 and the second conductive layer 322 may include one material selected from the group consisting of Ag, Au, Pt, and the like, or an alloy thereof. However, embodiments are not limited thereto, and the first conductive layer 321 and the second conductive layer 322 may be formed of a material capable of ensuring a conduction function.

For example, the first conductive layer 321 and the second conductive layer 322 may be formed of a conductive paste. The conductive paste may include a solder paste, a silver paste or the like, and may be composed of a multilayer formed of mutually different materials, or a multilayer or a single layer formed of an alloy.

In addition, according to an embodiment, as shown in FIGS. 1 to 3, the light emitting device package 100 may include a first lower recess R10 and a second lower recess R20. The first lower recess R10 and the second lower recess R20 may be spaced apart from each other.

The first lower recess R10 may be provided in a lower surface of the first frame 111. The first lower recess R10 may be concavely provided from the lower surface toward an upper surface of the first frame 111. The first lower recess R10 may be spaced apart from the first opening part TH1.

The first lower recess R10 may have a width of several micrometers to several tens of micrometers. A resin part may be provided in the first lower recess R10. The resin part filled in the first lower recess R10 may be, for example, provided of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the first lower recess R10 may be provided in a process of forming the first frame 111, the second frame 112, and the body 113 through an injection molding process or the like.

The resin part filled in the first lower recess R10 may be disposed at a periphery of the lower surface region of the first frame 111 provided with the first opening part TH1. The lower surface region of the first frame 111 provided with the first opening part TH1 may have a shape in the form of an island and may be separated from the lower surface of the first frame 111 around the lower surface region.

For example, as shown in FIG. 2, the lower surface region of the first frame 111 provided with the first opening part TH1 may be isolated from the first frame 111 around the lower surface region by the resin part filled in the first lower recess R10 and the body 113.

Therefore, if the resin part is formed of a material representing low adhesive strength and low wettability with the first and second conductive layers 321 and 322, or a material representing low surface tension between the resin part and the first and second conductive layers 321 and 322, the first conductive layer 321 provided in the first opening part TH1 can be prevented from being diffused over the resin part filled in the first lower recess R10 or the body 113 by overflowing from the first opening part TH1.

This is based on adhesion relation between the first conductive layer 321 and the resin part and between the first conductive layer 321 and the body 113, or the low wettability and low surface tension between the resin part and the first and second conductive layers 321 and 322. In other words, a material constituting the first conductive layer 321 may be selected to represent good adhesion with the first frame 111. In addition, the material constituting the first conductive layer 321 may be selected to represent low adhesion with the resin part and the body 113.

Accordingly, the first conductive layer 321 is prevented from flowing out or spreading to an outside of the region where the resin part or the body 113 is provided by flowing out from the first opening part TH1 toward a region where the resin part or the body 113 is provided, and the first conductive layer 321 can be stably disposed in a region where the first opening part TH1 is provided. Therefore, if the first conductive layer 321 disposed in the first opening part TH1 flows out, the first conductive layer 321 can be prevented from expanding to an external region of the resin part or the first lower recess R10 provided with the body 113. In addition, the first conductive layer 321 can be stably connected to the lower surface of the first electrode 121 in the first opening part TH1. Therefore, when the light emitting device package is mounted on the circuit board, the first conductive layer 321 and the second conductive layer 322 can be prevented from being short-circuited by making contact with each other, and it can be remarkably easy to control an amount of the first and second conductive layers 321 and 322 in a process of disposing the first and second conductive layers 321 and 322.

In addition, the first conductive layer 321 may extend from the first opening part TH1 to the first lower recess R10. Therefore, the first conductive layer 321 and/or the resin part may be disposed in the first lower recess R10.

In addition, the second lower recess R20 may be provided in a lower surface of the second frame 112. The second lower recess R20 may be concavely provided from the lower surface toward an upper surface of the second frame 112. The second lower recess R20 may be spaced apart from the second opening part TH2.

The second lower recess R20 may have a width of several micrometers to several tens of micrometers. The resin part may be provided in the second lower recess R20. The resin part filled in the second lower recess R20 may be, for example, provided of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the second lower recess R20 may be provided in the process of forming the first frame 111, the second frame 112, and the body 113 through an injection molding process or the like.

The resin part filled in the second lower recess R20 may be disposed at a periphery of the lower surface region of the second frame 112 provided with the second opening part TH2. The lower surface region of the second frame 112 provided with the second opening part TH2 may have a shape in the form of an island and may be separated from the lower surface of the second frame 112 around the lower surface region.

For example, as shown in FIG. 2, the lower surface region of the second frame 112 provided with the second opening part TH2 may be isolated from the second frame 112 around the lower surface region by the resin part filled in the second lower recess R20 and the body 113.

Therefore, if the resin part is formed of a material representing low adhesive strength and low wettability with the first and second conductive layers 321 and 322, or a material representing low surface tension between the resin part and the first and second conductive layers 321 and 322, the second conductive layer 322 provided in the second opening part TH2 can be prevented from being diffused over the resin part filled in the second lower recess R20 or the body 113 by overflowing from the second opening part TH2.

This is based on adhesion relation between the second conductive layer 322 and the resin part and between the second conductive layer 322 and the body 113, or the low wettability and low surface tension between the resin part and the first and second conductive layers 321 and 322. In other words, a material constituting the second conductive layer 322 may be selected to represent good adhesion with the second frame 112. In addition, the material constituting the second conductive layer 322 may be selected to represent low adhesion with the resin part and the body 113.

Accordingly, the second conductive layer 322 is prevented from flowing out or spreading to an outside of the region where the resin part or the body 113 is provided by flowing out from the second opening part TH2 toward a region where the resin part or the body 113 is provided, and the second conductive layer 322 can be stably disposed in a region where the second opening part TH2 is provided. Therefore, if the second conductive layer 322 disposed in the second opening part TH2 flows out, the second conductive layer 322 can be prevented from expanding to an external region of the resin part or the second lower recess R20 provided with the body 113. In addition, the second conductive layer 322 can be stably connected to the lower surface of the second electrode 122 in the second opening part TH2.

Therefore, when the light emitting device package is mounted on the circuit board, the first conductive layer 321 and the second conductive layer 322 can be prevented from being short-circuited by making contact with each other, and it can be remarkably easy to control an amount of the first and second conductive layers 321 and 322 in the process of disposing the first and second conductive layers 321 and 322.

In addition, the second conductive layer 322 may extend from the second opening part TH2 to the second lower recess R20. Therefore, the second conductive layer 321 and/or the resin part may be disposed in the second lower recess R20.

In addition, according to an embodiment, as shown in FIG. 3, the light emitting device package 100 may include the resin part 135.

For reference, the resin part 135 and the molding part 140 are omitted from FIG. 1 to clearly show the arrangement of the first frame 111, the second frame 112, and the body 113.

The resin part 135 may be disposed between the first frame 111 and the light emitting device 120. The resin part 135 may be disposed between the second frame 112 and the light emitting device 120. The resin part 135 may be provided on a bottom surface of the cavity C provided to the package body 110.

The resin part 135 may be disposed on a side surface of the first electrode 121. The resin part 135 may be disposed on a side surface of the second electrode 122. The resin part 135 may be disposed under the semiconductor layer 123.

For example, the resin part 135 may include at least one of an epoxy-based material, a silicone-based material, a hybrid material including the epoxy-based material and the silicone-based material. In addition, the resin part 135 may be a reflective part for reflecting light emitted from the light emitting device 120, may be, for example, a resin including a reflective material such as $TiO_2$, or may include white silicone.

The resin part 135 may be disposed under the light emitting device 120 to perform a sealing function. In addition, the resin part 135 can improve adhesive strength between the light emitting device 120 and the first frame 111. The resin part 135 can improve adhesive strength between the light emitting device 120 and the second frame 112.

The resin part 135 may seal a periphery of the first electrode 121 and the second electrode 122. The resin part 135 may prevent the first conductive layer 321 and the second conductive layer 322 from being diffused outward of the light emitting device 120 by overflowing from the first opening part TH1 and the second opening part TH2, respectively. If the first and second conductive layers 321 and 322 are diffused outward of the light emitting device 120, the first and second conductive layers 321 and 322 may make contact with an active layer of the light emitting device 120, thereby causing a failure due to a short circuit. Therefore, when the resin part 135 is disposed, the first and second conductive layers 321 and 322 can be prevented from being short-circuited by the active layer, thereby improving reliability of the light emitting device package according to an embodiment.

In addition, if the resin part 135 includes a material having a reflective property such as white silicone, the resin part 135 may reflect the light provided from the light emitting device 120 toward an upper portion of the package body 110, thereby improving the light extraction efficiency of the light emitting device package 100.

In addition, in the light emitting device package according to another embodiment of the present invention, the resin part 135 may not be provided separately, and the molding part 140 may make direct contact with the first frame 111 and the second frame 112.

In addition, according to the embodiment, the semiconductor layer 123 may be provided as a compound semiconductor. The semiconductor layer 123 may be provided as, for example, a group II-VI or group III-V compound semiconductor. For example, the semiconductor layer 123 may include at least two elements selected from aluminum (Al), gallium (Ga), indium (In), phosphorus (P), arsenic (As), and nitrogen (N).

The semiconductor layer 123 may include the first conductive semiconductor layer, the active layer, and the second conductive semiconductor layer.

The first and second conductive semiconductor layers may be implemented using at least one of group III-V or group II-VI compound semiconductors. The first and second conductive semiconductor layers may be formed of a semiconductor material having a composition formula such as $In_xAl_yGa_{1-x-y}N$ ($0 \leq x \leq 1$, $0 \leq y \leq 1$, $0 \leq x+y \leq 1$). For example, the first and second conductive semiconductor layers may include at least one selected from the group including GaN, AlN, AlGaN, InGaN, InN, InAlGaN, AlInN, AlGaAs, GaP, GaAs, GaAsP, and AlGaInP. The first conductive semiconductor layer may be an n-type semiconductor layer doped with an n-type dopant such as Si, Ge, Sn, Se, and Te. The second conductive semiconductor layer may be a p-type semiconductor layer doped with a p-type dopant such as Mg, Zn, Ca, Sr, and Ba.

The active layer may be implemented by the compound semiconductor. The active layer may be implemented using at least one of group III-V or group II-VI compound semiconductors. When the active layer is implemented as a multi-well structure, the active layer may include well layers and barrier layers which are alternately arranged, and may be arranged using the semiconductor material having the composition formula such as InxAlyGa1-x-yN ($0 \leq x \leq 1$, $0 \leq y \leq 1$, $0 \leq x+y \leq 1$). For example, the active layer may include at least one selected from the group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

In the light emitting device package 100 according to an embodiment, a power source may be connected to the first electrode 121 through a region of the first opening part TH1, and the power source may be connected to the second electrode 122 through a region of the second opening part TH2.

Accordingly, the light emitting device 120 can be driven by a driving power supplied through the first electrode 121 and the second electrode 122. In addition, the light emitted from the light emitting device 120 may be directed in an upward direction of the package body 110.

In addition, the light emitting device package 100 according to the embodiment described above may be mounted and provided on a sub-mount, a circuit board or the like.

However, when a light emitting device package is conventionally mounted on a sub-mount, a circuit board or the like, a high temperature process such as a reflow process can be applied. At this time, in the reflow process, a re-melting phenomenon may occur in a bonding region between a lead frame and the light emitting device provided in the light emitting device package, thereby weakening stability of electrical connection and physical coupling.

However, in the light emitting device package and the method of manufacturing a light emitting device package according to an embodiment, a first electrode and a second electrode of the light emitting device may receive a driving power through a conductive layer disposed in an opening part. In addition, a melting point of the conductive layer disposed in the opening part may be selected to be a value higher than a melting point of a typical bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

Hereinafter, a method of manufacturing a light emitting device package according to an embodiment of the present invention will be described with reference to FIGS. 4 to 8.

While describing the method of manufacturing the light emitting device package according to an embodiment of the present invention with reference to FIGS. 4 to 8, the descriptions that overlap with those described with reference to FIGS. 1 to 3 may be omitted.

Figure 4:
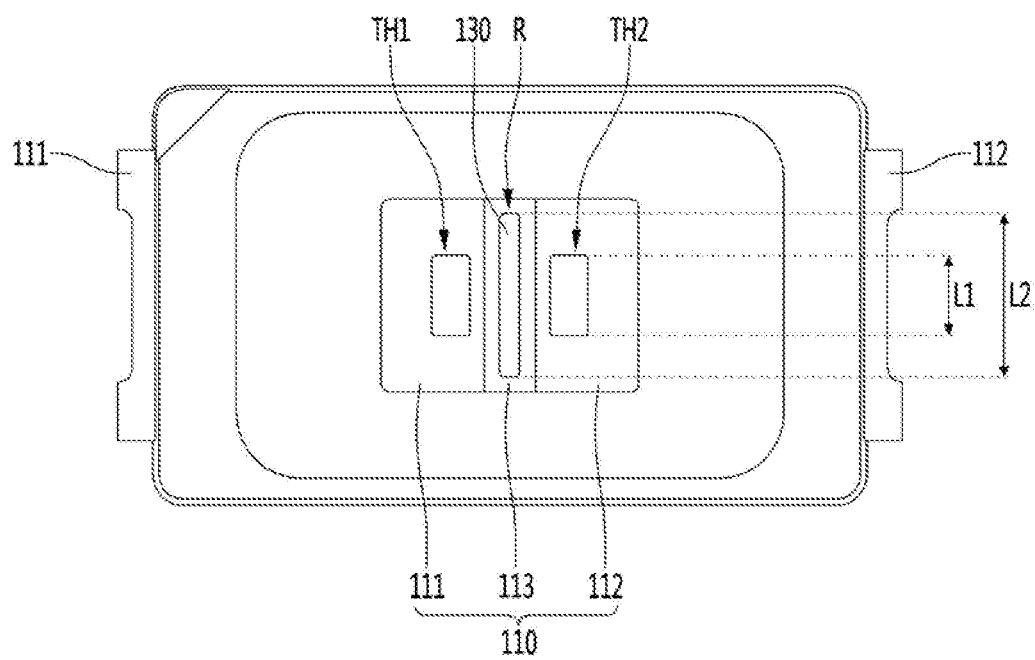
FIGS. 4 to 8 are views for describing a method of manufacturing a light emitting device package according to an embodiment of the present invention.

First, in the method of manufacturing the light emitting device package according to an embodiment of the present invention, as shown in FIG. 4, the package body 110 may be provided.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112.

The body 113 may be disposed on the first frame 111. In addition, the body 113 may be disposed on the second frame 112.

The body 113 may be provided with an inclined surface disposed on the first frame 111 and the second frame 112. Due to the inclined surface of the body 113, a cavity C may be provided over the first frame 111 and the second frame 112.

In addition, the first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The second opening part TH2 may be provided in the second frame 112. The second opening part TH2 may be provided through the second frame 112. The second opening part TH2 may be provided through an upper surface and a lower surface of the second frame 112 in the first direction.

The package body 110 may include a recess R provided in the body 113.

The recess R may be provided in the body 113. The recess R may be provided between the first opening part TH1 and the second opening part TH2. The recess R may be concavely provided from an upper surface toward a lower surface of the body 113.

According to an embodiment, a length L2 of the recess R may be larger than a length L1 of the first opening part TH1 or the length L1 of the second opening part TH2.

Next, in the method of manufacturing the light emitting device package according to an embodiment, as shown in FIG. 4, the adhesive 130 may be provided in the recess R.

The adhesive 130 may be provided in a region of the recess R through a dotting scheme or the like. For example, the adhesive 130 may be provided in a region where the recess R is provided, and may be provided to the extent that the adhesive 130 overflows from the recess R.

In addition, according to an embodiment, as shown in FIG. 4, the length L2 of the recess R may be greater than the length L1 of the second opening part TH2. The length L1 of the second opening part TH2 may be smaller than a length of the light emitting device 120 in a short axis direction. In addition, the length L2 of the recess R may be greater than the length of the light emitting device 120 in the short axis direction.

In a process of manufacturing a light emitting device package according to an embodiment, if a large amount of the adhesive 130 is provided at the lower portion of the light emitting device 120, a part of the adhesive 130 that flows out as the adhesive 130 provided in the recess R adheres to the lower portion of the light emitting device 120 may be moved along the length L2 of the recess R (e.g., the recess can allow excess adhesive to be squeezed out for a stable fit). Accordingly, even if an amount of the adhesive 130 being applied is greater than a designed amount, the light emitting device 120 can be stably fixed without being delaminated from the body 113.

Figure 5:
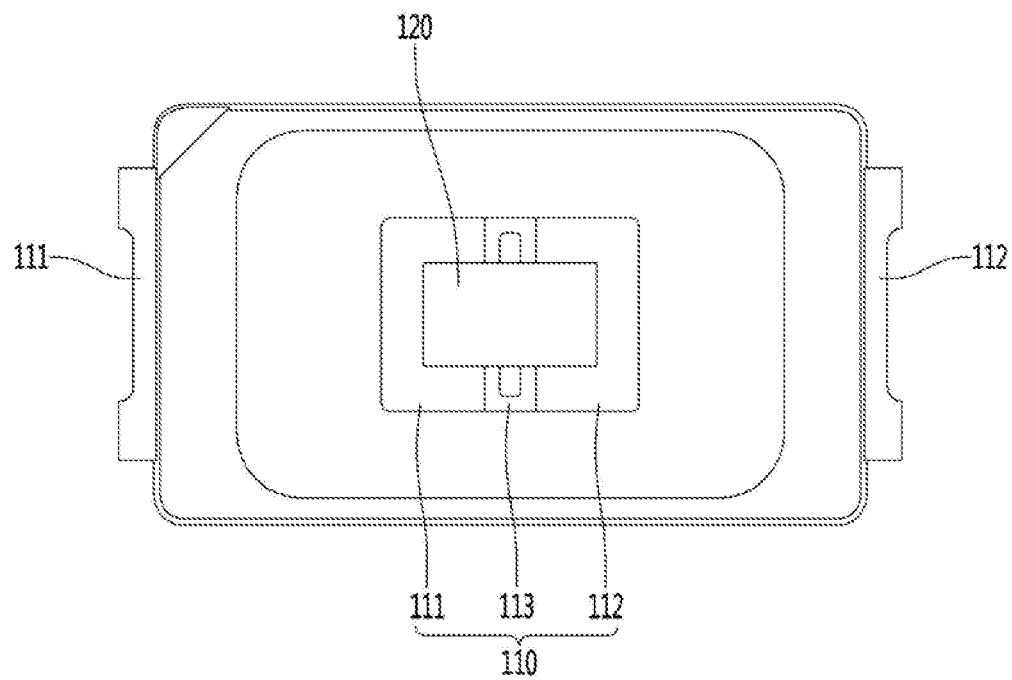

In addition, in the method of manufacturing the light emitting device package according to an embodiment, as shown in FIG. 5, the light emitting device 120 may be provided on the package body 110.

According to an embodiment, the recess R may serve as a sort of an align key in a process of disposing the light emitting device 120 on the package body 110.

The light emitting device 120 may be fixed to the body 113 by the adhesive 130. A part of the adhesive 130 provided in the recess R may be moved toward the first electrode 121 and the second electrode 122 of the light emitting device 120 and cured.

Accordingly, the adhesive 130 may be provided in a wide region between the lower surface of the light emitting device 120 and the upper surface of the body 113, and the fixing strength between the light emitting device 120 and the body 113 can be improved.

According to an embodiment, as described with reference to FIG. 3, the first opening part TH1 may be arranged under the first electrode 121 of the light emitting device 120. The first opening part TH1 may overlap with the first electrode 121 of the light emitting device 120. The first opening part TH1 may overlap with the first electrode 121 of the light emitting device 120 in the first direction, which is directed from the upper surface toward the lower surface of the first frame 111.

The second opening part TH2 may be arranged under the second electrode 122 of the light emitting device 120. The second opening part TH2 may overlap with the second electrode 122 of the light emitting device 120. The second opening part TH2 may overlap with the second electrode 122 of the light emitting device 120 in the first direction, which is directed from the upper surface toward the lower surface of the second frame 112.

Figure 6:
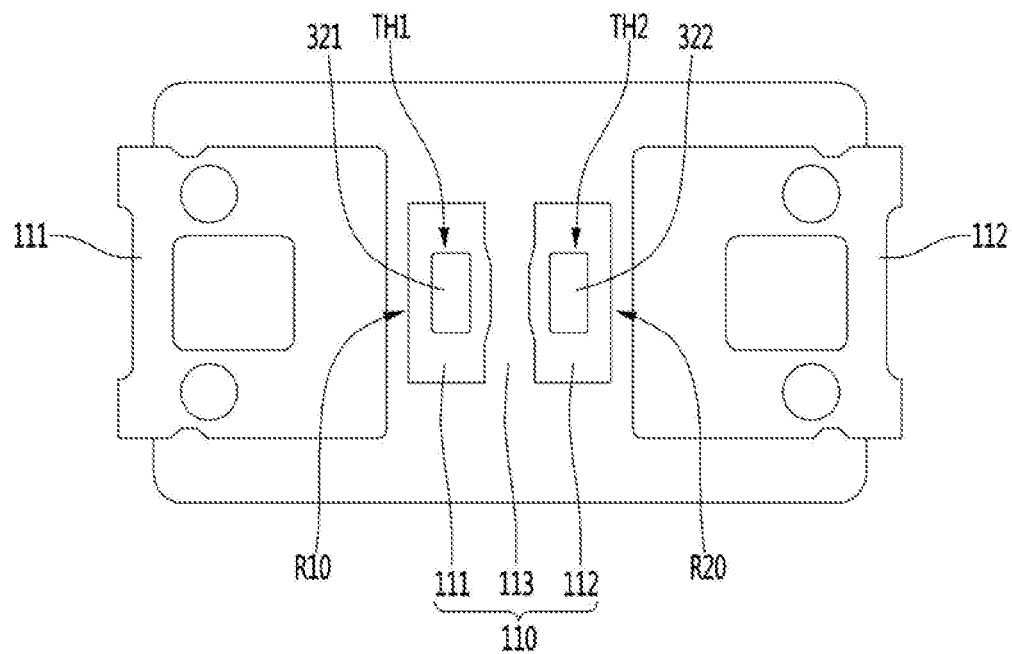

Next, in the method of manufacturing the light emitting device package according to an embodiment, as shown in FIG. 6, the first conductive layer 321 and the second conductive layer 322 may be provided.

In the light emitting device package 100 according to an embodiment, as shown in FIGS. 3 and 6, the lower surface of the first electrode 121 may be exposed through the first opening part TH1. In addition, the lower surface of the second electrode 122 may be exposed through the second opening part TH2.

According to an embodiment, the first conductive layer 321 may be provided in the first opening part TH1. In addition, the second conductive layer 322 may be provided in the second opening part TH2.

The first conductive layer 321 may be provided in the first opening part TH1. The first conductive layer 321 may be disposed under the first electrode 121. A width of the first conductive layer 321 may be smaller than a width of the first electrode 121. The first conductive layer 321 may make direct contact with a lower surface of the first electrode 121. The first conductive layer 321 may be electrically connected to the first electrode 121. The first conductive layer 321 may be surrounded by the first frame 111.

The second conductive layer 322 may be provided in the second opening part TH2. The second conductive layer 322 may be disposed under the second electrode 122. A width of the second conductive layer 322 may be smaller than a width of the second electrode 122. The second conductive layer 322 may make direct contact with a lower surface of the second electrode 122. The second conductive layer 322 may be electrically connected to the second electrode 122. The second conductive layer 322 may be surrounded by the second frame 112.

For example, the first conductive layer 321 and the second conductive layer 322 may be formed of a conductive paste. The first conductive layer 321 and the second conductive layer 322 may be formed of a solder paste or a silver paste.

Figure 7:
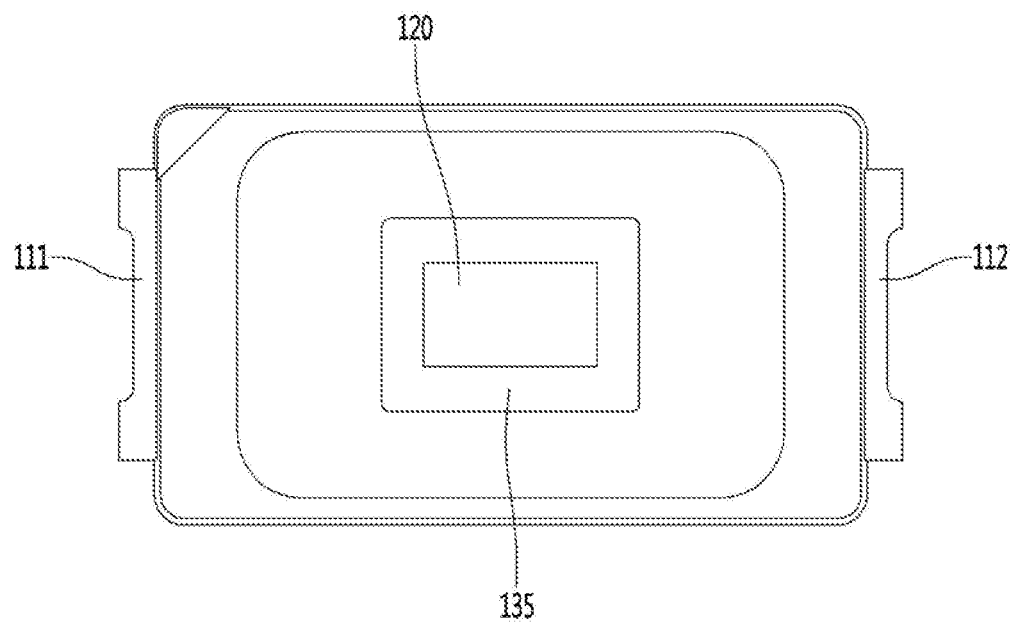

In addition, in the method of manufacturing the light emitting device package according to an embodiment, as shown in FIG. 7, the resin part 135 may be provided.

The resin part 135, as described above with reference to FIG. 3, may be disposed between the first frame 111 and the light emitting device 120. The resin part 135 may be disposed between the second frame 112 and the light emitting device 120.

The resin part 135 may be disposed on a side surface of the first electrode 121. The resin part 135 may be disposed on a side surface of the second electrode 122. The resin part 135 may be disposed under the semiconductor layer 123.

For example, the resin part 135 may include at least one of an epoxy-based material, a silicone-based material, a hybrid material including the epoxy-based material and the silicone-based material. In addition, the resin part 135 may be a reflective part for reflecting light emitted from the light emitting device 120, may be, for example, a resin including a reflective material such as $TiO_2$. The resin part 135 may include white silicone.

The resin part 135 may be disposed under the light emitting device 120 to perform a sealing function. In addition, the resin part 135 can improve adhesive strength between the light emitting device 120 and the first frame 111. The resin part 135 can improve adhesive strength between the light emitting device 120 and the second frame 112.

In addition, if the resin part 135 includes a material having a reflective property such as white silicone, the resin part 135 may reflect the light provided from the light emitting device 120 toward an upper portion of the package body 110, thereby improving the light extraction efficiency of the light emitting device package 100.

Figure 8:
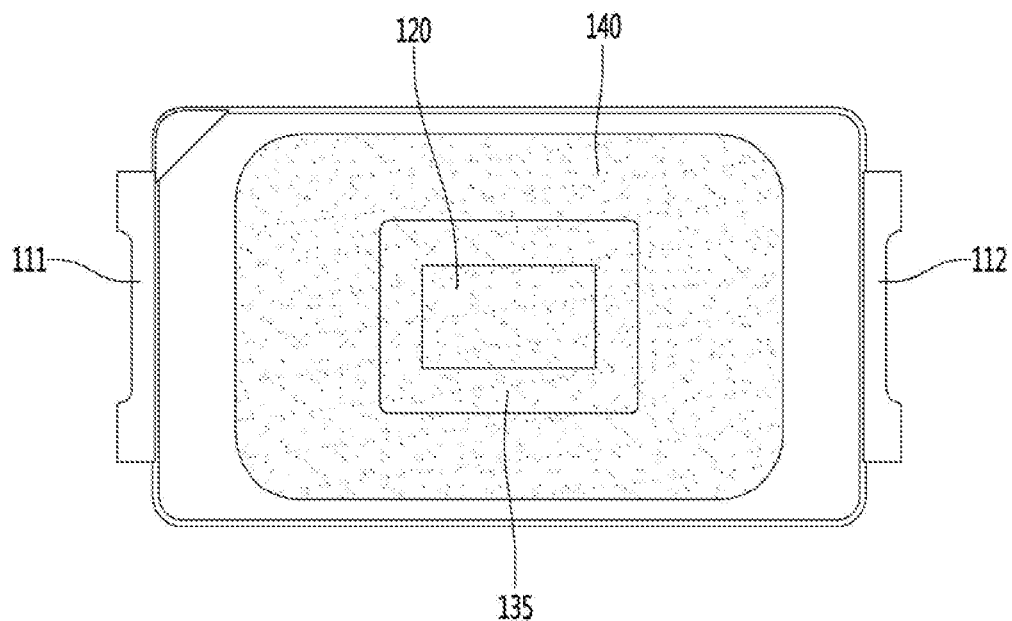

Next, in the method of manufacturing the light emitting device package according to an embodiment, as shown in FIG. 8, the molding part 140 may be provided on the light emitting device 120.

The molding part 140 may be provided on the light emitting device 120. The molding part 140 may be disposed on the first frame 111 and the second frame 112. The molding part 140 may be disposed in the cavity C provided by the package body 110. The molding part 140 may be disposed on the resin part 135.

The molding part 140 may include an insulating material. In addition, the molding part 140 may include a wavelength conversion unit for receiving light emitted from the light emitting device 120 to provide wavelength-converted light. For example, the molding part 140 may include at least one selected from the group consisting of a fluorescent substance, a quantum dot, and the like.

In addition, the above description has been made based on a situation where the first conductive layer 321 and the second conductive layer 322 are provided first as shown in FIG. 6, and the resin part 135 and the molding part 140 are provided as shown in FIGS. 7 and 8.

However, in the method of manufacturing the light emitting device package according to another embodiment, the resin part 135 and the molding part 140 may be provided first, and the first conductive layer 321 and the second conductive layer 322 may be provided thereafter.

In addition, in the method of manufacturing the light emitting device package according to still another embodiment, the resin part 135 may not be provided, and only the molding part 140 may be provided in the cavity of the package body 110.

In the light emitting device package 100 according to an embodiment, a power source may be connected to the first electrode 121 through a region of the first opening part TH1, and the power source may be connected to the second electrode 122 through a region of the second opening part TH2.

Accordingly, the light emitting device 120 can be driven by a driving power supplied through the first electrode 121 and the second electrode 122. In addition, the light emitted from the light emitting device 120 may be directed in an upward direction of the package body 110.

In addition, the light emitting device package 100 according to the embodiment described above may be mounted and provided on a sub-mount, a circuit board or the like.

However, when a light emitting device package is conventionally mounted on a sub-mount, a circuit board or the like, a high temperature process such as a reflow process can be applied. At this time, in the reflow process, a re-melting phenomenon may occur in a bonding region between a frame and the light emitting device provided in the light emitting device package, thereby weakening stability of electrical connection and physical coupling. Accordingly, the position of the light emitting device may be changed, so that optical and electrical properties and reliability of the light emitting device package may be deteriorated.

However, in the light emitting device package and the method of manufacturing a light emitting device package according to an embodiment, a first electrode and a second electrode of the light emitting device may receive a driving power through a conductive layer disposed in an opening part. In addition, a melting point of the conductive layer disposed in the opening part may be selected to be a value higher than a melting point of a typical bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

In addition, the light emitting device package according to the embodiment described above may include various modification examples.

First, modification examples of the body applied to the light emitting device package according to an embodiment will be described with reference to FIGS. 9 to 17. While describing the light emitting device package according to an embodiment with reference to FIGS. 9 to 17, the descriptions that overlap with those described with reference to FIGS. 1 to 8 may be omitted.

Figure 9:
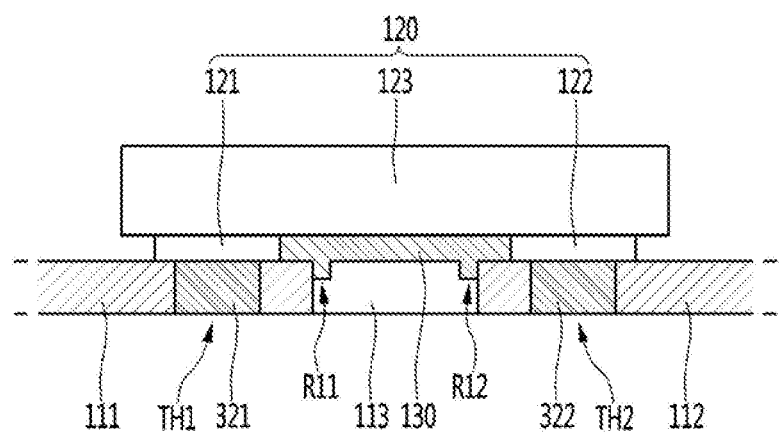
FIGS. 9 to 11 are views for describing a modification example of the body applied to the light emitting device package shown in FIG. 3 according to an embodiment of the present invention.
Figure 10:
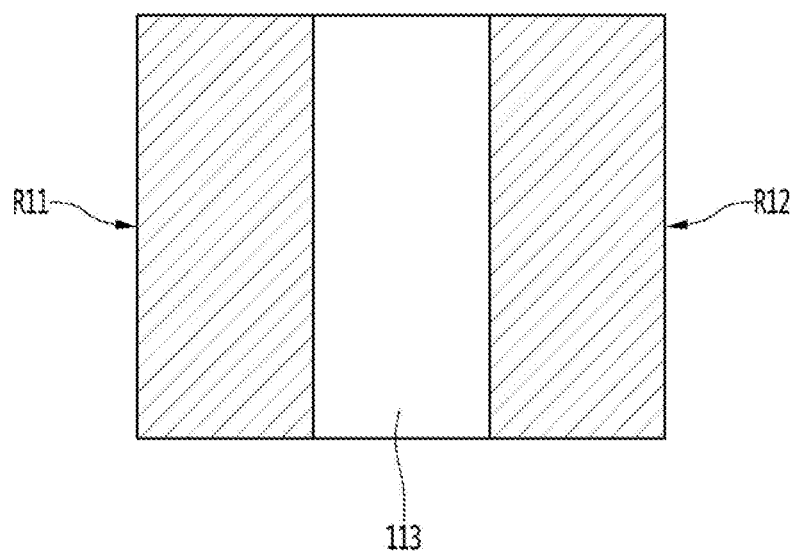
Figure 11:
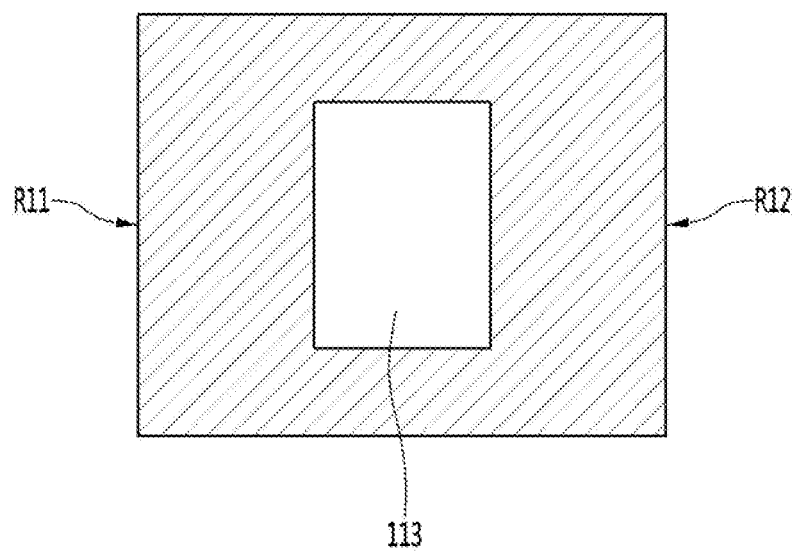

FIGS. 9 to 11 are views for describing a modification example of the body applied to the light emitting device package shown in FIG. 3.

In the light emitting device package 100 according to an embodiment, as shown in FIG. 9, the body 113 may include at least two recesses provided in the upper surface of the body 113.

For example, the body 113 may include a first recess R11 arranged toward the first frame 111 about a central region of the upper surface of the body 113. The first recess R11 may make contact with an end of the first frame 111.

In addition, the body 113 may include a second recess R12 arranged toward the second frame 112 about the central region of the upper surface of the body 113. The second recess R12 may make contact with an end of the second frame 112.

The first recess R11 may be concavely provided downwards from the upper surface of the body 113 and the upper surface of the first frame 111. The second recess R12 may be concavely provided downwards from the upper surface of the body 113 and the upper surface of the second frame 112.

In the light emitting device package 100 according to an embodiment, the adhesive 130 (e.g., resin) can be provided in the first recess R11 and the second recess R12. The adhesive 130 may be disposed between the light emitting device 120 and the body 113. The adhesive 130 may be disposed between the first electrode 121 and the second electrode 122. For example, the adhesive 130 may make contact with a side surface of the first electrode 121 and a side surface of the second electrode 122.

The first recess R11 and the second recess R12 may provide a space suitable for performing a sort of an under fill process at the lower portion of the light emitting device 120.

The first recess R11 and the second recess R12 may have a first depth or more to sufficiently provide the adhesive 130 between the lower surface of the light emitting device 120 and the upper surface of the body 113. In addition, the first recess R11 and the second recess R12 may have a second depth or less to provide the stable strength to the body 113.

The adhesive 130 may provide stable fixing strength between the light emitting device 120 and the package body 110. The adhesive 130 may provide the stable fixing strength between the light emitting device 120 and the body 113. The adhesive 130 may make, for example, direct contact with the upper surface of the body 113. In addition, the adhesive 130 may make direct contact with the lower surface of the light emitting device 120.

In addition, the first recess R11 and the adhesive 130 may prevent the first conductive layer 321 provided in the first opening part TH1 from moving to a lower region of the light emitting device 120. In addition, the second recess R12 and the adhesive 130 may prevent the second conductive layer 322 provided in the second opening part TH2 from moving to the lower region of the light emitting device 120. Accordingly, it is possible to prevent the light emitting device 120 from being electrically short-circuited or deteriorated by the movement of the first conductive layer 321 or the movement of the second conductive layer 322.

In addition, FIG. 9 is a sectional view showing the body 113 applied to the light emitting device package according to an embodiment, and FIGS. 10 and 11 are plan views showing the body 113 shown in FIG. 9.

For example, as shown in FIG. 10, the first recess R11 and the second recess R12 may be spaced apart from each other with a central region of the body 113 interposed therebetween. The first recess R11 and the second recess R12 may be disposed parallel to each other with the central region of the body 113 interposed therebetween.

In addition, as shown in FIG. 11, the first recess R11 and the second recess R12 may be spaced apart from each other with the central region of the body 113 interposed therebetween. In addition, the first recess R11 and the second recess R12 may be connected to each other in the form of a closed loop around the central region of the body 113.

Figure 12:
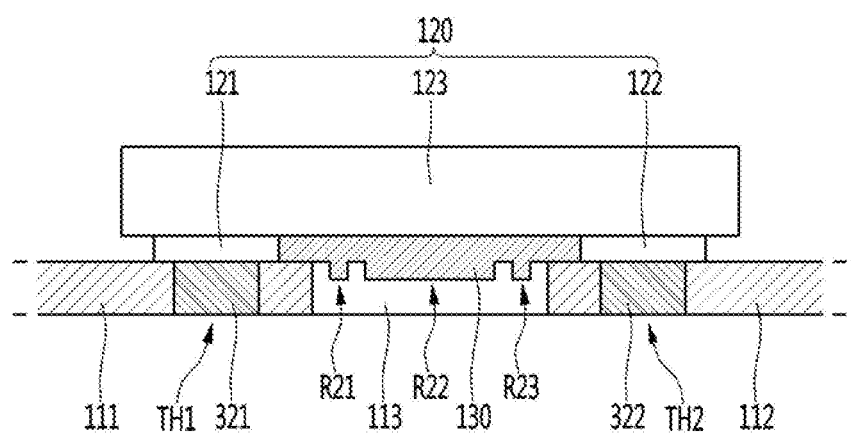
FIGS. 12 to 14 are views for describing another modification example of the body applied to the light emitting device package shown in FIG. 3 according to an embodiment of the present invention.
Figure 13:
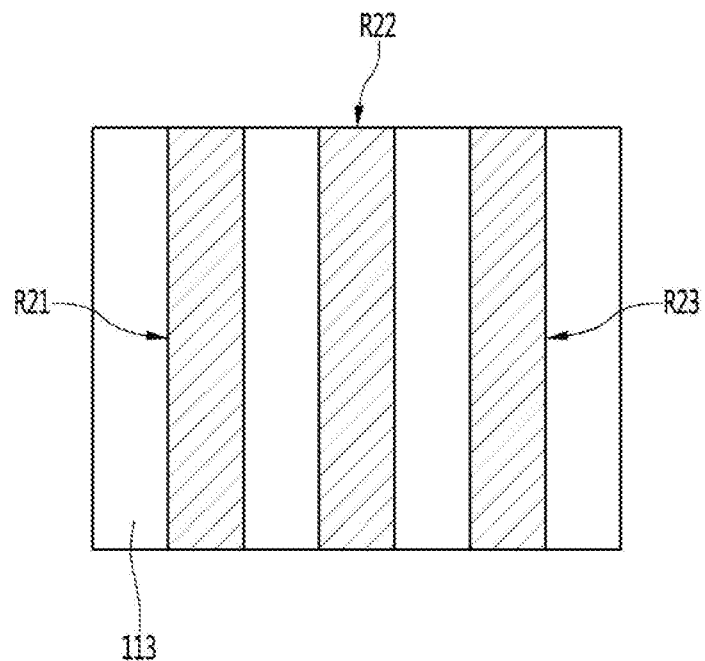
Figure 14:
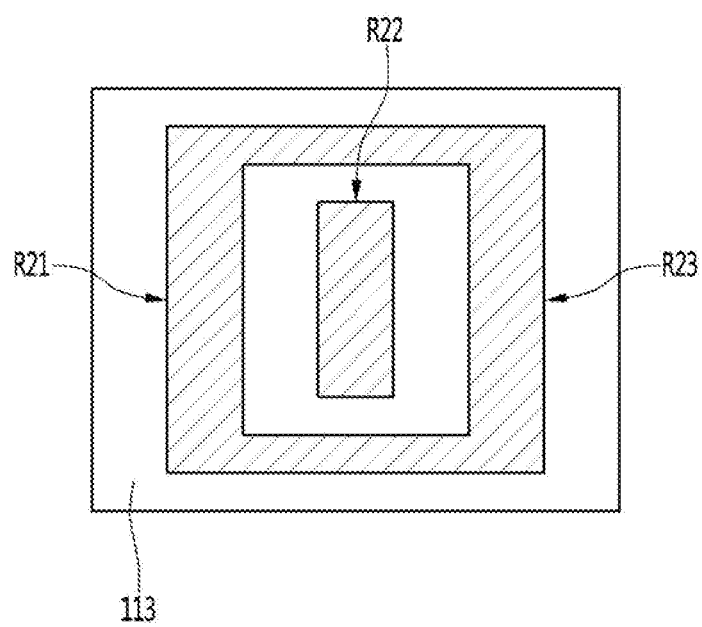

In addition, FIGS. 12 to 14 are views for describing another modification example of the body applied to the light emitting device package shown in FIG. 3.

In the light emitting device package 100 according to an embodiment, as shown in FIG. 12, the body 113 may include at least three recesses provided in the upper surface of the body.

For example, the body 113 may include a first recess R21 arranged toward the first frame 111 about the central region of the upper surface of the body 113. The first recess R21 may be concavely provided from the upper surface toward the lower surface of the body 113.

In addition, the body 113 may include a third recess R23 arranged toward the second frame 112 about the central region of the upper surface of the body 113. The third recess R23 may be concavely provided from the upper surface toward the lower surface of the body 113.

In addition, the body 113 may include a second recess R22 arranged in the central region of the upper surface of the body 113. The second recess R22 may be concavely provided from the upper surface toward the lower surface of the body 113. The second recess R22 may be disposed between the first recess R21 and the third recess R23.

In the light emitting device package 100 according to an embodiment, the adhesive 130 may be provided in the first recess R21, the second recess R22, and the third recess R23. The adhesive 130 may be disposed between the light emitting device 120 and the body 113. The adhesive 130 may be disposed between the first electrode 121 and the second electrode 122. For example, the adhesive 130 may make contact with a side surface of the first electrode 121 and a side surface of the second electrode 122.

The first recess R21, the second recess R22, and the third recess R23 may provide a space suitable for performing a sort of an under fill process at the lower portion of the light emitting device 120 to attach the light emitting device 120 to the package body.

The first recess R21, the second recess R22, and the third recess R23 may have a first depth or more to sufficiently provide the adhesive 130 between the lower surface of the light emitting device 120 and the upper surface of the body 113. In addition, the first recess R21, the second recess R22, and the third recess R23 may have a second depth or less to provide the stable strength to the body 113.

The adhesive 130 may provide stable fixing strength between the light emitting device 120 and the package body 110. The adhesive 130 may provide the stable fixing strength between the light emitting device 120 and the body 113. The adhesive 130 may make, for example, direct contact with the upper surface of the body 113. In addition, the adhesive 130 may make direct contact with the lower surface of the light emitting device 120.

In addition, the first recess R21 and the adhesive 130 may prevent the first conductive layer 321 provided in the first opening part TH1 from moving to the lower region of the light emitting device 120. In addition, the third recess R23 and the adhesive 130 may prevent the second conductive layer 322 provided in the second opening part TH2 from moving to the lower region of the light emitting device 120. Accordingly, it is possible to prevent the light emitting device 120 from being electrically short-circuited or deteriorated by the movement of the first conductive layer 321 or the movement of the second conductive layer 322.

In addition, FIG. 12 is a sectional view showing the body 113 applied to the light emitting device package according to an embodiment, and FIGS. 13 and 14 are plan views showing the body 113 shown in FIG. 12.

For example, as shown in FIG. 13, the first recess R21, the second recess R22, and the third recess R23 may be arranged parallel to each other in one direction on the upper surface of the body 113 while being spaced apart from each other. The first recess R21, the second recess R22 and the third recess R23 may extend in one direction on the upper surface of the body 113.

In addition, as shown in FIG. 14, the first recess R21 and the third recess R23 may be spaced apart from each other with the central region of the body 113 interposed therebetween. In addition, the first recess R21 and the third recess R23 may be connected to each other in the form of a closed loop around the central region of the body 113. In addition, the second recess R22 may be disposed in the central region of the body 113. The second recess R22 may be disposed in a space surrounded by the first recess R21 and the third recess R23.

Figure 15:
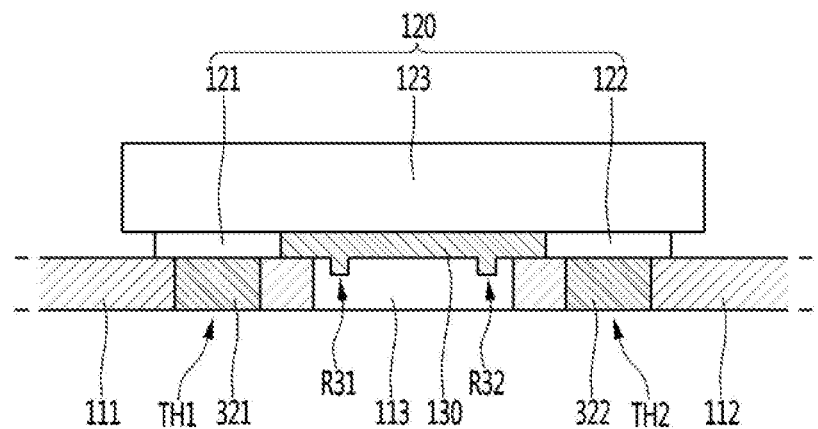
FIGS. 15 to 17 are views for describing still another modification example of the body applied to the light emitting device package shown in FIG. 3 according to an embodiment of the present invention.
Figure 16:
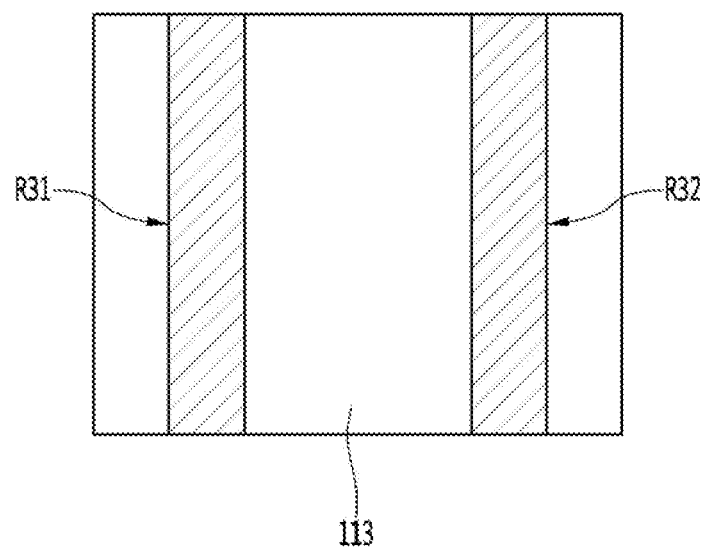
Figure 17:
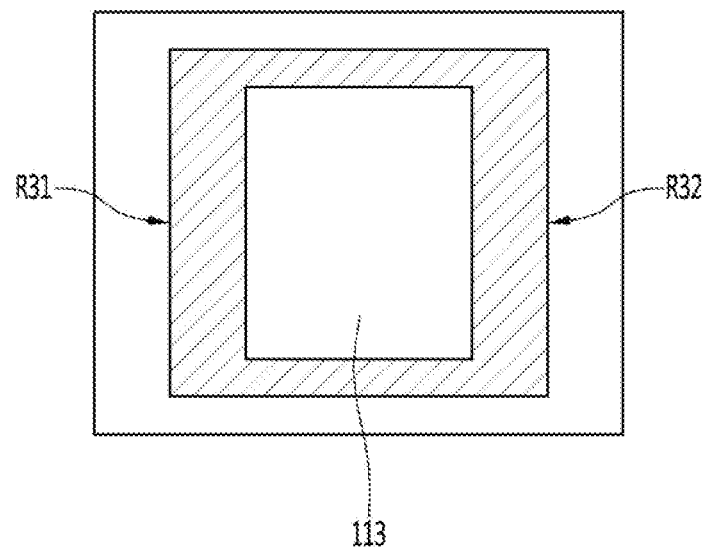

In addition, FIGS. 15 to 17 are views for describing still another modification example of the body applied to the light emitting device package shown in FIG. 3.

In the light emitting device package 100 according to an embodiment, as shown in FIG. 15, the body 113 may include at least two recesses provided in the upper surface of the body 113.

For example, the body 113 may include a first recess R31 arranged toward the first frame 111 about the central region of the upper surface of the body 113. The first recess R31 may be concavely provided from the upper surface toward the lower surface of the body 113. The first recess R31 may be spaced apart from an end of the first frame 111.

In addition, the body 113 may include a second recess R32 arranged toward the second frame 112 about the central region of the upper surface of the body 113. The second recess R32 may be concavely provided from the upper surface toward the lower surface of the body 113. The second recess R32 may be spaced apart from an end of the second frame 112.

In the light emitting device package 100 according to an embodiment, the adhesive 130 may be provided in the first recess R31 and the second recess R32. The adhesive 130 may be disposed between the light emitting device 120 and the body 113. The adhesive 130 may be disposed between the first electrode 121 and the second electrode 122. For example, the adhesive 130 may make contact with a side surface of the first electrode 121 and a side surface of the second electrode 122.

The first recess R31 and the second recess R32 may provide a space suitable for performing a sort of an under fill process at the lower portion of the light emitting device 120.

The first recess R31 and the second recess R32 may have a first depth or more to sufficiently provide the adhesive 130 between the lower surface of the light emitting device 120 and the upper surface of the body 113. In addition, the first recess R31 and the second recess R32 may have a second depth or less to provide the stable strength to the body 113.

The adhesive 130 may provide stable fixing strength between the light emitting device 120 and the package body 110. The adhesive 130 may provide the stable fixing strength between the light emitting device 120 and the body 113. The adhesive 130 may make, for example, direct contact with the upper surface of the body 113. In addition, the adhesive 130 may make direct contact with the lower surface of the light emitting device 120.

In addition, the first recess R31 and the adhesive 130 may prevent the first conductive layer 321 provided in the first opening part TH1 from moving to the lower region of the light emitting device 120. In addition, the second recess R32 and the adhesive 130 may prevent the second conductive layer 322 provided in the second opening part TH2 from moving to the lower region of the light emitting device 120. Accordingly, it is possible to prevent the light emitting device 120 from being electrically short-circuited or deteriorated by the movement of the first conductive layer 321 or the movement of the second conductive layer 322.

In addition, FIG. 15 is a sectional view showing the body 113 applied to the light emitting device package according to an embodiment, and FIGS. 16 and 17 are plan views showing the body 113 shown in FIG. 15.

For example, as shown in FIG. 16, the first recess R31 and the second recess R32 may be arranged parallel to each other in one direction on the upper surface of the body 113 while being spaced apart from each other. The first recess R31 and the second recess R32 may extend in one direction on the upper surface of the body 113.

In addition, as shown in FIG. 17, the first recess R31 and the second recess R32 may be spaced apart from each other with the central region of the body 113 interposed therebetween. In addition, the first recess R31 and the second recess R32 may be connected to each other in the form of a closed loop around the central region of the body 113.

Next, a light emitting device package according to another embodiment of the present invention will be described with reference to FIGS. 18 and 19.

Figure 18:
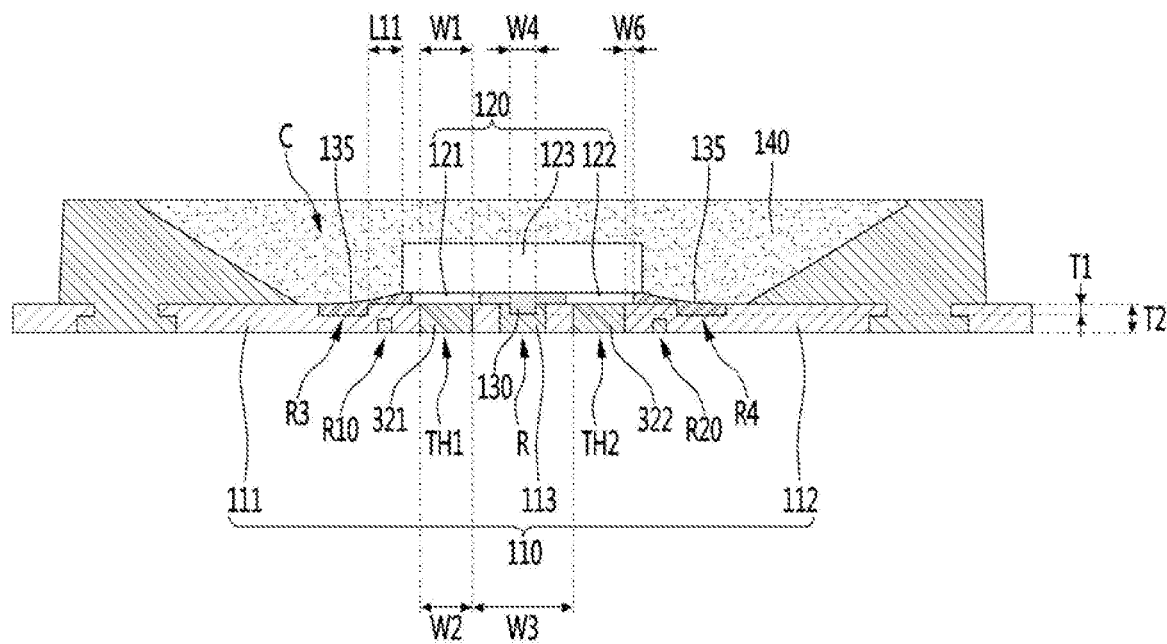
FIG. 18 is a view showing a light emitting device package according to another embodiment of the present invention.
Figure 19:
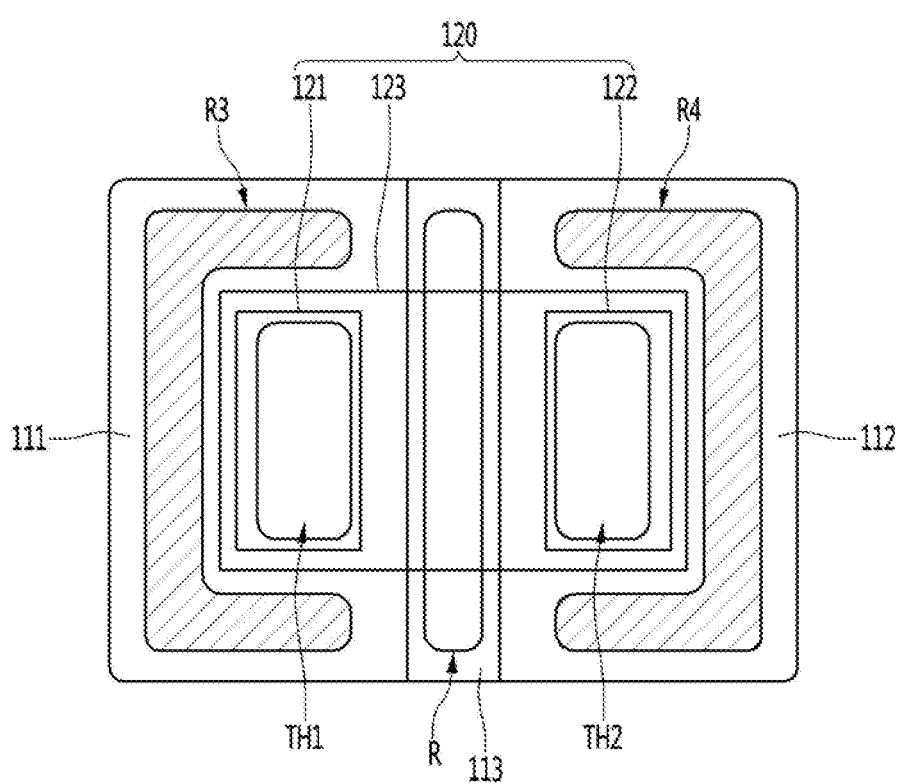
FIG. 19 is a view for describing the arrangement of a first frame, a second frame, and the body applied to the light emitting device package shown in FIG. 18 according to an embodiment of the present invention.

FIG. 18 is a view showing a light emitting device package according to another embodiment of the present invention, and FIG. 19 is a view for describing the arrangement of a first frame, a second frame, and the body applied to the light emitting device package shown in FIG. 18.

While describing the light emitting device package according to an embodiment with reference to FIGS. 18 and 19, the descriptions that overlap with those described with reference to FIGS. 1 to 17 may be omitted.

According to an embodiment, as shown in FIGS. 18 and 19, a light emitting device package may include a package body 110 and a light emitting device 120.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line.

The first frame 111 and the second frame 112 may be insulating frames. The first frame 111 and the second frame 112 may provide stable structural strength to the package body 110.

In addition, the first frame 111 and the second frame 112 may be conductive frames. The first frame 111 and the second frame 112 may provide stable the structural strength to the package body 110, and may be electrically connected to the light emitting device 120.

The difference between a situation where the first frame 111 and the second frame 112 are insulating frames and a situation where the first frame 111 and the second frame 112 are conductive frames will be described later.

For example, the body 113 may be provided of a material selected from the group consisting of polyphthalamide (PPA), polychloro tri phenyl (PCT), liquid crystal polymer (LCP), polyamide9T (PA9T), silicone, an epoxy molding compound (EMC), a silicone molding compound (SMC), ceramic, a photo sensitive glass (PSG), a sapphire ($Al_2O_3$), and the like. In addition, the body 113 may include a high refractive filler such as $TiO_2$ and $SiO_2$.

According to the embodiment, the light emitting device 120 may include a first electrode 121, a second electrode 122, and a semiconductor layer 123.

The light emitting device 120 may be disposed over the package body 110. The light emitting device 120 may be disposed over the first frame 111 and the second frame 112. The light emitting device 120 be disposed in the cavity C provided by the package body 110.

The first electrode 121 may be disposed on a lower surface of the light emitting device 120. The second electrode 122 may be disposed on the lower surface of the light emitting device 120. The first electrode 121 and the second electrode 122 may be spaced apart from each other on the lower surface of the light emitting device 120.

The first electrode 121 may be disposed on the first frame 111. The second electrode 122 may be disposed on the second frame 112.

The first electrode 121 may be disposed between the semiconductor layer 123 and the first frame 111. The second electrode 122 may be disposed between the semiconductor layer 123 and the second frame 112.

In addition, as shown in FIGS. 18 and 19, the light emitting device package according to the embodiment may include a first opening part TH1 and a second opening part TH2. The first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The first opening part TH1 may be arranged under the first electrode 121 of the light emitting device 120. The first opening part TH1 may overlap with the first electrode 121 of the light emitting device 120. The first opening part TH1 may overlap with the first electrode 121 of the light emitting device 120 in the first direction, which is directed from the upper surface toward the lower surface of the first frame 111.

The second opening part TH2 may be provided in the second frame 112. The second opening part TH2 may be provided through the second frame 112. The second opening part TH2 may be provided through an upper surface and a lower surface of the second frame 112 in the first direction.

The second opening part TH2 may be arranged under the second electrode 122 of the light emitting device 120. The second opening part TH2 may overlap with the second electrode 122 of the light emitting device 120. The second opening part TH2 may overlap with the second electrode 122 of the light emitting device 120 in the first direction, which is directed from the upper surface toward the lower surface of the second frame 112.

The first opening part TH1 and the second opening part TH2 may be spaced apart from each other. The first opening part TH1 and the second opening part TH2 may be spaced apart from each other under the lower surface of the light emitting device 120.

According to an embodiment, the light emitting device package may include an adhesive 130.

The adhesive 130 may be disposed between the body 113 and the light emitting device 120. The adhesive 130 may be disposed between an upper surface of the body 113 and a lower surface of the light emitting device 120.

According to an embodiment, as shown in FIGS. 18 and 19, the light emitting device package may include a recess R.

The recess R may be provided in the body 113. The recess R may be provided between the first opening part TH1 and the second opening part TH2. The recess R may be concavely provided from an upper surface toward a lower surface of the body 113. The recess R may be arranged under the light emitting device 120. The recess R may overlap with the light emitting device 120 in the first direction.

For example, the adhesive 130 may be disposed in the recess R. The adhesive 130 may be disposed between the light emitting device 120 and the body 113. The adhesive 130 may be disposed between the first electrode 121 and the second electrode 122. For example, the adhesive 130 may make contact with a side surface of the first electrode 121 and a side surface of the second electrode 122.

The adhesive 130 may provide stable fixing strength between the light emitting device 120 and the package body 110. The adhesive 130 may provide the stable fixing strength between the light emitting device 120 and the body 113. The adhesive 130 may make, for example, direct contact with the upper surface of the body 113. In addition, the adhesive 130 may make direct contact with the lower surface of the light emitting device 120.

For example, the adhesive 130 may include at least one of an epoxy-based material, a silicone-based material, a hybrid material including the epoxy-based material and the silicone-based material. For example, the adhesive may include white silicone.

The adhesive 130 may provide the stable fixing strength between the body 113 and the light emitting device 120, and if light is emitted through the lower surface of the light emitting device 120, the adhesive 130 may provide a light diffusion function between the light emitting device 120 and the body 113. When the light is emitted from the light emitting device 120 through the lower surface of the light emitting device 120, the adhesive 130 may improve light extraction efficiency of the light emitting device package 100 by the light diffusion function.

The recess R may provide a space suitable for performing a sort of an under fill process at a lower portion of the light emitting device 120. The recess R may have a first depth or more to sufficiently provide the adhesive 130 between the lower surface of the light emitting device 120 and the upper surface of the body 113. In addition, the recess R may have a second depth or less to provide the stable strength to the body 113.

In addition, according to an embodiment, the light emitting device package may include a first conductive layer 321 and a second conductive layer 322. The first conductive layer 321 may be spaced apart from the second conductive layer 322.

The first conductive layer 321 may be provided in the first opening part TH1. The first conductive layer 321 may be disposed under the first electrode 121. A width of the first conductive layer 321 may be smaller than a width of the first electrode 121.

The first electrode 121 may have a width defined in a second direction perpendicular to the first direction along which the first opening part TH1 is provided. The width of the first electrode 121 may be larger than the width of the first opening part TH1 in the second direction.

The first conductive layer 321 may make direct contact with a lower surface of the first electrode 121. The first conductive layer 321 may be electrically connected to the first electrode 121. The first conductive layer 321 may be surrounded by the first frame 111.

The second conductive layer 322 may be provided in the second opening part TH2. The second conductive layer 322 may be disposed under the second electrode 122. A width of the second conductive layer 322 may be smaller than a width of the second electrode 122.

The second electrode 122 may have a width defined in the second direction perpendicular to the first direction along which the second opening part TH2 is provided. The width of the second electrode 122 may be larger than the width of the second opening part TH2 in the second direction.

The second conductive layer 322 may make direct contact with a lower surface of the second electrode 122. The second conductive layer 322 may be electrically connected to the second electrode 122. The second conductive layer 322 may be surrounded by the second frame 112.

The first conductive layer 321 and the second conductive layer 322 may include one material selected from the group consisting of Ag, Au, Pt, and the like, or an alloy thereof. However, embodiments are not limited thereto, and the first conductive layer 321 and the second conductive layer 322 may be formed of a material capable of ensuring a conduction function.

For example, the first conductive layer 321 and the second conductive layer 322 may be formed of a conductive paste. The conductive paste may include a solder paste, a silver paste or the like.

In addition, according to an embodiment, as shown in FIGS. 18 and 19, the light emitting device package may include a first lower recess R10 and a second lower recess R20. The first lower recess R10 and the second lower recess R20 may be spaced apart from each other.

The first lower recess R10 may be provided in a lower surface of the first frame 111. The first lower recess R10 may be concavely provided from the lower surface toward an upper surface of the first frame 111. The first lower recess R10 may be spaced apart from the first opening part TH1.

The first lower recess R10 may have a width of several micrometers to several tens of micrometers. A resin part may be provided in the first lower recess R10. The resin part filled in the first lower recess R10 may be, for example, formed of a material same to a material of the body 113.

For example, the resin part filled in the first lower recess R10 may be provided in a process of forming the first frame 111, the second frame 112, and the body 113 through an injection molding process or the like.

The resin part filled in the first lower recess R10, as described above with reference to FIG. 2, may be disposed at a periphery of the lower surface region of the first frame 111 provided with the first opening part TH1. The lower surface region of the first frame 111 provided with the first opening part TH1 may have a shape in the form of an island and may be separated from the lower surface of the first frame 111 around the lower surface region.

For example, as describe above with reference to FIG. 2, the lower surface region of the first frame 111 provided with the first opening part TH1 may be isolated from the first frame 111 around the lower surface region by the resin part filled in the first lower recess R10 and the body 113.

Therefore, the first conductive layer 321 provided in the first opening part TH1 can be prevented from being diffused over the resin part filled in the first lower recess R10 or the body 113 by overflowing from the first opening part TH1.

Accordingly, the first conductive layer 321 is prevented from flowing out to an outside of the region where the resin part or the body 113 is provided, and the first conductive layer 321 can be stably disposed in a region where the first opening part TH1 is provided. In addition, the first conductive layer 321 can be stably connected to the lower surface of the first electrode 121 in the first opening part TH1.

In addition, the second lower recess R20 may be provided in a lower surface of the second frame 112. The second lower recess R20 may be concavely provided from the lower surface toward an upper surface of the second frame 112. The second lower recess R20 may be spaced apart from the second opening part TH2.

The second lower recess R20 may have a width of several micrometers to several tens of micrometers. The resin part may be provided in the second lower recess R20. The resin part filled in the second lower recess R20 may be, for example, formed of a material same to a material of the body 113.

For example, the resin part filled in the second lower recess R20 may be provided in the process of forming the first frame 111, the second frame 112, and the body 113 through an injection molding process or the like.

The resin part filled in the second lower recess R20, as described above with reference to FIG. 2, may be disposed at a periphery of the lower surface region of the second frame 112 provided with the second opening part TH2. The lower surface region of the second frame 112 provided with the second opening part TH2 may have a shape in the form of an island and may be separated from the lower surface of the second frame 112 around the lower surface region.

For example, as described above with reference to FIG. 2, the lower surface region of the second frame 112 provided with the second opening part TH2 may be isolated from the second frame 112 around the lower surface region by the resin part filled in the second lower recess R20 and the body 113.

Therefore, the second conductive layer 322 provided in the second opening part TH2 can be prevented from being diffused over the resin part filled in the second lower recess R20 or the body 113 by overflowing from the second opening part TH2.

Accordingly, the second conductive layer 322 is prevented from flowing out to an outside of the region where the resin part or the body 113 is provided, and the second conductive layer 322 can be stably disposed in a region where the second opening part TH2 is provided. In addition, the second conductive layer 322 can be stably connected to the lower surface of the second electrode 122 in the second opening part TH2.

In addition, according to an embodiment, as shown in FIGS. 18 and 19, the light emitting device package may include a first upper recess R3 and a second upper recess R4.

The first upper recess R3 may be provided in the upper surface of the first frame 111. The first upper recess R3 may be concavely provided from the upper surface toward the lower surface of the first frame 111. The first upper recess R3 may be spaced apart from the first opening part TH1.

As shown in FIG. 19, when viewed from the top, the first upper recess R3 may be arranged adjacent to three sides of the first electrode 121. For example, the first upper recess R3 may have a shape of "[" at a periphery of the first electrode 121.

According to an embodiment, the first upper recess R3 may be provided such that the first upper recess R3 does not overlap with the first lower recess R10 in a vertical direction. If the first upper recess R3 and the first lower recess R10 overlap with each other in the vertical direction, the strength of the first frame 111 may be weakened when the first frame 111 disposed between the first upper recess R3 and the first lower recess R10 is too thin.

According to another embodiment, if the first frame 111 has a sufficient thickness, the first upper recess R3 and the first lower recess R10 may overlap with each other in the vertical direction.

The second upper recess R4 may be provided in the upper surface of the second frame 112. The second upper recess R4 may be concavely provided from the upper surface toward the lower surface of the second frame 112. The second upper recess R4 may be spaced apart from the second opening part TH2.

According to an embodiment, the second upper recess R4 may be provided such that the second upper recess R4 does not overlap with the second lower recess R20 in the vertical direction. If the second upper recess R4 and the second lower recess R20 overlap with each other in the vertical direction, the strength of the second frame 112 may be weakened when the second frame 112 disposed between the second upper recess R4 and the second lower recess R20 is too thin.

According to another embodiment, if the second frame 112 has a sufficient thickness, the second upper recess R4 and the second lower recess R20 may overlap with each other in the vertical direction.

As shown in FIG. 19, when viewed from the top, the second upper recess R4 may be arranged adjacent to three sides of the second electrode 122. For example, the second upper recess R4 may have a shape of "]" at a periphery of the second electrode 122.

For example, the first upper recess R3 and the second upper recess R4 may have a width of several tens of micrometers to several hundreds of micrometers.

In addition, according to an embodiment, as shown in FIG. 18, the light emitting device package 100 may include the resin part 135.

The resin part 135 may be provided in the first upper recess R3 and the second upper recess R4.

The resin part 135 may be disposed on a side surface of the first electrode 121. The resin part 135 may be provided in the first upper recess R3, and may extend to a region where the first electrode 121 is disposed. The resin part 135 may be disposed under the semiconductor layer 123.

A distance L11 from an end of the first upper recess R3 to an adjacent end of the light emitting device 120 may be several hundreds of micrometers or less. For example, the distance L11 from the end of the first upper recess R3 to the adjacent end of the light emitting device 120 may be equal to or less than 200 micrometers.

The distance L11 from the end of the first upper recess R3 to the adjacent end of the light emitting device 120 may be determined based on viscosity of the resin part 135 filled in the first upper recess R3 or the like.

The distance L11 from the end of the first upper recess R3 to the adjacent end of the light emitting device 120 may be selected such that the resin part 135 applied to the first upper recess R3 can extend to a region where the first electrode 121 is disposed.

The resin part 135 may be disposed on a side surface of the second electrode 122. The resin part 135 may be provided in the second upper recess R4, and may extend to a region where the second electrode 122 is disposed. The resin part 135 may be disposed under the semiconductor layer 123.

In addition, the resin part 135 may be provided on a side surface of the semiconductor layer 123. It is possible to effectively prevent the first and second conductive layers 321 and 322 from moving to the side surface of the semiconductor layer 123 by disposing the resin part 135 on the side surface of the semiconductor layer 123. In addition, when the resin part 135 is disposed on the side surface of the semiconductor layer 123, the resin part 135 may be disposed under the active layer of the semiconductor layer 123, thereby improving the light extraction efficiency of the light emitting device 120.

The first upper recess R3 and the second upper recess R4 may provide a space sufficient for the resin part 135.

For example, the resin part 135 may include at least one of an epoxy-based material, a silicone-based material, a hybrid material including the epoxy-based material and the silicone-based material. In addition, the resin part 135 may include a reflective material, and may include, for example, white silicone having $TiO_2$ and/or silicone.

The resin part 135 may be disposed under the light emitting device 120 to perform a sealing function. In addition, the resin part 135 can improve adhesive strength between the light emitting device 120 and the first frame 111. The resin part 135 can improve adhesive strength between the light emitting device 120 and the second frame 112.

The resin part 135 may seal a periphery of the first electrode 121 and the second electrode 122. The resin part 135 may prevent the first conductive layer 321 and the second conductive layer 322 from being diffused toward the light emitting device 120 by overflowing from the first opening part TH1 and the second opening part TH2, respectively.

In addition, if the resin part 135 includes a material having a reflective property such as white silicone, the resin part 135 may reflect the light provided from the light emitting device 120 toward an upper portion of the package body 110, thereby improving the light extraction efficiency of the light emitting device package 100.

In addition, the light emitting device package according to the embodiment may include a molding part 140.

The molding part 140 may be provided on the light emitting device 120. The molding part 140 may be disposed on the first frame 111 and the second frame 112. The molding part 140 may be disposed in the cavity C provided by the package body 110. The molding part 140 may disposed on the resin part 135.

In the light emitting device package 100 according to an embodiment, a power source may be connected to the first electrode 121 through a region of the first opening part TH1, and the power source may be connected to the second electrode 122 through a region of the second opening part TH2.

Accordingly, the light emitting device 120 can be driven by a driving power supplied through the first electrode 121 and the second electrode 122. In addition, the light emitted from the light emitting device 120 may be directed in an upward direction of the package body 110.

In addition, the light emitting device package 100 according to the embodiment described above may be mounted and provided on a sub-mount, a circuit board or the like.

However, when a light emitting device package is conventionally mounted on a sub-mount, a circuit board or the like, a high temperature process such as a reflow process can be applied. At this time, in the reflow process, a re-melting phenomenon may occur in a bonding region between a lead frame and the light emitting device provided in the light emitting device package, thereby weakening stability of electrical connection and physical coupling.

However, in the light emitting device package and the method of manufacturing a light emitting device package according to an embodiment, a first electrode and a second electrode of the light emitting device may receive a driving power through a conductive layer disposed in an opening part. In addition, a melting point of the conductive layer disposed in the opening part may be selected to be a value higher than a melting point of a typical bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

Next, a light emitting device package according to another embodiment of the present invention will be described with reference to FIG. 20.

While describing the light emitting device package according to an embodiment with reference to FIG. 20, the descriptions that overlap with those described with reference to FIGS. 1 to 19 may be omitted.

Figure 20:
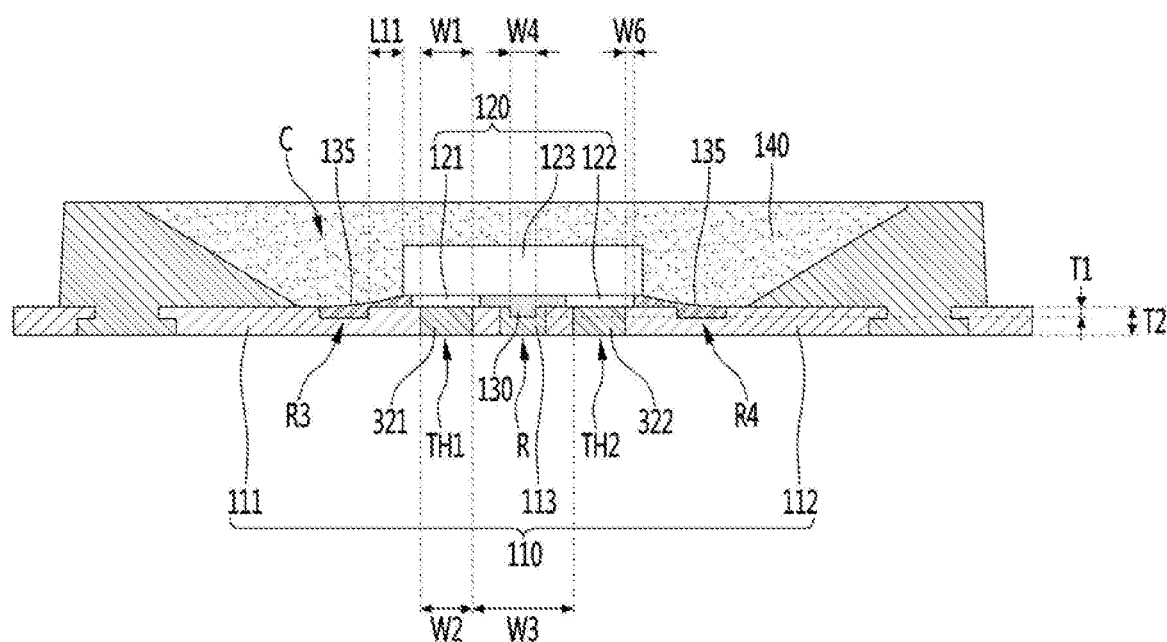
FIG. 20 is a view showing a light emitting device package according to still another embodiment of the present invention.

According to an embodiment, as shown in FIG. 20, a light emitting device package according to an embodiment may include a package body 110 and a light emitting device 120.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line.

The first frame 111 and the second frame 112 may be insulating frames. The first frame 111 and the second frame 112 may provide stable structural strength to the package body 110.

In addition, the first frame 111 and the second frame 112 may be conductive frames. The first frame 111 and the second frame 112 may provide stable the structural strength to the package body 110, and may be electrically connected to the light emitting device 120.

The difference between a situation where the first frame 111 and the second frame 112 are insulating frames and a situation where the first frame 111 and the second frame 112 are conductive frames will be described later.

For example, the body 113 may be formed of a material selected from the group consisting of polyphthalamide (PPA), polychloro tri phenyl (PCT), liquid crystal polymer (LCP), polyamide9T (PA9T), silicone, an epoxy molding compound (EMC), a silicone molding compound (SMC), ceramic, a photo sensitive glass (PSG), a sapphire ($Al_2O_3$), and the like. In addition, the body 113 may include a high refractive filler such as $TiO_2$ and $SiO_2$.

According to the embodiment, the light emitting device 120 may include a first electrode 121, a second electrode 122, and a semiconductor layer 123.

The light emitting device 120 may be disposed over the package body 110. The light emitting device 120 may be disposed over the first frame 111 and the second frame 112. The light emitting device 120 may be disposed in the cavity C provided by the package body 110.

The first electrode 121 may be disposed on a lower surface of the light emitting device 120. The second electrode 122 may be disposed on the lower surface of the light emitting device 120. The first electrode 121 and the second electrode 122 may be spaced apart from each other on the lower surface of the light emitting device 120.

The first electrode 121 may be disposed on the first frame 111. The second electrode 122 may be disposed on the second frame 112.

The first electrode 121 may be disposed between the semiconductor layer 123 and the first frame 111. The second electrode 122 may be disposed between the semiconductor layer 123 and the second frame 112.

In addition, as shown in FIG. 20, the light emitting device package according to the embodiment may include a first opening part TH1 and a second opening part TH2. The first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The first opening part TH1 may be arranged under the first electrode 121 of the light emitting device 120. The first opening part TH1 may overlap with the first electrode 121 of the light emitting device 120. The first opening part TH1 may overlap with the first electrode 121 of the light emitting device 120 in the first direction, which is directed from the upper surface toward the lower surface of the first frame 111.

The second opening part TH2 may be provided in the second frame 112. The second opening part TH2 may be provided through the second frame 112. The second opening part TH2 may be provided through an upper surface and a lower surface of the second frame 112 in the first direction.

The second opening part TH2 may be arranged under the second electrode 122 of the light emitting device 120. The second opening part TH2 may overlap with the second electrode 122 of the light emitting device 120. The second opening part TH2 may overlap with the second electrode 122 of the light emitting device 120 in the first direction, which is directed from the upper surface toward the lower surface of the second frame 112.

The first opening part TH1 and the second opening part TH2 may be spaced apart from each other. The first opening part TH1 and the second opening part TH2 may be spaced apart from each other under the lower surface of the light emitting device 120.

According to an embodiment, the light emitting device package may include an adhesive 130.

The adhesive 130 may be disposed between the body 113 and the light emitting device 120. The adhesive 130 may be disposed between an upper surface of the body 113 and a lower surface of the light emitting device 120.

According to an embodiment, as shown in FIG. 20, the light emitting device package may include a recess R.

The recess R may be provided in the body 113. The recess R may be provided between the first opening part TH1 and the second opening part TH2. The recess R may be concavely provided from an upper surface toward a lower surface of the body 113. The recess R may be arranged under the light emitting device 120. The recess R may overlap with the light emitting device 120 in the first direction.

For example, the adhesive 130 may be disposed in the recess R. The adhesive 130 may be disposed between the light emitting device 120 and the body 113. The adhesive 130 may be disposed between the first electrode 121 and the second electrode 122. For example, the adhesive 130 may make contact with a side surface of the first electrode 121 and a side surface of the second electrode 122.

The adhesive 130 may provide stable fixing strength between the light emitting device 120 and the package body 110. The adhesive 130 may provide the stable fixing strength between the light emitting device 120 and the body 113. The adhesive 130 may make, for example, direct contact with the upper surface of the body 113. In addition, the adhesive 130 may make direct contact with the lower surface of the light emitting device 120.

For example, the adhesive 130 may include at least one of an epoxy-based material, a silicone-based material, a hybrid material including the epoxy-based material and the silicone-based material. For example, the adhesive may include white silicone.

The adhesive 130 may provide the stable fixing strength between the body 113 and the light emitting device 120, and if light is emitted through the lower surface of the light emitting device 120, the adhesive 130 may provide a light diffusion function between the light emitting device 120 and the body 113. When the light is emitted from the light emitting device 120 through the lower surface of the light emitting device 120, the adhesive 130 may improve light extraction efficiency of the light emitting device package 100 by the light diffusion function.

The recess R may provide a space suitable for performing a sort of an under fill process at a lower portion of the light emitting device 120. The recess R may have a first depth or more to sufficiently provide the adhesive 130 between the lower surface of the light emitting device 120 and the upper surface of the body 113. In addition, the recess R may have a second depth or less to provide the stable strength to the body 113.

In addition, according to an embodiment, the light emitting device package may include a first conductive layer 321 and a second conductive layer 322. The first conductive layer 321 may be spaced apart from the second conductive layer 322.

The first conductive layer 321 may be provided in the first opening part TH1. The first conductive layer 321 may be disposed under the first electrode 121. A width of the first conductive layer 321 may be smaller than a width of the first electrode 121.

The first electrode 121 may have a width defined in a second direction perpendicular to the first direction along which the first opening part TH1 is provided. The width of the first electrode 121 may be larger than the width of the first opening part TH1 in the second direction.

The first conductive layer 321 may make direct contact with a lower surface of the first electrode 121. The first conductive layer 321 may be electrically connected to the first electrode 121. The first conductive layer 321 may be surrounded by the first frame 111.

The second conductive layer 322 may be provided in the second opening part TH2. The second conductive layer 322 may be disposed under the second electrode 122. A width of the second conductive layer 322 may be smaller than a width of the second electrode 122.

The second electrode 122 may have a width defined in the second direction perpendicular to the first direction along which the second opening part TH2 is provided. The width of the second electrode 122 may be larger than the width of the second opening part TH2 in the second direction.

The second conductive layer 322 may make direct contact with a lower surface of the second electrode 122. The second conductive layer 322 may be electrically connected to the second electrode 122. The second conductive layer 322 may be surrounded by the second frame 112.

The first conductive layer 321 and the second conductive layer 322 may include one material selected from the group consisting of Ag, Au, Pt, and the like, or an alloy thereof. However, embodiments are not limited thereto, and the first conductive layer 321 and the second conductive layer 322 may be provided of a material capable of ensuring a conduction function.

For example, the first conductive layer 321 and the second conductive layer 322 may be formed of a conductive paste. The conductive paste may include at least one selected from a group including a solder paste, a silver paste or the like.

In addition, according to an embodiment, as shown in FIG. 20, the light emitting device package may include a first upper recess R3 and a second upper recess R4.

The first upper recess R3 may be provided in the upper surface of the first frame 111. The first upper recess R3 may be concavely provided from the upper surface toward the lower surface of the first frame 111. The first upper recess R3 may be spaced apart from the first opening part TH1.

As shown in FIG. 19, when viewed from the top, the first upper recess R3 may be arranged adjacent to three sides of the first electrode 121. For example, the first upper recess R3 may have a shape of "[" at a periphery of the first electrode 121.

The second upper recess R4 may be provided in the upper surface of the second frame 112. The second upper recess R4 may be concavely provided from the upper surface toward the lower surface of the second frame 112. The second upper recess R4 may be spaced apart from the second opening part TH2.

As shown in FIG. 19, when viewed from the top, the second upper recess R4 may be arranged adjacent to three sides of the second electrode 122. For example, the second upper recess R4 may have a shape of "]" at a periphery of the second electrode 122.

For example, the first upper recess R3 and the second upper recess R4 may have a width of several tens of micrometers to several hundreds of micrometers.

In addition, according to an embodiment, as shown in FIG. 18, the light emitting device package 100 may include the resin part 135.

The resin part 135 may be provided in the first upper recess R3 and the second upper recess R4.

The resin part 135 may be disposed on a side surface of the first electrode 121. The resin part 135 may be provided in the first upper recess R3, and may extend to a region where the first electrode 121 is disposed. The resin part 135 may be disposed under the semiconductor layer 123.

A distance L11 from an end of the first upper recess R3 to an adjacent end of the light emitting device 120 may be several hundreds of micrometers or less. For example, the distance L11 from the end of the first upper recess R3 to the adjacent end of the light emitting device 120 may be equal to or less than 200 micrometers.

The distance L11 from the end of the first upper recess R3 to the adjacent end of the light emitting device 120 may be determined based on viscosity of the resin part 135 filled in the first upper recess R3 or the like.

The distance L11 from the end of the first upper recess R3 to the adjacent end of the light emitting device 120 may be selected such that the resin part 135 applied to the first upper recess R3 can extend to a region where the first electrode 121 is disposed.

The resin part 135 may be disposed on a side surface of the second electrode 122. The resin part 135 may be provided in the second upper recess R4, and may extend to a region where the second electrode 122 is disposed. The resin part 135 may be disposed under the semiconductor layer 123.

In addition, the resin part 135 may be provided on a side surface of the semiconductor layer 123. It is possible to effectively prevent the first and second conductive layers 321 and 322 from moving to the side surface of the semiconductor layer 123 by disposing the resin part 135 on the side surface of the semiconductor layer 123. In addition, when the resin part 135 is disposed on the side surface of the semiconductor layer 123, the resin part 135 may be disposed under the active layer of the semiconductor layer 123, thereby improving the light extraction efficiency of the light emitting device 120.

The first upper recess R3 and the second upper recess R4 may provide a space sufficient for the resin part 135.

For example, the resin part 135 may include at least one of an epoxy-based material, a silicone-based material, a hybrid material including the epoxy-based material and the silicone-based material. In addition, the resin part 135 may include a reflective material, and may include, for example, white silicone having $TiO_2$ and/or silicone.

The resin part 135 may be disposed under the light emitting device 120 to perform a sealing function. In addition, the resin part 135 can improve adhesive strength between the light emitting device 120 and the first frame 111. The resin part 135 can improve adhesive strength between the light emitting device 120 and the second frame 112.

The resin part 135 may seal a periphery of the first electrode 121 and the second electrode 122. The resin part 135 may prevent the first conductive layer 321 and the second conductive layer 322 from being diffused toward the light emitting device 120 by overflowing from the first opening part TH1 and the second opening part TH2, respectively.

In addition, if the resin part 135 includes a material having a reflective property such as white silicone, the resin part 135 may reflect the light provided from the light emitting device 120 toward an upper portion of the package body 110, thereby improving the light extraction efficiency of the light emitting device package 100.

In addition, the light emitting device package according to the embodiment may include a molding part 140.

The molding part 140 may be provided on the light emitting device 120. The molding part 140 may be disposed on the first frame 111 and the second frame 112. The molding part 140 may be disposed in the cavity C provided by the package body 110. The molding part 140 may disposed on the resin part 135.

In the light emitting device package 100 according to an embodiment, a power source may be connected to the first electrode 121 through a region of the first opening part TH1, and the power source may be connected to the second electrode 122 through a region of the second opening part TH2.

Accordingly, the light emitting device 120 can be driven by a driving power supplied through the first electrode 121 and the second electrode 122. In addition, the light emitted from the light emitting device 120 may be directed in an upward direction of the package body 110.

In addition, the light emitting device package 100 according to the embodiment described above may be mounted and provided on a sub-mount, a circuit board or the like.

However, when a light emitting device package is conventionally mounted on a sub-mount, a circuit board or the like, a high temperature process such as a reflow process can be applied. At this time, in the reflow process, a re-melting phenomenon may occur in a bonding region between a lead frame and the light emitting device provided in the light emitting device package, thereby weakening stability of electrical connection and physical coupling.

However, in the light emitting device package and the method of manufacturing a light emitting device package according to an embodiment, a first electrode and a second electrode of the light emitting device may receive a driving power through a conductive layer disposed in an opening part. In addition, a melting point of the conductive layer disposed in the opening part may be selected to be a value higher than a melting point of a typical bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

Next, a light emitting device package according to another embodiment of the present invention will be described with reference to FIG. 21.

While describing the light emitting device package according to an embodiment with reference to FIG. 21, the descriptions that overlap with those described with reference to FIGS. 1 to 20 may be omitted.

A light emitting device package shown in FIG. 21 differs from the light emitting device package described with reference to FIGS. 18 to 20 in positions of the first upper recess R3 and the second upper recess R4.

Figure 21:
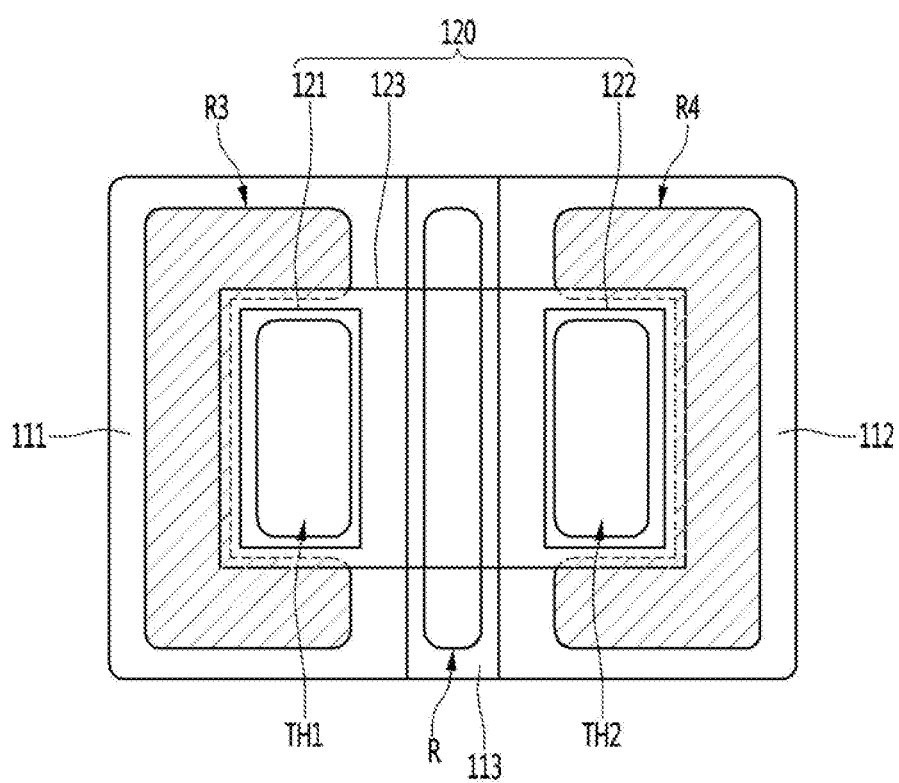
FIG. 21 is a view showing a light emitting device package according to still another embodiment of the present invention.

In the light emitting device package according to an embodiment, as shown in FIG. 21, when viewed from the top, a partial region of the first upper recess R3 may overlap with the semiconductor layer 123 in the vertical direction. For example, a lateral region of the first upper recess R3 adjacent to the first electrode 121 may extend under the semiconductor layer 123.

In addition, in the light emitting device package according to an embodiment, as shown in FIG. 21, when viewed from the top, a partial region of the second upper recess R4 may overlap with the semiconductor layer 123 in the vertical direction. For example, a lateral region of the second upper recess R4 adjacent to the second electrode 122 may extend under the semiconductor layer 123.

Accordingly, the resin part 135 filled in the first upper recess R3 and the second upper recess R4 can effectively seal peripheries of the first electrode 121 and the second electrode 122.

In addition, the first upper recess R3 and the second upper recess R4 may provide a space sufficient for the resin part 135 under the light emitting device 120. The first upper recess R3 and the second upper recess R4 may provide a space suitable for performing a sort of an under fill process at the lower portion of the light emitting device 120.

For example, the resin part 135 may include at least one of an epoxy-based material, a silicone-based material, a hybrid material including the epoxy-based material and the silicone-based material. For example, the resin part 135 may be a reflective part for reflecting light emitted from the light emitting device 120, and may be, for example, a resin including a reflective material such as $TiO_2$. The resin part 135 may include white silicone.

The resin part 135 may be disposed under the light emitting device 120 to perform a sealing function. In addition, the resin part 135 can improve adhesive strength between the light emitting device 120 and the first frame 111. The resin part 135 can improve adhesive strength between the light emitting device 120 and the second frame 112.

The resin part 135 may seal a periphery of the first electrode 121 and the second electrode 122. The resin part 135 may prevent the first conductive layer 321 and the second conductive layer 322 from being diffused toward the light emitting device 120 by overflowing from the first opening part TH1 and the second opening part TH2, respectively.

In addition, if the resin part 135 includes a material having a reflective property such as white silicone, the resin part 135 may reflect the light provided from the light emitting device 120 toward an upper portion of the package body 110, thereby improving the light extraction efficiency of the light emitting device package 100.

In the light emitting device package 100 according to an embodiment, a power source may be connected to the first electrode 121 through a region of the first opening part TH1, and the power source may be connected to the second electrode 122 through a region of the second opening part TH2.

Accordingly, the light emitting device 120 can be driven by a driving power supplied through the first electrode 121 and the second electrode 122. In addition, the light emitted from the light emitting device 120 may be directed in an upward direction of the package body 110.

In addition, the light emitting device package 100 according to the embodiment described above may be mounted and provided on a sub-mount, a circuit board or the like.

However, when a light emitting device package is conventionally mounted on a sub-mount, a circuit board or the like, a high temperature process such as a reflow process can be applied. At this time, in the reflow process, a re-melting phenomenon may occur in a bonding region between a lead frame and the light emitting device provided in the light emitting device package, thereby weakening stability of electrical connection and physical coupling.

However, in the light emitting device package and the method of manufacturing a light emitting device package according to an embodiment, a first electrode and a second electrode of the light emitting device may receive a driving power through a conductive layer disposed in an opening part. In addition, a melting point of the conductive layer disposed in the opening part may be selected to be a value higher than a melting point of a typical bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

Next, a light emitting device package according to another embodiment of the present invention will be described with reference to FIG. 22.

While describing the light emitting device package according to an embodiment with reference to FIG. 22, the descriptions that overlap with those described with reference to FIGS. 1 to 21 may be omitted.

Figure 22:
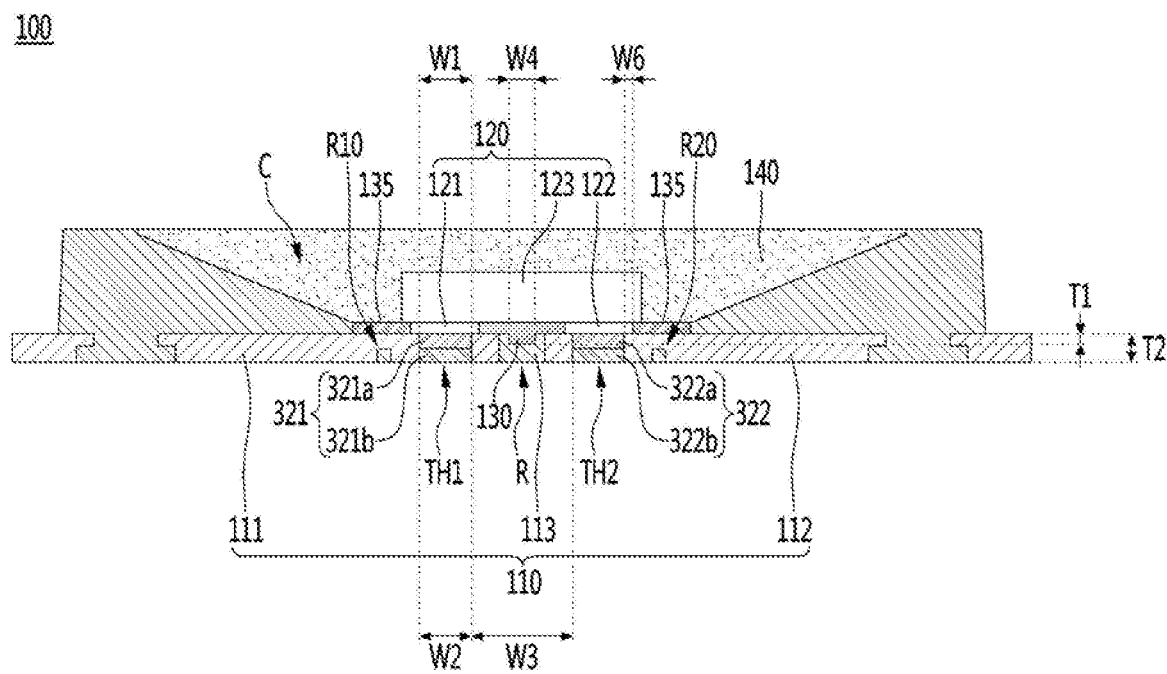
FIG. 22 is a view showing a light emitting device package according to still another embodiment of the present invention.

According to an embodiment, as shown in FIG. 22, a light emitting device package according to an embodiment may include a package body 110 and a light emitting device 120.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line.

The first frame 111 and the second frame 112 may be insulating frames. The first frame 111 and the second frame 112 may provide stable structural strength to the package body 110.

In addition, the first frame 111 and the second frame 112 may be conductive frames. The first frame 111 and the second frame 112 may provide stable the structural strength to the package body 110, and may be electrically connected to the light emitting device 120.

The difference between a situation where the first frame 111 and the second frame 112 are insulating frames and a situation where the first frame 111 and the second frame 112 are conductive frames will be described later.

According to the embodiment, the light emitting device 120 may include a first electrode 121, a second electrode 122, and a semiconductor layer 123.

The light emitting device 120 may be disposed over the package body 110. The light emitting device 120 may be disposed over the first frame 111 and the second frame 112. The light emitting device 120 may be disposed in the cavity C provided by the package body 110.

The first electrode 121 may be disposed on the first frame 111. The second electrode 122 may be disposed on the second frame 112.

In addition, as shown in FIG. 22, the light emitting device package 100 according to the embodiment may include a first opening part TH1 and a second opening part TH2. The first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The first opening part TH1 may be arranged under the first electrode 121 of the light emitting device 120. The first opening part TH1 may overlap with the first electrode 121 of the light emitting device 120. The first opening part TH1 may overlap with the first electrode 121 of the light emitting device 120 in the first direction, which is directed from the upper surface toward the lower surface of the first frame 111.

The second opening part TH2 may be provided in the second frame 112. The second opening part TH2 may be provided through the second frame 112. The second opening part TH2 may be provided through an upper surface and a lower surface of the second frame 112 in the first direction.

The second opening part TH2 may be arranged under the second electrode 122 of the light emitting device 120. The second opening part TH2 may overlap with the second electrode 122 of the light emitting device 120. The second opening part TH2 may overlap with the second electrode 122 of the light emitting device 120 in the first direction, which is directed from the upper surface toward the lower surface of the second frame 112.

The first opening part TH1 and the second opening part TH2 may be spaced apart from each other. The first opening part TH1 and the second opening part TH2 may be spaced apart from each other under the lower surface of the light emitting device 120.

According to the embodiment, the width W1 of an upper region of the first opening part TH1 may be less than or equal to the width of the first electrode 121. In addition, the width of an upper region of the second opening part TH2 may be less than or equal to the width of the second electrode 122.

Therefore, the first electrode 121 of the light emitting device 120 can be attached to the first frame 111 more firmly. In addition, the second electrode 122 of the light emitting device 120 can be attached to the second frame 112 more firmly.

According to an embodiment, as shown in FIG. 22, the light emitting device package 100 may include an adhesive 130.

The adhesive 130 may be disposed between the body 113 and the light emitting device 120. The adhesive 130 may be disposed between an upper surface of the body 113 and a lower surface of the light emitting device 120.

In addition, according to an embodiment, as shown in FIG. 22, the light emitting device package 100 may include a recess R.

The recess R may be provided in the body 113. The recess R may be provided between the first opening part TH1 and the second opening part TH2. The recess R may be concavely provided from an upper surface toward a lower surface of the body 113. The recess R may be arranged under the light emitting device 120. The recess R may overlap with the light emitting device 120 in the first direction.

For example, the adhesive 130 may be disposed in the recess R. The adhesive 130 may be disposed between the light emitting device 120 and the body 113. The adhesive 130 may be disposed between the first electrode 121 and the second electrode 122. For example, the adhesive 130 may make contact with a side surface of the first electrode 121 and a side surface of the second electrode 122.

The adhesive 130 may provide stable fixing strength between the light emitting device 120 and the package body 110. The adhesive 130 may provide the stable fixing strength between the light emitting device 120 and the body 113. The adhesive 130 may make, for example, direct contact with the upper surface of the body 113. In addition, the adhesive 130 may make direct contact with the lower surface of the light emitting device 120.

For example, the adhesive 130 may include at least one of an epoxy-based material, a silicone-based material, a hybrid material including the epoxy-based material and the silicone-based material. For example, the adhesive may include white silicone.

The adhesive 130 may provide the stable fixing strength between the body 113 and the light emitting device 120, and if light is emitted through the lower surface of the light emitting device 120, the adhesive 130 may provide a light diffusion function between the light emitting device 120 and the body 113. When the light is emitted from the light emitting device 120 through the lower surface of the light emitting device 120, the adhesive 130 may improve light extraction efficiency of the light emitting device package 100 by the light diffusion function.

The recess R may provide a space suitable for performing a sort of an under fill process at a lower portion of the light emitting device 120. The recess R may have a first depth or more to sufficiently provide the adhesive 130 between the lower surface of the light emitting device 120 and the upper surface of the body 113. In addition, the recess R may have a second depth or less to provide the stable strength to the body 113.

In addition, according to an embodiment, as shown in FIG. 22, the light emitting device package 100 may include a first conductive layer 321 and a second conductive layer 322. The first conductive layer 321 may be spaced apart from the second conductive layer 322.

The first conductive layer 321 may be provided in the first opening part TH1. The first conductive layer 321 may be disposed under the first electrode 121. A width of the first conductive layer 321 may be smaller than a width of the first electrode 121.

The first electrode 121 may have a width defined in a second direction perpendicular to the first direction along which the first opening part TH1 is provided. The width of the first electrode 121 may be larger than the width of the first opening part TH1 in the second direction.

The first conductive layer 321 may make direct contact with a lower surface of the first electrode 121. The first conductive layer 321 may be electrically connected to the first electrode 121. The first conductive layer 321 may be surrounded by the first frame 111.

The second conductive layer 322 may be provided in the second opening part TH2. The second conductive layer 322 may be disposed under the second electrode 122. A width of the second conductive layer 322 may be smaller than a width of the second electrode 122.

The second electrode 122 may have a width defined in the second direction perpendicular to the first direction along which the second opening part TH2 is provided. The width of the second electrode 122 may be larger than the width of the second opening part TH2 in the second direction.

The second conductive layer 322 may make direct contact with a lower surface of the second electrode 122. The second conductive layer 322 may be electrically connected to the second electrode 122. The second conductive layer 322 may be surrounded by the second frame 112.

The first conductive layer 321 and the second conductive layer 322 may include one material selected from the group consisting of Ag, Au, Pt, and the like, or an alloy thereof. However, embodiments are not limited thereto, and the first conductive layer 321 and the second conductive layer 322 may be formed of a material capable of ensuring a conduction function.

For example, the first conductive layer 321 and the second conductive layer 322 may be formed of a conductive paste. The conductive paste may include a solder paste, a silver paste or the like.

In addition, according to an embodiment, as shown in FIG. 22, the first conductive layer 321 and the second conductive layer 322 may be prepared as a plurality of layers.

For example, the first conductive layer 321 may include a first upper conductive layer 321a and a first lower conductive layer 321b. The first upper conductive layer 321a may be provided in an upper region of the first opening part TH1. The first lower conductive layer 321b may be provided in a lower region of the first opening part TH1.

In addition, the second conductive layer 322 may include a second upper conductive layer 322a and a second lower conductive layer 322b. The second upper conductive layer 322a may be provided in an upper region of the second opening part TH2. The second lower conductive layer 322b may be provided in a lower region of the second opening part TH2.

According to an embodiment, the first upper conductive layer 321a and the first lower conductive layer 321b may include mutually different materials. The first upper conductive layer 321a and the first lower conductive layer 321b may have mutually different melting points. For example, the melting point of the first upper conductive layer 321a may be selected to be higher than the melting point of the first lower conductive layer 321b.

For example, a conductive paste constituting the first upper conductive layer 321a and a conductive paste constituting the first lower conductive layer 321b may be different from each other. According to an embodiment, the first upper conductive layer 321a may be, for example, formed of a silver paste, and the first lower conductive layer 321b may be, for example, formed of a solder paste.

According to an embodiment, when the first upper conductive layer 321a is formed of the silver paste, it is detected that the silver paste provided in the first opening part TH1 may rarely or may not diffuse and penetrate between the first electrode 121 and the first frame 111.

Therefore, if the first upper conductive layer 321a is formed of the silver paste, it is possible to prevent the light emitting device 120 from being electrically short-circuited or deteriorated.

In addition, if the first upper conductive layer 321a is formed of the silver paste and the first lower conductive layer 321b is formed of the solder paste, a manufacturing cost can be reduced as compared with a situation where the entire first conductive layer 321 is formed of the silver paste.

Similarly, the conductive paste constituting the second upper conductive layer 322a and the conductive paste constituting the second lower conductive layer 322b may be different from each other. According to an embodiment, the second upper conductive layer 322a may be, for example, formed of a silver paste, and the second lower conductive layer 322b may be, for example, formed of a solder paste.

According to an embodiment, when the second upper conductive layer 322a is formed of the silver paste, it is detected that the silver paste provided in the second opening part TH2 may rarely or may not diffuse and penetrate between the second electrode 122 and the second frame 112.

Therefore, if the second upper conductive layer 322a is formed of the silver paste, it is possible to prevent the light emitting device 120 from being electrically short-circuited or deteriorated.

In addition, if the second upper conductive layer 322a is formed of the silver paste and the second lower conductive layer 321b is formed of the solder paste, a manufacturing cost can be reduced as compared with a situation where the entire second conductive layer 322 is formed of the silver paste.

In addition, according to an embodiment, as shown in FIG. 22, the light emitting device package 100 may include a first lower recess R10 and a second lower recess R20. The first lower recess R10 and the second lower recess R20 may be spaced apart from each other.

The first lower recess R10 may be provided in a lower surface of the first frame 111. The first lower recess R10 may be concavely provided from the lower surface toward an upper surface of the first frame 111. The first lower recess R10 may be spaced apart from the first opening part TH1.

The first lower recess R10 may have a width of several micrometers to several tens of micrometers. A resin part may be provided in the first lower recess R10. The resin part filled in the first lower recess R10 may be, for example, formed of a material same to a material of the body 113.

For example, the resin part filled in the first lower recess R10 may be provided in a process of forming the first frame 111, the second frame 112, and the body 113 through an injection molding process or the like.

The resin part filled in the first lower recess R10 may be disposed at a periphery of the lower surface region of the first frame 111 provided with the first opening part TH1. The lower surface region of the first frame 111 provided with the first opening part TH1 may have a shape in the form of an island and may be separated from the lower surface of the first frame 111 around the lower surface region.

For example, as shown in FIG. 2, the lower surface region of the first frame 111 provided with the first opening part TH1 may be isolated from the first frame 111 around the lower surface region by the resin part filled in the first lower recess R10 and the body 113.

Therefore, the first conductive layer 321 provided in the first opening part TH1 can be prevented from being diffused over the resin part filled in the first lower recess R10 or the body 113 by overflowing from the first opening part TH1.

Accordingly, the first conductive layer 321 is prevented from flowing out to an outside of the region where the resin part or the body 113 is provided, and the first conductive layer 321 can be stably disposed in a region where the first opening part TH1 is provided. In addition, the first conductive layer 321 can be stably connected to the lower surface of the first electrode 121 in the first opening part TH1.

In addition, the second lower recess R20 may be provided in a lower surface of the second frame 112. The second lower recess R20 may be concavely provided from the lower surface toward an upper surface of the second frame 112. The second lower recess R20 may be spaced apart from the second opening part TH2.

The second lower recess R20 may have a width of several micrometers to several tens of micrometers. The resin part may be provided in the second lower recess R20. The resin part filled in the second lower recess R20 may be, for example, formed of a material same to a material of the body 113.

For example, the resin part filled in the second lower recess R20 may be provided in the process of forming the first frame 111, the second frame 112, and the body 113 through an injection molding process or the like.

The resin part filled in the second lower recess R20 may be disposed at a periphery of the lower surface region of the second frame 112 provided with the second opening part TH2. The lower surface region of the second frame 112 provided with the second opening part TH2 may have a shape in the form of an island and may be separated from the lower surface of the second frame 112 around the lower surface region.

For example, as shown in FIG. 2, the lower surface region of the second frame 112 provided with the second opening part TH2 may be isolated from the second frame 112 around the lower surface region by the resin part filled in the second lower recess R20 and the body 113.

Therefore, the second conductive layer 322 provided in the second opening part TH2 can be prevented from being diffused over the resin part filled in the second lower recess R20 or the body 113 by overflowing from the second opening part TH2.

Accordingly, the second conductive layer 322 is prevented from flowing out to an outside of the region where the resin part or the body 113 is provided, and the second conductive layer 322 can be stably disposed in a region where the second opening part TH2 is provided. In addition, the second conductive layer 322 can be stably connected to the lower surface of the second electrode 122 in the second opening part TH2.

In addition, according to an embodiment, as shown in FIG. 22, the light emitting device package 100 may include the resin part 135.

The resin part 135 may be disposed between the first frame 111 and the light emitting device 120. The resin part 135 may be disposed between the second frame 112 and the light emitting device 120. The resin part 135 may be provided on a bottom surface of the cavity C provided to the package body 110.

The resin part 135 may be disposed on a side surface of the first electrode 121. The resin part 135 may be disposed on a side surface of the second electrode 122. The resin part 135 may be disposed under the semiconductor layer 123.

For example, the resin part 135 may include at least one of an epoxy-based material, a silicone-based material, a hybrid material including the epoxy-based material and the silicone-based material. For example, the resin part 135 may be a reflective part for reflecting light emitted from the light emitting device 120, may be, for example, a resin including a reflective material such as $TiO_2$. The resin part 135 may include white silicone.

The resin part 135 may be disposed under the light emitting device 120 to perform a sealing function. In addition, the resin part 135 can improve adhesive strength between the light emitting device 120 and the first frame 111. The resin part 135 can improve adhesive strength between the light emitting device 120 and the second frame 112.

The resin part 135 may seal a periphery of the first electrode 121 and the second electrode 122. The resin part 135 may prevent the first conductive layer 321 and the second conductive layer 322 from being diffused toward the light emitting device 120 by overflowing from the first opening part TH1 and the second opening part TH2, respectively.

In addition, if the resin part 135 includes a material having a reflective property such as white silicone, the resin part 135 may reflect the light provided from the light emitting device 120 toward an upper portion of the package body 110, thereby improving the light extraction efficiency of the light emitting device package 100.

In addition, as shown in FIG. 22, the light emitting device package 100 according to the embodiment may include a molding part 140.

The molding part 140 may be provided on the light emitting device 120. The molding part 140 may be disposed on the first frame 111 and the second frame 112. The molding part 140 may be disposed in the cavity C provided by the package body 110. The molding part 140 may disposed on the resin part 135.

In addition, in the light emitting device package 100 according to the embodiment described above, the first frame 111 may include a lower recess provided in the lower surface of the first frame 111, and an upper recess provided in the upper surface of the first frame 111. For example, the first frame 111 may include at least one lower recess provided in the lower surface of the first frame 111. In addition, the first frame 111 may include at least one upper recess provided in the upper surface of the first frame 111. In addition, the first frame 111 may include at least one upper recess provided in the upper surface of the first frame 111, and at least one lower recess provided in the lower surface of the first frame 111. In addition, the first frame 111 may have a structure in which recesses are not provided in both the upper surface and the lower surface of the first frame 111.

Similarly, the second frame 112 may include at least one lower recess provided in the lower surface of the second frame 112. In addition, the second frame 112 may include at least one upper recess provided in the upper surface of the second frame 112. In addition, the second frame 112 may include at least one upper recess provided in the upper surface of the second frame 112, and at least one lower recess provided in the lower surface of the second frame 112. In addition, the second frame 112 may have a structure in which recesses are not provided in both the upper surface and the lower surface of the second frame 112.

In the light emitting device package 100 according to an embodiment, a power source may be connected to the first electrode 121 through a region of the first opening part TH1, and the power source may be connected to the second electrode 122 through a region of the second opening part TH2.

Accordingly, the light emitting device 120 can be driven by a driving power supplied through the first electrode 121 and the second electrode 122. In addition, the light emitted from the light emitting device 120 may be directed in an upward direction of the package body 110.

In addition, the light emitting device package 100 according to the embodiment described above may be mounted and provided on a sub-mount, a circuit board or the like.

However, when a light emitting device package is conventionally mounted on a sub-mount, a circuit board or the like, a high temperature process such as a reflow process can be applied. At this time, in the reflow process, a re-melting phenomenon may occur in a bonding region between a lead frame and the light emitting device provided in the light emitting device package, thereby weakening stability of electrical connection and physical coupling.

However, in the light emitting device package and the method of manufacturing a light emitting device package according to an embodiment, a first electrode and a second electrode of the light emitting device may receive a driving power through a conductive layer disposed in an opening part. In addition, a melting point of the conductive layer disposed in the opening part may be selected to be a value higher than a melting point of a typical bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

In addition, according to an embodiment described with reference to FIGS. 1 to 22, the light emitting device package 100 may be mounted and provided on a sub-mount, a circuit board or the like.

Next, a light emitting device package according to still another embodiment of the present invention will be described with reference to FIG. 23.

Figure 23:
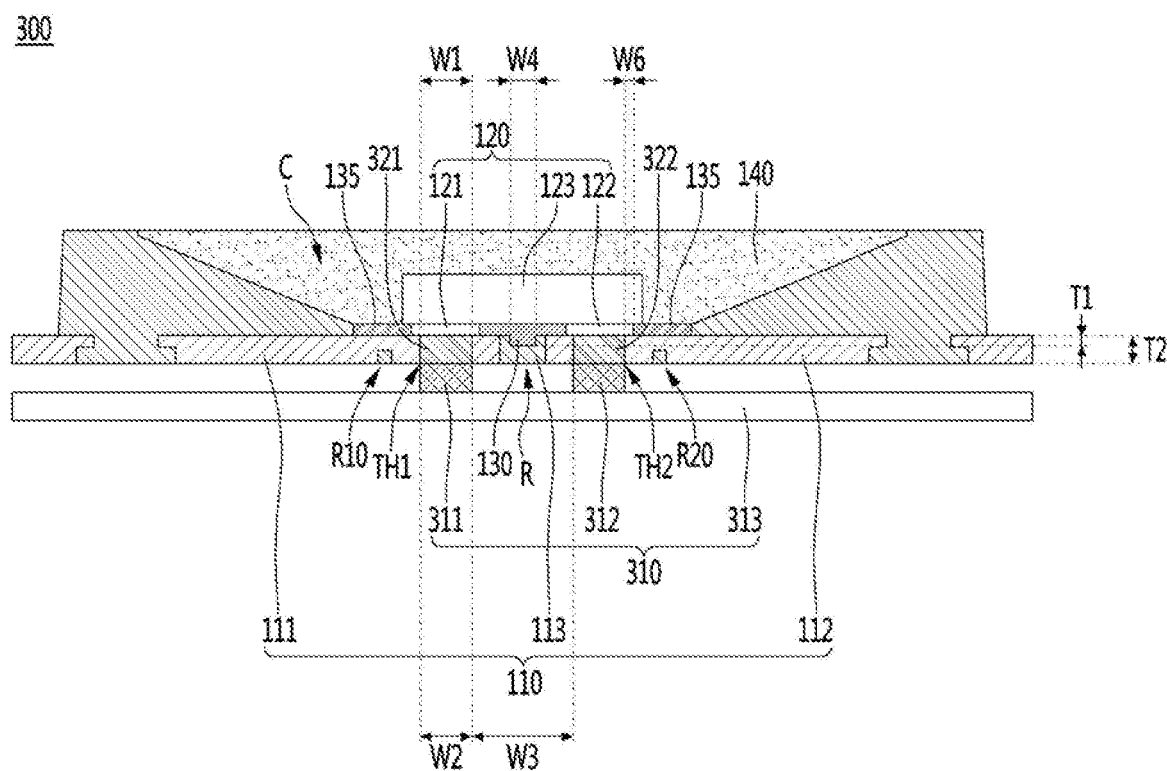
FIG. 23 is a view showing a light emitting device package according to still another embodiment of the present invention.

The light emitting device package 300 according to an embodiment of the present invention shown in FIG. 23 is an example in which the light emitting device package 100 described with reference to FIGS. 1 to 22 is mounted on a circuit board 310 and provided.

While describing the light emitting device package 300 according to an embodiment of the present invention with reference to FIG. 23, the descriptions that overlap with those described with reference to FIGS. 1 to 22 may be omitted.

According to an embodiment, as shown in FIG. 23, the light emitting device package 300 may include a circuit board 310, the package body 110, and the light emitting device 120.

The circuit board 310 may include a first pad 311, a second pad 312, and a substrate 313. The substrate 313 may be provided with a power supply circuit for controlling the driving of the light emitting device 120.

The package body 110 may be disposed on the circuit board 310. The first pad 311 and the first electrode 121 may be electrically connected to each other. The second pad 312 and the second electrode 122 may be electrically connected to each other.

The first pad 311 and the second pad 312 may include a conductive material. For example, the first pad 311 and the second pad 312 may include at least one material selected from the group consisting of Ti, Cu, Ni, Au, Cr, Ta, Pt, Sn, Ag, P, Fe, Sn, Zn and Al, or an alloy thereof. The first pad 311 and the second pad 312 may be composed of a single layer or a multilayer.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line.

The first frame 111 and the second frame 112 may be insulating frames. The first frame 111 and the second frame 112 may provide stable structural strength to the package body 110.

In addition, the first frame 111 and the second frame 112 may be conductive frames. The first frame 111 and the second frame 112 may provide stable the structural strength to the package body 110, and may be electrically connected to the light emitting device 120.

The package body 110 may include the first opening part TH1 and the second opening part TH2 provided from an upper surface toward a lower surface of the package body 110 in a first direction. The first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The first opening part TH1 may be arranged under the first electrode 121 of the light emitting device 120. The first opening part TH1 may overlap with the first electrode 121 of the light emitting device 120. The first opening part TH1 may overlap with the first electrode 121 of the light emitting device 120 in the first direction, which is directed from the upper surface toward the lower surface of the first frame 111.

The second opening part TH2 may be provided in the second frame 112. The second opening part TH2 may be provided through the second frame 112. The second opening part TH2 may be provided through an upper surface and a lower surface of the second frame 112 in the first direction.

The second opening part TH2 may be arranged under the second electrode 122 of the light emitting device 120. The second opening part TH2 may overlap with the second electrode 122 of the light emitting device 120. The second opening part TH2 may overlap with the second electrode 122 of the light emitting device 120 in the first direction, which is directed from the upper surface toward the lower surface of the second frame 112.

The first opening part TH1 and the second opening part TH2 may be spaced apart from each other. The first opening part TH1 and the second opening part TH2 may be spaced apart from each other under the lower surface of the light emitting device 120.

According to an embodiment, as shown in FIG. 23, the light emitting device package 300 may include an adhesive 130.

The adhesive 130 may be disposed between the body 113 and the light emitting device 120. The adhesive 130 may be disposed between an upper surface of the body 113 and a lower surface of the light emitting device 120.

In addition, according to an embodiment, as shown in FIG. 23, the light emitting device package 300 may include a recess R.

The recess R may be provided in the body 113. The recess R may be provided between the first opening part TH1 and the second opening part TH2. The recess R may be concavely provided from an upper surface toward a lower surface of the body 113. The recess R may be arranged under the light emitting device 120. The recess R may overlap with the light emitting device 120 in the first direction.

For example, the adhesive 130 may be disposed in the recess R. The adhesive 130 may be disposed between the light emitting device 120 and the body 113. The adhesive 130 may be disposed between the first electrode 121 and the second electrode 122. For example, the adhesive 130 may make contact with a side surface of the first electrode 121 and a side surface of the second electrode 122.

The adhesive 130 may provide stable fixing strength between the light emitting device 120 and the package body 110. The adhesive 130 may provide the stable fixing strength between the light emitting device 120 and the body 113. The adhesive 130 may make, for example, direct contact with the upper surface of the body 113. In addition, the adhesive 130 may make direct contact with the lower surface of the light emitting device 120.

For example, the adhesive 130 may include at least one of an epoxy-based material, a silicone-based material, a hybrid material including the epoxy-based material and the silicone-based material. For example, the adhesive may include white silicone.

The adhesive 130 may provide the stable fixing strength between the body 113 and the light emitting device 120, and if light is emitted through the lower surface of the light emitting device 120, the adhesive 130 may provide a light diffusion function between the light emitting device 120 and the body 113. When the light is emitted from the light emitting device 120 through the lower surface of the light emitting device 120, the adhesive 130 may improve light extraction efficiency of the light emitting device package 100 by the light diffusion function.

In addition, according to an embodiment, as shown in FIG. 23, the light emitting device package 300 may include a first conductive layer 321 and a second conductive layer 322. The first conductive layer 321 may be spaced apart from the second conductive layer 322.

The first conductive layer 321 may be provided in the first opening part TH1. The first conductive layer 321 may be disposed under the first electrode 121. A width of the first conductive layer 321 may be smaller than a width of the first electrode 121.

The first electrode 121 may have a width defined in a second direction perpendicular to the first direction along which the first opening part TH1 is provided. The width of the first electrode 121 may be larger than the width of the first opening part TH1 in the second direction.

The first conductive layer 321 may make direct contact with a lower surface of the first electrode 121. The first conductive layer 321 may be electrically connected to the first electrode 121. The first conductive layer 321 may be surrounded by the first frame 111.

The second conductive layer 322 may be provided in the second opening part TH2. The second conductive layer 322 may be disposed under the second electrode 122. A width of the second conductive layer 322 may be smaller than a width of the second electrode 122.

The second electrode 122 may have a width defined in the second direction perpendicular to the first direction along which the second opening part TH2 is provided. The width of the second electrode 122 may be larger than the width of the second opening part TH2 in the second direction.

The second conductive layer 322 may make direct contact with a lower surface of the second electrode 122. The second conductive layer 322 may be electrically connected to the second electrode 122. The second conductive layer 322 may be surrounded by the second frame 112.

The first conductive layer 321 and the second conductive layer 322 may include one material selected from the group consisting of Ag, Au, Pt, and the like, or an alloy thereof. However, embodiments are not limited thereto, and the first conductive layer 321 and the second conductive layer 322 may be formed of a material capable of ensuring a conduction function.

According to an embodiment, the first pad 311 of the circuit board 310 and the first conductive layer 321 may be electrically connected to each other. In addition, the second pad 312 of the circuit board 310 and the second conductive layer 322 may be electrically connected to each other.

In addition, according to an embodiment, a separate bonding layer may be additionally provided between the first pad 311 and the first conductive layer 321. In addition, a separate bonding layer may be additionally provided between the second pad 312 and the second conductive layer 322.

In addition, according to another embodiment, the first conductive layer 321 and the second conductive layer 322 may be mounted on the circuit board 310 by eutectic bonding.

In the light emitting device package 300 according to the embodiment described with reference to FIG. 23, the power supplied from the circuit board 310 is transmitted to the first electrode 121 and the second electrode 122 through the first conductive layer 321 and the second conductive layer 322, respectively. At this time, the first pad 311 of the circuit board 310 and the first conductive layer 321 make direct contact with each other, and the second pad 312 of the circuit board 310 and the second conductive layer 322 make direct contact with each other.

Therefore, in the light emitting device package 300 according to the embodiment shown in FIG. 23, the first frame 111 and the second frame 112 may be provided as an insulating frame. In addition, according to the light emitting device package 300 according to the embodiment shown in FIG. 23, the first frame 111 and the second frame 112 may be provided as a conductive frame.

As described above, in the light emitting device package and the method of manufacturing a light emitting device package according to an embodiment, a first electrode and a second electrode of the light emitting device may receive a driving power through a conductive layer disposed in an opening part. In addition, a melting point of the conductive layer disposed in the opening part may be selected to be a value higher than a melting point of a typical bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

Figure 24:
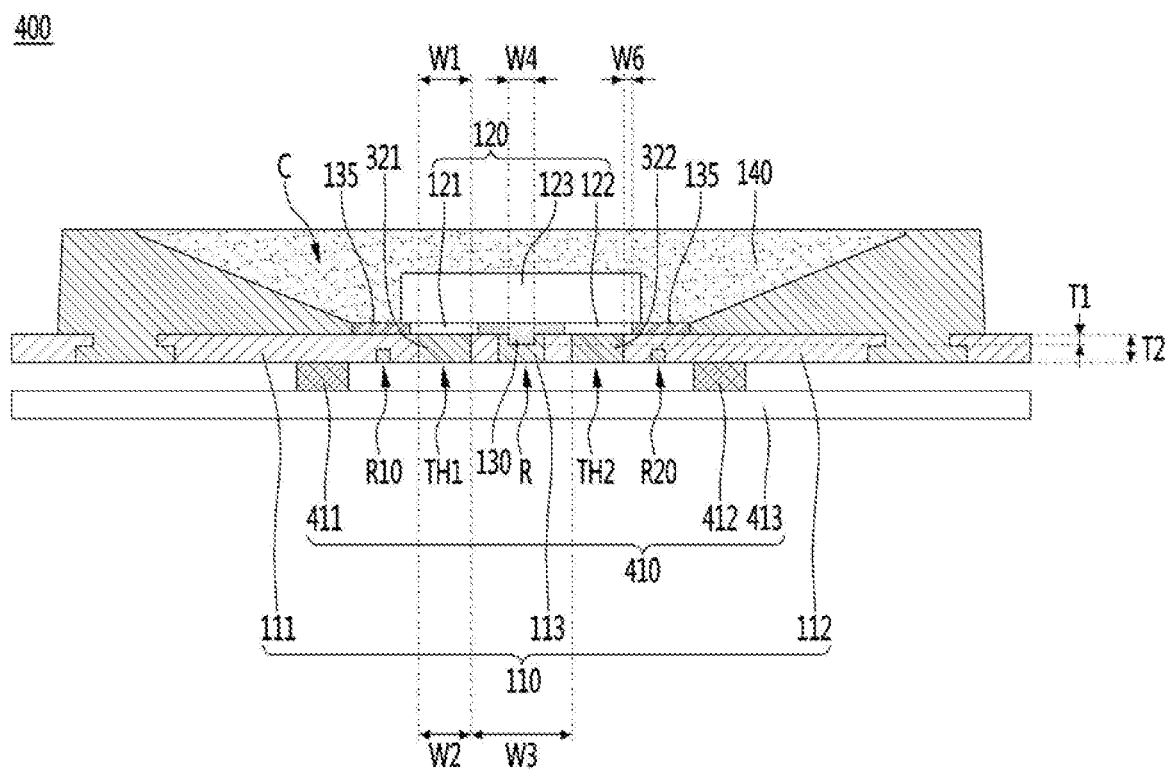
FIG. 24 is a view showing a light emitting device package according to still another embodiment of the present invention.

In addition, the light emitting device package 400 according to an embodiment of the present invention shown in FIG. 24 is an example in which the light emitting device package 100 described with reference to FIGS. 1 to 22 is mounted on a circuit board 410 and provided.

While describing the light emitting device package 400 according to an embodiment of the present invention with reference to FIG. 24, the descriptions that overlap with those described with reference to FIGS. 1 to 23 may be omitted.

According to an embodiment, as shown in FIG. 24, the light emitting device package 400 may include a circuit board 410, the package body 110, and the light emitting device 120.

The circuit board 410 may include a first pad 411, a second pad 412, and a substrate 413. The substrate 413 may be provided with a power supply circuit for controlling the driving of the light emitting device 120.

The package body 110 may be disposed on the circuit board 410. The first pad 411 and the first electrode 121 may be electrically connected to each other. The second pad 412 and the second electrode 122 may be electrically connected to each other.

The first pad 411 and the second pad 412 may include a conductive material. For example, the first pad 411 and the second pad 412 may include at least one material selected from the group consisting of Ti, Cu, Ni, Au, Cr, Ta, Pt, Sn, Ag, P, Fe, Sn, Zn and Al, or an alloy thereof. The first pad 411 and the second pad 412 may be composed of a single layer or a multilayer.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line.

The first frame 111 and the second frame 112 may be conductive frames. The first frame 111 and the second frame 112 may provide stable the structural strength to the package body 110, and may be electrically connected to the light emitting device 120.

The package body 110 may include the first opening part TH1 and the second opening part TH2 provided from an upper surface toward a lower surface of the package body 110 in a first direction. The first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The first opening part TH1 may be arranged under the first electrode 121 of the light emitting device 120. The first opening part TH1 may overlap with the first electrode 121 of the light emitting device 120. The first opening part TH1 may overlap with the first electrode 121 of the light emitting device 120 in the first direction, which is directed from the upper surface toward the lower surface of the first frame 111.

The second opening part TH2 may be provided in the second frame 112. The second opening part TH2 may be provided through the second frame 112. The second opening part TH2 may be provided through an upper surface and a lower surface of the second frame 112 in the first direction.

The second opening part TH2 may be arranged under the second electrode 122 of the light emitting device 120. The second opening part TH2 may overlap with the second electrode 122 of the light emitting device 120. The second opening part TH2 may overlap with the second electrode 122 of the light emitting device 120 in the first direction, which is directed from the upper surface toward the lower surface of the second frame 112.

The first opening part TH1 and the second opening part TH2 may be spaced apart from each other. The first opening part TH1 and the second opening part TH2 may be spaced apart from each other under the lower surface of the light emitting device 120.

According to an embodiment, as shown in FIG. 24, the light emitting device package 400 may include an adhesive 130.

The adhesive 130 may be disposed between the body 113 and the light emitting device 120. The adhesive 130 may be disposed between an upper surface of the body 113 and a lower surface of the light emitting device 120.

In addition, according to an embodiment, as shown in FIG. 24, the light emitting device package 400 may include a recess R.

The recess R may be provided in the body 113. The recess R may be provided between the first opening part TH1 and the second opening part TH2. The recess R may be concavely provided from an upper surface toward a lower surface of the body 113. The recess R may be arranged under the light emitting device 120. The recess R may overlap with the light emitting device 120 in the first direction.

For example, the adhesive 130 may be disposed in the recess R. The adhesive 130 may be disposed between the light emitting device 120 and the body 113. The adhesive 130 may be disposed between the first electrode 121 and the second electrode 122. For example, the adhesive 130 may make contact with a side surface of the first electrode 121 and a side surface of the second electrode 122.

The adhesive 130 may provide stable fixing strength between the light emitting device 120 and the package body 110. The adhesive 130 may provide the stable fixing strength between the light emitting device 120 and the body 113. The adhesive 130 may make, for example, direct contact with the upper surface of the body 113. In addition, the adhesive 130 may make direct contact with the lower surface of the light emitting device 120.

For example, the adhesive 130 may include at least one of an epoxy-based material, a silicone-based material, a hybrid material including the epoxy-based material and the silicone-based material. For example, the adhesive may include white silicone.

The adhesive 130 may provide the stable fixing strength between the body 113 and the light emitting device 120, and if light is emitted through the lower surface of the light emitting device 120, the adhesive 130 may provide a light diffusion function between the light emitting device 120 and the body 113. When the light is emitted from the light emitting device 120 through the lower surface of the light emitting device 120, the adhesive 130 may improve light extraction efficiency of the light emitting device package 100 by the light diffusion function.

In addition, according to an embodiment, as shown in FIG. 24, the light emitting device package 400 may include a first conductive layer 321 and a second conductive layer 322. The first conductive layer 321 may be spaced apart from the second conductive layer 322.

The first conductive layer 321 may be provided in the first opening part TH1. The first conductive layer 321 may be disposed under the first electrode 121. A width of the first conductive layer 321 may be smaller than a width of the first electrode 121.

The first electrode 121 may have a width defined in a second direction perpendicular to the first direction along which the first opening part TH1 is provided. The width of the first electrode 121 may be larger than the width of the first opening part TH1 in the second direction.

The first conductive layer 321 may make direct contact with a lower surface of the first electrode 121. The first conductive layer 321 may be electrically connected to the first electrode 121. The first conductive layer 321 may be surrounded by the first frame 111.

The second conductive layer 322 may be provided in the second opening part TH2. The second conductive layer 322 may be disposed under the second electrode 122. A width of the second conductive layer 322 may be smaller than a width of the second electrode 122.

The second electrode 122 may have a width defined in the second direction perpendicular to the first direction along which the second opening part TH2 is provided. The width of the second electrode 122 may be larger than the width of the second opening part TH2 in the second direction.

The second conductive layer 322 may make direct contact with a lower surface of the second electrode 122. The second conductive layer 322 may be electrically connected to the second electrode 122. The second conductive layer 322 may be surrounded by the second frame 112.

The first conductive layer 321 and the second conductive layer 322 may include one material selected from the group consisting of Ag, Au, Pt, and the like, or an alloy thereof. However, embodiments are not limited thereto, and the first conductive layer 321 and the second conductive layer 322 may be formed of a material capable of ensuring a conduction function.

According to an embodiment, the first pad 411 of the circuit board 410 and the first conductive layer 321 may be electrically connected to each other. In addition, the second pad 412 of the circuit board 410 and the second conductive layer 322 may be electrically connected to each other.

The first pad 411 may be electrically connected to the first frame 111. In addition, the second pad 412 may be electrically connected to the second frame 112.

In addition, according to an embodiment, a separate bonding layer may be additionally provided between the first pad 411 and the first frame 111. In addition, a separate bonding layer may be additionally provided between the second pad 412 and the second frame 112.

In the light emitting device package 400 according to the embodiment described with reference to FIG. 24, the power supplied from the circuit board 410 is transmitted to the first electrode 121 and the second electrode 122 through the first conductive layer 321 and the second conductive layer 322, respectively. At this time, the first pad 411 of the circuit board 410 and the first frame 111 make direct contact with each other, and the second pad 412 of the circuit board 410 and the second frame 112 make direct contact with each other.

As described above, in the light emitting device package and the method of manufacturing a light emitting device package according to an embodiment, a first electrode and a second electrode of the light emitting device may receive a driving power through a conductive layer disposed in an opening part. In addition, a melting point of the conductive layer disposed in the opening part may be selected to be a value higher than a melting point of a typical bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

In addition, the above light emitting device package according to the embodiment has been described based on the situations that one opening part is provided under each electrode pad.

However, according to the light emitting device package of another embodiment, opening parts may be provided under each electrode pad. In addition, the opening parts may have widths different from each other.

Figure 25:
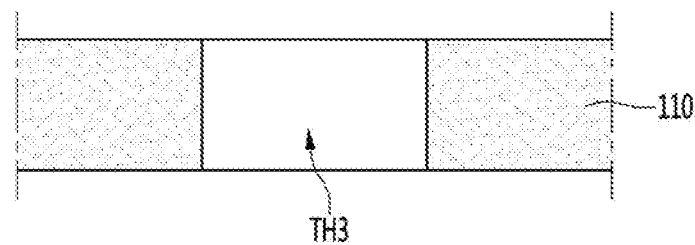
FIGS. 25 to 27 are views for describing a modification example of an opening part applied to the light emitting device package according to an embodiment of the present invention.
Figure 26:
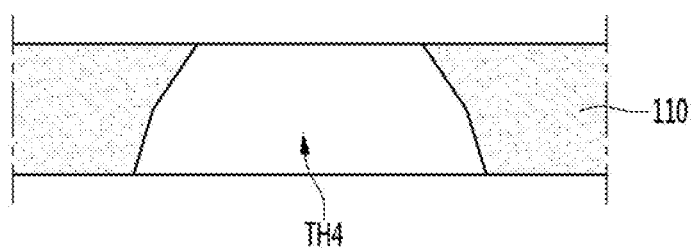
Figure 27:
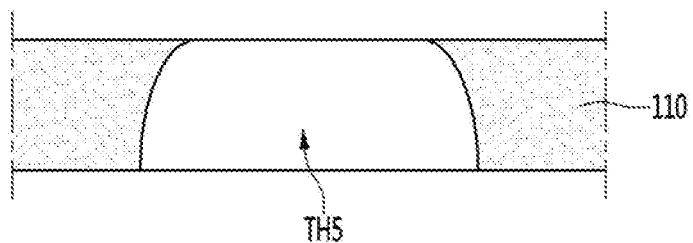

In addition, as shown in FIGS. 25 to 27, the opening part according to the embodiment may be provided in various shapes.

For example, as shown in FIG. 25, an opening part TH3 according to the embodiment may be provided with the same width from an upper region to a lower region thereof.

In addition, as shown in FIG. 26, an opening part TH4 according to the embodiment may be provided in a shape of a multi-stage structure. For example, the opening part TH4 may be provided in a shape of a two-stage structure having different inclination angles. In addition, the opening part TH4 may be provided in a shape of three stages or more having different inclination angles.

In addition, as shown in FIG. 27, an opening part TH5 may be provided in a shape in which the width changes from an upper region to a lower region thereof. For example, the opening part TH5 may be provided in a shape having a curvature from the upper region to the lower region thereof.

In addition, in the light emitting device package according to the embodiment described above, the package body 110 may include only a support member 113 having a flat upper surface without an inclined reflection part.

In other words, in the light emitting device package according to an embodiment, the package body 110 may have a structure forming the cavity C. In addition, the package body 110 may have a structure having a flat upper surface without the cavity C.

In addition, the light emitting device package according to the embodiment described above is described based on a situation where the first and second opening parts TH1 and TH2 are provided in the first and second frames 111 and 112 of the package body 110, respectively. However, the first and second opening parts TH1 and TH2 may be provided in the body 113 of the package body 110.

When the first and second opening parts TH1 and TH2 are provided in the body 113 of the package body 110 as described above, a length of an upper surface of the body 113 in the long axis direction of the light emitting device 120 may be larger than a length between the first electrode 121 and the second electrode 122 of the light emitting device 120.

In addition, when the first and second opening parts TH1 and TH2 are provided in the body 113 of the package body 110, according to an embodiment, the light emitting device package may not include the first and second frames 111 and 112.

In addition, the light emitting device package described above may be provided with a flip chip light emitting device as an example.

For example, the flip chip light emitting device may be provided as a reflective flip chip light emitting device that emits light in six-surfaced directions, or may be provided as a reflective flip chip light emitting device that emits light in five-surfaced directions.

The reflective flip chip light emitting device that emits light in the five-surfaced directions may have a structure in which a reflection layer is disposed in a direction close to the package body 110. For example, the reflective flip chip light emitting device may include an insulating reflective layer (such as a distributed bragg reflector, and an omni directional reflector) and/or a conductive reflective layer (such as Ag, Al, Ni, and Au) between the first and second electrode pads and a light emitting structure.

In addition, the flip chip light emitting device that emits the light in the six-surfaced directions may include a first electrode electrically connected to the first conductive semiconductor layer and a second electrode electrically connected to the second conductive semiconductor layer, and may be provided as a general horizontal type light emitting device in which light is emitted between the first electrode and the second electrode.

In addition, the flip chip light emitting device that emits light in the six-surfaced directions may be provided as a transmissive flip chip light emitting device including both a reflective region disposed therein with a reflective layer between the first and second electrode pads, and a transmissive region that emits the light.

Herein, the transmissive flip chip light emitting device refers to a device that emits the light to six surfaces of an upper surface, four side surfaces, and a lower surface thereof. In addition, the reflective flip chip light emitting device refers to a device that emits the light to five surfaces of an upper surface and four side surfaces thereof.

Hereinafter, an example of the flip chip light emitting device applied to the light emitting device package according to the embodiment of the present invention will be described with reference to the accompanying drawings.

Figure 28:
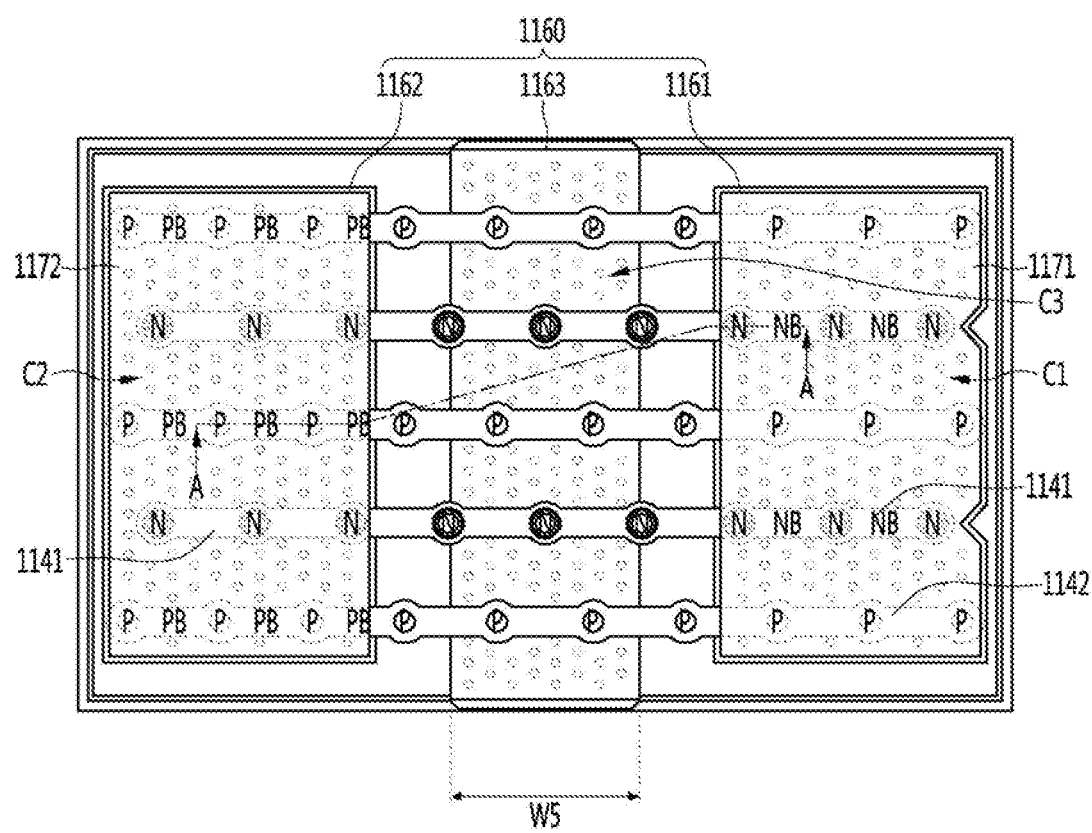
FIG. 28 is a plan view showing a light emitting device applied to the light emitting device package according to an embodiment of the present invention.

First, the light emitting device according to the embodiment of the present invention will be described with reference to FIGS. 28 and 29. FIG. 28 is a plan view illustrating a light emitting device according to an embodiment of the present invention, and FIG. 29 is a sectional view taken along the line A-A of a light emitting device shown in FIG. 28.

For better understanding, though disposed under the first electrode 1171 and the second electrode 1172, FIG. 28 shows a first sub-electrode 1141 electrically connected to the first electrode 1171, and a second sub-electrode 1142 electrically connected to the second electrode 1172.

Figure 29:
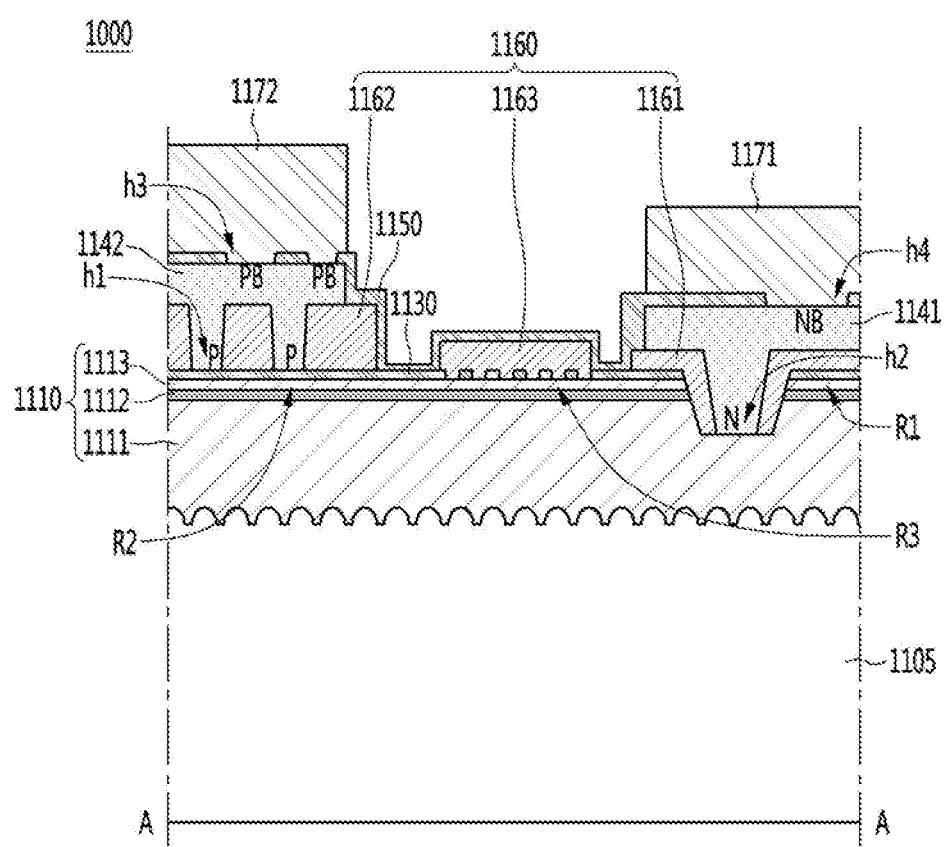
FIG. 29 is a sectional view showing the light emitting device taken along line A-A of FIG. 28.

As shown in FIGS. 28 and 29, the light emitting device 1100 according to the embodiment may include a light emitting structure 1110 disposed on a substrate 1105.

The substrate 1105 may be selected from the group including a sapphire substrate ($Al_2O_3$), SiC, GaAs, GaN, ZnO, Si, GaP, InP and Ge. For example, the substrate 1105 may be provided as a patterned sapphire substrate (PSS) formed on an upper surface thereof with a concavo-convex pattern.

The light emitting structure 1110 may include a first conductive semiconductor layer 1111, an active layer 1112, and a second conductive semiconductor layer 1113. The active layer 1112 may be disposed between the first conductive semiconductor layer 1111 and the second conductive semiconductor layer 1113. For example, the active layer 1112 may be disposed on the first conductive semiconductor layer 1111, and the second conductive semiconductor layer 1113 may be disposed on the active layer 1112.

According to the embodiment, the first conductive semiconductor layer 1111 may be provided as an n-type semiconductor layer, and the second conductive semiconductor layer 1113 may be provided as a p-type semiconductor layer. According to another embodiment, the first conductive semiconductor layer 1111 may be provided as a p-type semiconductor layer, and the second conductive semiconductor layer 1113 may be provided as an n-type semiconductor layer.

Hereinafter, for the descriptive convenience, it will be described with reference to the situation that the first conductive semiconductor layer 1111 is provided as an n-type semiconductor layer and the second conductive semiconductor layer 1113 is provided as a p-type semiconductor layer.

As shown in FIG. 29, the light emitting device 1100 according to the embodiment may include an ohmic contact layer 1130. The ohmic contact layer 1130 may increase light output by improving a current diffusion. An arranged position and a shape of the ohmic contact layer 1130 will be further described with reference to the method of manufacturing the light emitting device according to the embodiment.

For example, the ohmic contact layer 1130 may include at least one selected from the group including a metal, metal oxide, and metal nitride. The ohmic contact layer 1130 may include a light transmissive material.

The ohmic contact layer 1130 may include selected from the group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

As shown in FIGS. 28 and 29, the light emitting device 1100 according to the embodiment may include a reflective layer 1160. The reflective layer 1160 may include a first reflective layer 1161, a second reflective layer 1162, and a third reflective layer 1163. The reflective layer 1160 may be disposed on the ohmic contact layer 1130.

The second reflective layer 1162 may include a first opening h1 for exposing the ohmic contact layer 1130. The second reflective layer 1162 may include a plurality of first openings h1 disposed on the ohmic contact layer 1130.

The first reflective layer 1161 may include second openings h2 for exposing an upper surface of the first conductive semiconductor layer 1111.

The third reflective layer 1163 may be disposed between the first reflective layer 1161 and the second reflective layer 1162. For example, the third reflective layer 1163 may be connected to the first reflective layer 1161. In addition, the third reflective layer 1163 may be connected to the second reflective layer 1162. The third reflective layer 1163 may be disposed while physically making direct contact with the first reflective layer 1161 and the second reflective layer 1162.

For example, the width W5 of the third reflective layer 1163 may be smaller than the width W4 of the recess R described with reference to FIGS. 1 to 24.

Accordingly, light emitted between the first reflective layer 1161 and the third reflective layer 1163 may be incident to the adhesive 130 disposed in the region of the recess R. The light emitted in a downward direction of the light emitting device may be optically diffused by the adhesive 130 and the light extraction efficiency may be improved.

In addition, light emitted between the second reflective layer 1162 and the third reflective layer 1163 may be incident to the adhesive 130 disposed in the region of the recess R. The light emitted in a downward direction of the light emitting device may be optically diffused by the adhesive 130 and the light extraction efficiency may be improved.

The reflective layer 1160 according to the embodiment may make contact with the second conductive semiconductor layer 1113 through contact holes provided in the ohmic contact layer 1130. The reflective layer 1160 may physically make contact with an upper surface of the second conductive semiconductor layer 1113 through the contact holes provided in the ohmic contact layer 1130.

The shape of the ohmic contact layer 1130 and the shape of the reflective layer 1160 according to the embodiment will be further described with reference to the method of manufacturing the light emitting device according to the embodiment.

The reflective layer 1160 may be provided as an insulating reflective layer. For example, the reflective layer 1160 may be provided as a distributed bragg reflector (DBR) layer. In addition, the reflective layer 1160 may be provided as an omni directional reflector (ODR) layer. In addition, the reflective layer 1160 may be provided by stacking the DBR layer and the ODR layer.

As shown in FIGS. 28 and 29, the light emitting device 1100 according to the embodiment may include the first sub-electrode 1141 and the second sub-electrode 1142.

The first sub-electrode 1141 may be electrically connected to the first conductive semiconductor layer 1111 in the second opening h2. The first sub-electrode 1141 may be disposed on the first conductive semiconductor layer 1111. For example, according to the light emitting device 1100 of the embodiment, the first sub-electrode 1141 may be disposed on the upper surface of the first conductive semiconductor layer 1111 in the recess provided to a partial region of the first conductive semiconductor layer 1111 through the second conductive semiconductor layer 1113 and the active layer 1112.

The first sub-electrode 1141 may be electrically connected to the upper surface of the first conductive semiconductor layer 1111 through the second opening h2 provided in the first reflective layer 1161. The second opening h2 and the recess may vertically overlap each other. For example, as shown in FIGS. 31 and 32, the first sub-electrode 1141 may make direct contact with the upper surface of the first conductive semiconductor layer 1111 in recess regions.

The second sub-electrode 1142 may be electrically connected to the second conductive semiconductor layer 1113. The second sub-electrode 1142 may be disposed on the second conductive semiconductor layer 1113. According to the embodiment, the ohmic contact layer 1130 may be disposed between the second sub-electrode 1142 and the second conductive semiconductor layer 1113.

The second sub-electrode 1142 may be electrically connected to the second conductive semiconductor layer 1113 through the first opening h1 provided in the second reflective layer 1162. For example, as shown in FIGS. 31 and 32, the second sub-electrode 1142 may be electrically connected to the second conductive semiconductor layer 1113 through the ohmic contact layer 1130 in P regions.

As shown in FIGS. 28 and 29, the second sub-electrode 1142 may make direct contact with an upper surface of the ohmic contact layer 1130 through a plurality of first openings h1 provided in the second reflective layer 1162 in the P regions.

According to the embodiment, as shown in FIGS. 28 and 29, the first sub-electrode 1141 and the second sub-electrode 1142 may have polarities to each other and may be spaced apart from each other.

For example, the first sub-electrode 1141 may be provided in line shapes. In addition, for example, the second sub-electrode 1142 may be provided in line shapes. The first sub-electrode 1141 may be disposed between neighboring second sub-electrodes 1142. The second sub-electrode 1142 may be disposed between neighboring first sub-electrodes 1141.

When the first sub-electrode 1141 and the second sub-electrode 1142 have polarities different from each other, the number of the electrodes may be different from each other. For example, when the first sub-electrode 1141 is configured to be an n-electrode and the second sub-electrode 1142 be a p-electrode, the number of the second sub-electrodes 1142 may be more. When an electrical conductivity and/or resistance of the second conductive semiconductor layer 1113 and the first conductive semiconductor layer 1111 are different from each other, electrons injected into the light emitting structure 1110 may be balanced with positive holes by the first sub-electrode 1141 and the second sub electrode 1142, thus optical characteristics of the light emitting device may be improved.

The first sub-electrode 1141 and the second sub-electrode 1142 may be provided with a structure having a single layer or multiple layers. For example, the first sub-electrode 1141 and the second sub-electrode 1142 may be ohmic electrodes. For example, the first sub-electrode 1141 and the second sub-electrode 1142 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf.

As shown in FIGS. 28 and 29, the light emitting device 1100 according to the embodiment may include a protective layer 1150.

The protective layer 1150 may include third openings h3 for exposing the second sub-electrode 1142. The third openings h3 may be disposed corresponding to PB regions provided in the second sub-electrode 1142.

In addition, the protective layer 1150 may include fourth openings h4 for exposing the first sub-electrode 1141. The fourth openings h4 may be disposed corresponding to NB regions provided in the first sub-electrode 1141.

The protective layer 1150 may be disposed on the reflective layer 1160. The protective layer 1150 may be disposed on the first reflective layer 1161, the second reflective layer 1162, and the third reflective layer 1163.

For example, the protective layer 1150 may be provided as an insulating material. For example, the protective layer 1150 may be formed of at least one material selected from the group including SixOy, SiOxNy, SixNy, and AlxOy.

As shown in FIGS. 28 and 29, the light emitting device 1100 according to the embodiment may include the first electrode 1171 and the second electrode 1172 disposed on the protective layer 1150.

The first electrode 1171 may be disposed on the first reflective layer 1161. In addition, the second electrode 1172 may be disposed on the second reflective layer 1162. The second electrode 1172 may be spaced apart from the first electrode 1171.

The first electrode 1171 may make contact with an upper surface of the first sub-electrode 1141 through the fourth openings h4 provided in the protective layer 1150 in the NB regions. The NB regions may be vertically offset with the second opening h2. When the plurality of NB regions and the second opening h2 are vertically offset from each other, a current injected into the first electrode 1171 may be uniformly distributed in a horizontal direction of the first sub-electrode 1141, thus the current may be uniformly injected in the NB regions.

In addition, the second electrode 1172 may make contact with an upper surface of the second sub-electrode 1142 through the third openings h3 provided in the protective layer 1150 in the PB regions. When the PB regions and the first openings h1 are not vertically overlapped with each other, a current injected into the second electrode 1172 may be uniformly distributed in a horizontal direction of the second sub-electrode 1142, thus the current may be uniformly injected in the PB regions.

Thus, according to the light emitting device 1100 of the embodiment, the first electrode 1171 may make contact with the first sub-electrode 1141 in the fourth openings h4. In addition, the second electrode 1172 may make contact with the second sub-electrode 1142 in the multiple regions. Thus, according to the embodiment, because the power may be supplied through the regions, a current dispersion effect can be generated and an operating voltage can be reduced according to the increase of a contact area and the dispersion of a contact region.

In addition, according to the light emitting device 1100 of the embodiment, as shown in FIG. 29, the first reflective layer 1161 is disposed under the first sub-electrode 1141 and the second reflective layer 1162 is disposed under the second sub-electrode 1142. Accordingly, the first reflective layer 1161 and the second reflective layer 1162 reflect light emitted from the active layer 1112 of the light emitting structure 1110 to minimize the optical absorption in the first sub-electrode 1141 and the second sub-electrode 1142, so that light intensity Po can be improved.

For example, the first reflective layer 1161 and the second reflective layer 1162 may be formed of an insulating material, and have a structure such as a DBR structure using a material having high reflectivity to reflect the light emitted from the active layer 1112.

The first reflective layer 1161 and the second reflective layer 1162 may have a DBR structure in which materials having different refractive indexes are alternately disposed. For example, the first reflective layer 1161 and the second reflective layer 1162 may be disposed in a single layer or a stacked structure including at least one of $TiO_2$, $SiO_2$, $Ta_2O_5$, and $HfO_2$.

Without the limitation thereto, according to another embodiment, the first reflective layer 1161 and the second reflective layer 1162 may freely selected to adjust the reflectivity to the light emitted from the active layer 1112 according to a wavelength of the light emitted from the active layer 1112.

In addition, according to another embodiment, the first reflective layer 1161 and the second reflective layer 1162 may be provided as the ODR layer. According to still another embodiment, the first reflective layer 1161 and the second reflective layer 1162 may be provided as a sort of hybrid type in which the DBR layer and the ODR layer are stacked.

When the light emitting device according to the embodiment is implemented as a light emitting device package after being mounted by a flip chip bonding scheme, light provided from the light emitting structure 1110 may be emitted through the substrate 1105. The light emitted from the light emitting structure 1110 may be reflected by the first reflective layer 1161 and the second reflective layer 1162 and emitted toward the substrate 1105.

In addition, the light emitted from the light emitting structure 1110 may be emitted in the lateral direction of the light emitting structure 1110. In addition, the light emitted from the light emitting structure 1110 may be emitted to the outside through a region where the first electrode 1171 and the second electrode 1172 are not provided among surfaces on which the first electrode 1171 and the second electrode 1172 are disposed.

Specifically, the light emitted from the light emitting structure 1110 may be emitted to the outside through a region where the third reflective layer 1163 is not provided among the surfaces on which the first electrode 1171 and the second electrode 1172 are disposed.

Accordingly, the light emitting device 1100 according to the embodiment may emit the light in six-surfaced directions surrounding the light emitting structure 1110, and remarkably improve the light intensity.

In addition, according to the light emitting device of the embodiment, when viewed from the top of the light emitting device 1100, the sum of the areas of the first electrode 1171 and the second electrode 1172 is less than or equal to 60% of the total area of the upper surface of the light emitting device 1100 on which the first electrode 1171 and the second electrode 1172 are disposed.

For example, the total area of the upper surface of the light emitting device 1100 may correspond to the area defined by a lateral length and a longitudinal length of the lower surface of the first conductive semiconductor layer 1111 of the light emitting structure 1110. In addition, the total area of the upper surface of the light emitting device 1100 may correspond to the area of an upper surface or a lower surface of the substrate 1105.

Accordingly, the sum of the areas of the first electrode 1171 and the second electrode 1172 is equal to or less than 60% of the total area of the light emitting device 1100, so that the amount of light emitted to the surface on which the first electrode 1171 and the second electrode 1172 are disposed may be increased. Thus, according to the embodiment, because the amount of the light emitted in the six-surfaced directions of the light emitting device 1100 is increased, the light extraction efficiency may be improved and the light intensity Po may be increased.

In addition, when viewed from the top of the light emitting device, the sum of the areas of the first electrode 1171 and the second electrode 1172 is equal to or greater than 30% of the total area of the light emitting device 1100.

Accordingly, the sum of the areas of the first electrode 1171 and the second electrode 1172 is equal to or greater than 30% of the total area of the light emitting device 1100, so that a stable mount may be performed through the first electrode 1171 and the second electrode 1172, and electrical characteristics of the light emitting device 1100 may be ensured.

The sum of the areas of the first electrode 1171 and the second electrode 1172 may be selected as 30% to 60% with respect to the total area of the light emitting device 1100 in consideration of ensuring the light extraction efficiency and the bonding stability.

In other words, when the sum of the areas of the first electrode 1171 and the second electrode 1172 is 30% to 100% with respect to the total area of the light emitting device 1100, the electrical characteristics of the light emitting device 1100 may be ensured and bonding strength to be mounted on the light emitting device package may be ensured, so that stable mount may be performed.

In addition, when the sum of the areas of the first electrode 1171 and the second electrode 1172 is more than 0% and equal to or less than 60% of the total area of the light emitting device 1100, the amount of light emitted to the surface on which the first electrode 1171 and the second electrode 1172 are disposed increases, so that the light extraction efficiency of the light emitting device 1100 may be improved and the light intensity Po may be increased.

In the embodiment, the sum of the areas of the first electrode 1171 and the second electrode 1172 is selected as 30% to 60% of the total area of the light emitting device 1100 to ensure the electrical characteristics of the light emitting device 1100 and the bonding strength to be mounted on the light emitting device package and increase the light intensity.

In addition, according to the light emitting device 1100 of the embodiment, the third reflective layer 1163 may be disposed between the first electrode 1171 and the second electrode 1172. For example, the length W5 of the third reflective layer 1163 in major axial direction of the light emitting device 1100 may correspond to the distance between the first electrode 1171 and the second electrode 1172. In addition, for example, the area of the third reflective layer 1163 may be 10% to 25% of the entire upper surface of the light emitting device 1100.

When the area of the third reflective layer 1163 is 10% or more of the entire upper surface of the light emitting device 1100, the package body disposed under the light emitting device may be prevented from being discolored or cracked. When being 25% or less, it is advantageous to ensure the light extraction efficiency for emitting light to six surfaces of the light emitting device.

In addition, without limited thereto in another embodiment, the area of the third reflective layer 1163 may be arranged to more than 0% and less than 10% of the entire upper surface of the light emitting device 1100 to ensure the light extraction efficiency more, and the area of the third reflective layer 1163 may be arranged to more than 25% and less than 100% of the entire upper surface of the light emitting device 1100 to prevent the package body from being discolored or cracked.

In addition, the light generated from the light emitting structure 1110 may be transmitted and emitted through a second region provided between a side surface arranged in the major axial direction and the first electrode 1171 or the second electrode 1172 adjacent to the side surface.

In addition, the light generated from the light emitting structure 1110 may be transmitted and emitted through a third region provided between a side surface arranged in a minor axial direction and the first electrode 1171 or the second electrode 1172 adjacent to the side surface.

According to the embodiment, the size of the first reflective layer 1161 may be several micrometers larger than the size of the first electrode 1171. For example, the area of the first reflective layer 1161 may be provided in a size to completely cover the area of the first electrode 1171. In consideration of a process error, for example, the length of one side of the first reflective layer 1161 may be greater than the length of one side of the first electrode 1171 by about 4 micrometers to about 10 micrometers.

In addition, the size of the second reflective layer 1162 may be several micrometers larger than the size of the second electrode 1172. For example, the area of the second reflective layer 1162 may be provided in a size to completely cover the area of the second electrode 1172. In consideration of a process error, for example, the length of one side of the second reflective layer 1162 may be greater than the length of one side of the second electrode 1172 by about 4 micrometers to about 10 micrometers.

According to the embodiment, light emitted from the light emitting structure 1110 may be reflected without being incident on the first electrode 1171 and the second electrode 1172 by the first reflective layer 1161 and the second reflective layer 1162. Thus, according to the embodiment, a loss of the light generated and emitted from the light emitting structure 1110 and incident to the first electrode 1171 and the second electrode 1172 may be minimized.

In addition, according to the light emitting device 1100 of the embodiment, because the third reflective layer 1163 is disposed between the first electrode 1171 and the second electrode 1172, the amount of light emitted between the first electrode 1171 and the second electrode 1172 may be adjusted.

As described above, the light emitting device 1100 according to the embodiment may be provided as a light emitting device package after being mounted, for example, in a flip chip bonding scheme. Herein, when the package body mounted thereon with the light emitting device 1100 is provided with resin or the like, the package body is discolored or cracked in the lower region of the light emitting device 1100 due to strong short-wavelength light emitted from the light emitting device 1100.

However, according to the light emitting device 1100 of the embodiment, because the amount of light emitted between the region on which the first electrode 1171 and the second electrode 1172 are disposed is adjusted, the package body disposed in the lower region of the light emitting device 1100 may be prevented from being discolored or cracked.

According to the embodiment, the light generated from the light emitting structure 1100 may be transmitted and emitted through 20% or more of the area of the upper surface of the light emitting device 1100 on which the first electrode 1171, the second electrode 1172 and the third reflective layer 1163.

Thus, according to the embodiment, because the amount of the light emitted in the six-surfaced directions of the light emitting device 1100 is increased, the light extraction efficiency may be improved and the light intensity Po may be increased. In addition, the package body disposed adjacent to the lower surface of the light emitting device 1100 may be prevented from being discolored or cracked.

In addition, according to the light emitting device 1100 of the embodiment, a plurality of contact holes C1, C2, and C3 may be provided in the ohmic contact layer 1130. The second conductive semiconductor layer 1113 may be bonded to the reflective layer 1160 through the plurality of contact holes C1, C2, and C3 provided in the ohmic contact layer 1130. The reflective layer 1160 makes directly contact with the second conductive semiconductor layer 1113, so that the adhesive strength may be improved as compared with the situation that the reflective layer 1160 makes contact with the ohmic contact layer 1130.

When the reflective layer 1160 makes direct contact with only the ohmic contact layer 1130, the bonding strength or adhesive strength between the reflective layer 1160 and the ohmic contact layer 1130 may be weakened. For example, when an insulating layer is bonded to a metal layer, the bonding strength or adhesive strength between the materials thereof may be weakened.

For example, when the bonding strength or adhesive strength between the reflective layer 1160 and the ohmic contact layer 1130 is weak, peeling may incur between the two layers. Thus, when the peeling incurs between the reflective layer 1160 and the ohmic contact layer 1130, the characteristics of the light emitting device 1100 may deteriorate and the reliability of the light emitting device 1100 may not be ensured.

However, according to the embodiment, because the reflective layer 1160 can make direct contact with the second conductive semiconductor layer 1113, the bonding strength and adhesive strength may be stably provided between the reflective layer 1160, the ohmic contact layer 1130, and the second conductive semiconductor layer 1113.

Thus, according to the embodiment, because the bonding strength between the reflective layer 1160 and the second conductive semiconductor layer 1113 may be stably provided, the reflective layer 1160 may be prevented from being peeled off from the ohmic contact layer 1130. In addition, because the bonding strength between the reflective layer 1160 and the second conductive semiconductor layer 1113 may be stably provided, the reliability of the light emitting device 1100 may be improved.

In addition, as described above, the ohmic contact layer 1130 may be provided with the contact holes C1, C2, and C3. The light emitted from the active layer 1112 may be incident to and reflected by the reflective layer 1160 through the contact holes C1, C2, and C3 provided in the ohmic contact layer 1130. Accordingly, the loss of the light generated from the active layer 1112 and incident to the ohmic contact layer 1130 is reduced, so that the light extraction efficiency may be improved. Thus, according to the light emitting device 1100 of the embodiment, the light intensity may be improved.

Hereinafter, the method of manufacturing the light emitting device according to the embodiment will be described with reference to the accompanying drawings. Upon description of the method of manufacturing the light emitting device according to the embodiment, description overlapped with those described with reference to FIGS. 28 to 29 may be omitted.

Figure 30A:
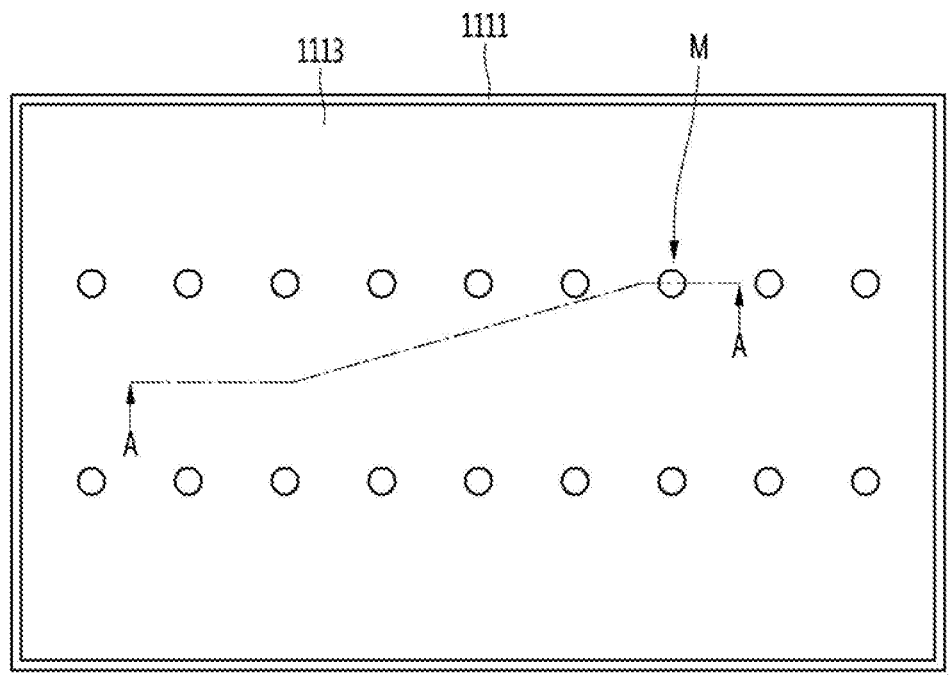
FIGS. 30*a* and 30*b* are views for describing a step in which a semiconductor layer is formed by a method of manufacturing a light emitting device according to an embodiment of the present invention.
Figure 30B:
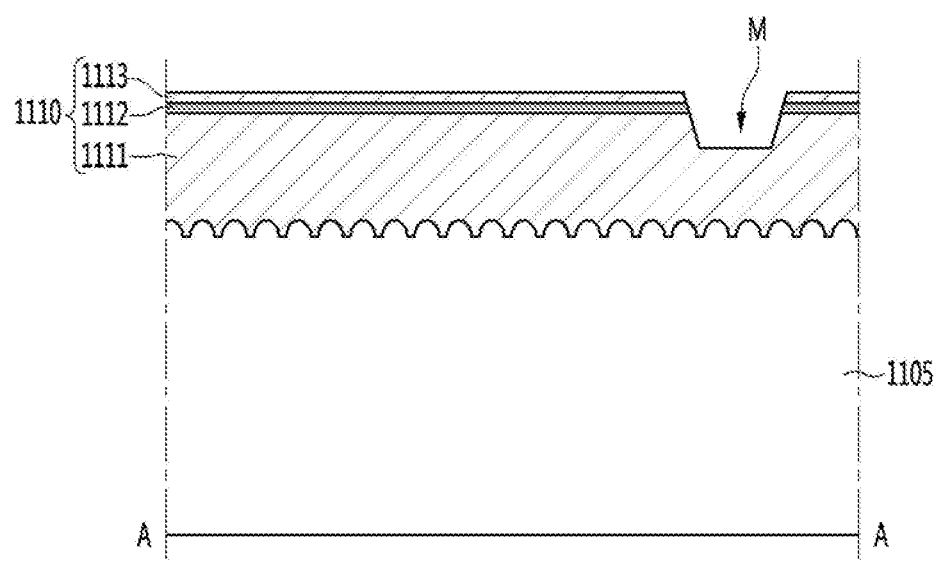

First, according to the method of manufacturing the light emitting device of the embodiment, as shown in FIGS. 30a and 30b, the light emitting structure 1110 may be provided on the substrate 1105. FIG. 30a is a plan view showing a shape of the light emitting structure 1110 formed according to the method of manufacturing the light emitting device according to the embodiment, and FIG. 30b is a process sectional view taken along the line A-A of the light emitting device shown in FIG. 30a.

According to the embodiment, the light emitting structure 1110 may be provided on the substrate 1105. For example, the first conductive semiconductor layer 1111, the active layer 1112, and the second conductive semiconductor layer 1113 may be provided on the substrate 1105.

According to the embodiment, a part of the first conductive semiconductor layer 1111 may be exposed by a mesa etching process. The light emitting structure 1110 may include mesa openings M for exposing the first conductive semiconductor layer 1111 by mesa etching. For example, the mesa opening M may be provided in circular shapes. In addition, the mesa opening M also may be referred to as a recess. The mesa opening M may be provided in various shapes such as an oval shape or a polygonal shape as well as a circular shape.

Figure 31A:
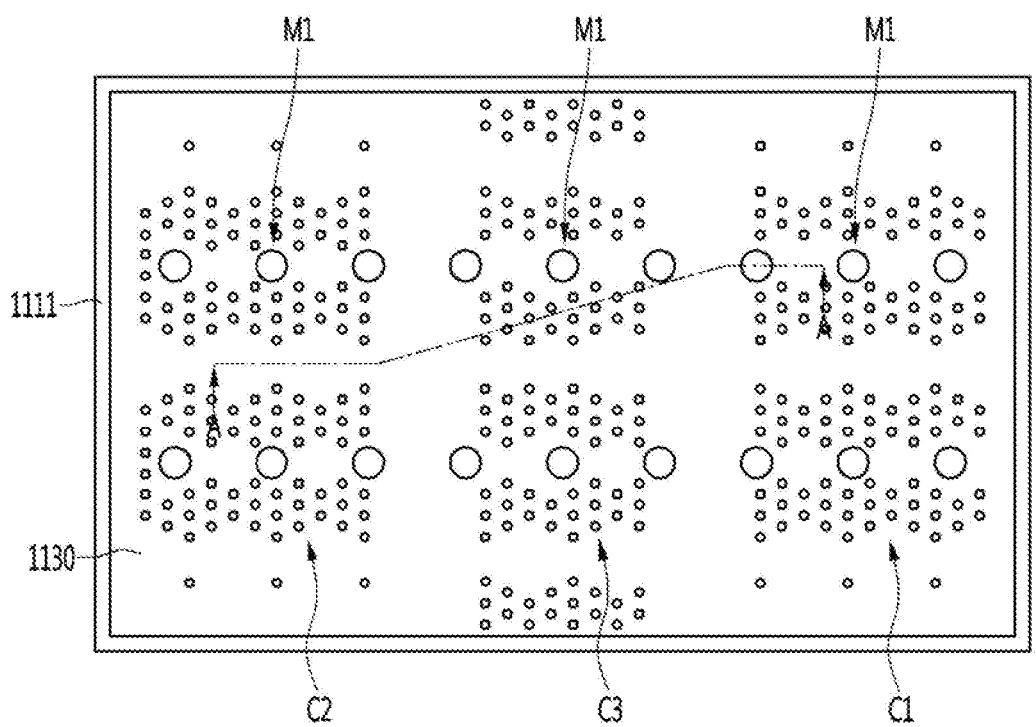
FIGS. 31a and 31b are views for describing a step in which an ohmic contact layer is formed by a method of manufacturing a light emitting device according to an embodiment of the present invention.
Figure 31B:
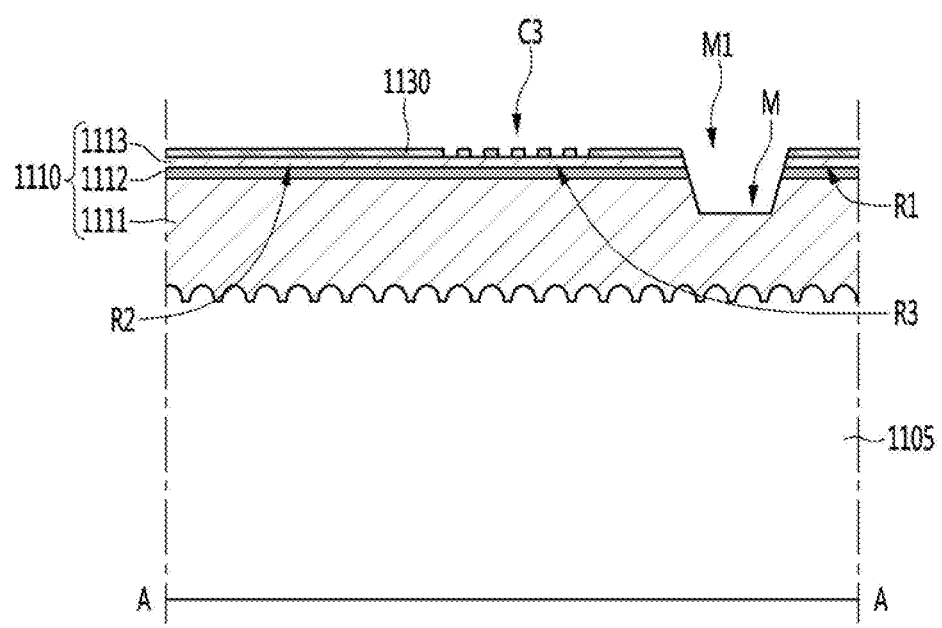

Next, as shown in FIGS. 31a and 31b, the ohmic contact layer 1130 may be provided. FIG. 31a is a plan view showing a shape of the ohmic contact layer 1130 formed according to the method of manufacturing the light emitting device according to the embodiment, and FIG. 31b is a process sectional view taken along the line A-A of the light emitting device shown in FIG. 31a.

According to the embodiment, the ohmic contact layer 1130 may be provided on the second conductive semiconductor layer 1113. The ohmic contact layer 1130 may include openings M1 provided regions corresponding to the mesa openings M.

For example, the openings M1 may be provided in circular shapes. The openings M1 may be provided in various shapes such as an oval shape or a polygonal shape as well as a circular shape.

The ohmic contact layer 1130 may include a first region R1, a second region R2, and a third region R3. The first region R1 and the second region R2 may be spaced apart from each other. In addition, the third region R3 may be arranged between the first region R1 and the second region R2.

The first region R1 may include the openings M1 provided in the regions corresponding to the mesa openings M of the light emitting structure 1110. In addition, the first region R1 may include multiple first contact holes C1. For example, the first contact holes C1 may be plurally provided around the opening M1.

The second region R2 may include the openings M1 provided in the regions corresponding to the mesa openings M of the light emitting structure 1110. In addition, the second region R2 may include multiple second contact holes C2. For example, the second contact holes C2 may be plurally provided around the opening M2.

The third region R3 may include the openings M1 provided in the regions corresponding to the mesa openings M of the light emitting structure 1110. In addition, the first region R1 may include multiple first contact holes C1. For example, the first contact holes C1 may be plurally provided around the opening M1.

According to the embodiment, the first contact hole C1, the second contact hole C2, and the third contact hole C3 may have a diameter of several micrometers to several tens of micrometers. For example, the first contact hole C1, the second contact hole C2, and the third contact hole C3 may have a diameter of 7 micrometers to 20 micrometers.

The first contact hole C1, the second contact hole C2, and the third contact hole C3 may be provided in various shapes such as an oval shape or a polygonal shape as well as a circular shape.

According to the embodiment, the second conductive semiconductor layer 1113 disposed under the ohmic contact layer 1130 may be exposed by the first contact hole C1, the second contact hole C2, and the third contact hole C3.

Functions of the opening M1, the first contact hole C1, the second contact hole C2, and the third contact hole C3 will be further described with reference to the following subsequent process.

Figure 32A:
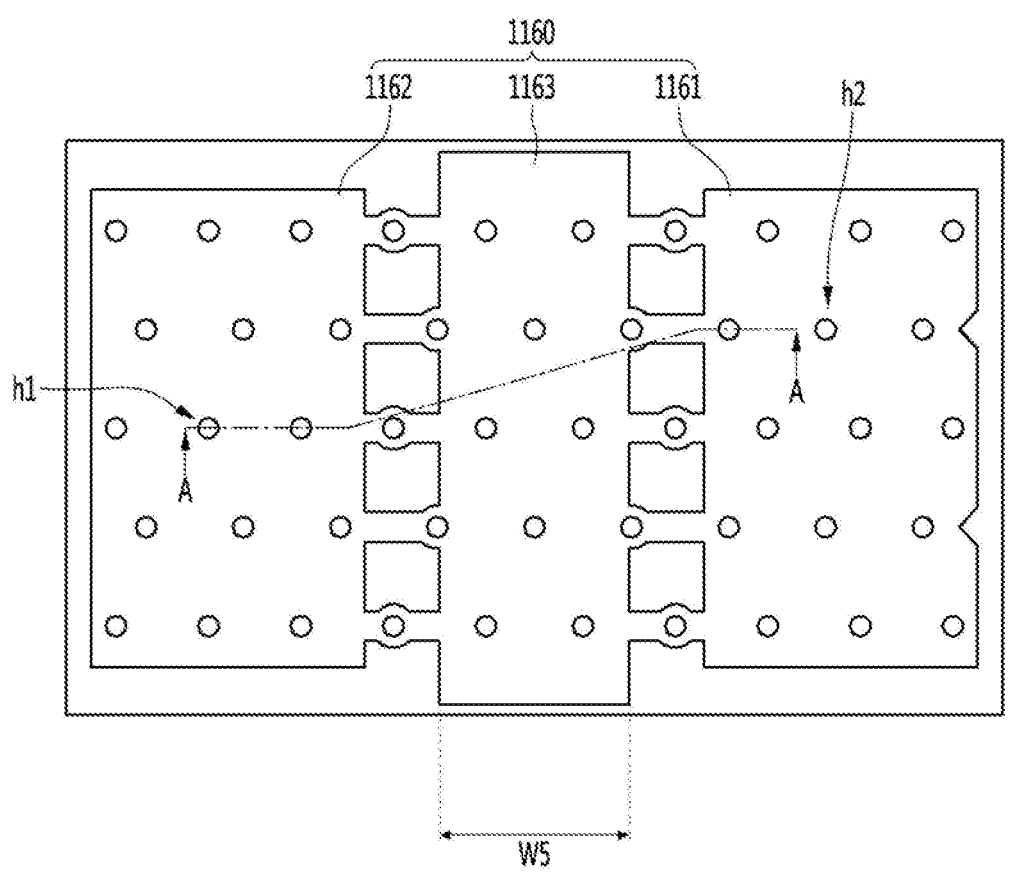
FIGS. 32a and 32b are views for describing a step in which a reflective layer is formed by a method of manufacturing a light emitting device according to an embodiment of the present invention.
Figure 32B:
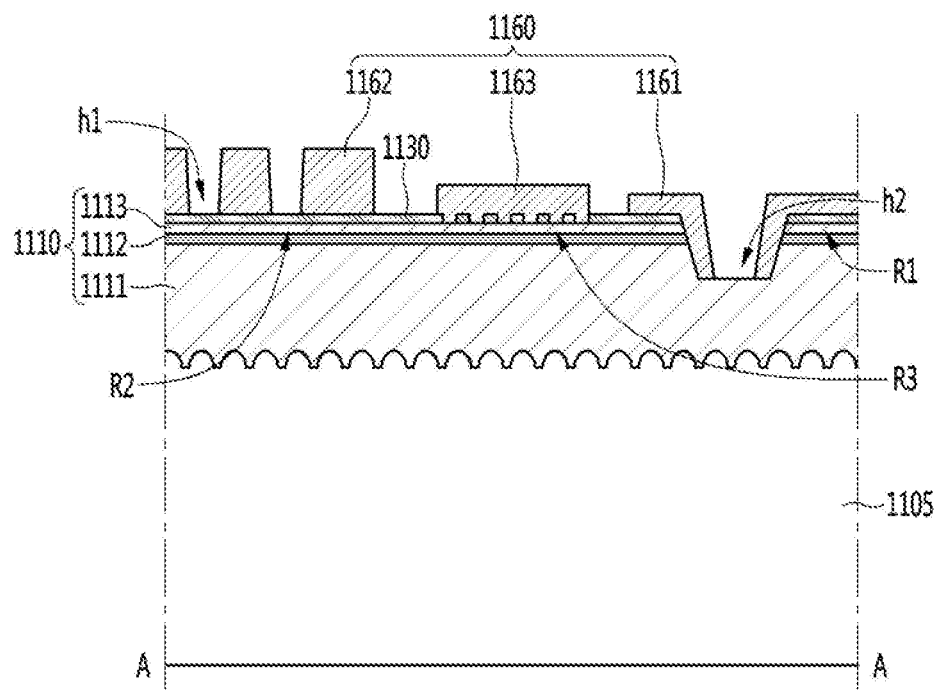

Next, as shown in FIGS. 32a and 32b, the reflective layer 1160 may be provided. FIG. 32a is a plan view showing a shape of the reflective layer 1160 formed according to the method of manufacturing the light emitting device according to the embodiment, and FIG. 32b is a process sectional view taken along line A-A of the light emitting device shown in FIG. 32a.

The reflective layer 1160 may include a first reflective layer 1161, a second reflective layer 1162, and a third reflective layer 1163. The reflective layer 1160 may be disposed on the ohmic contact layer 1130. The reflective layer 1160 may be disposed over the first conductive semiconductor layer 1111 and the second conductive semiconductor layer 1113.

The first reflective layer 1161 and the second reflective layer 1162 may be spaced apart from each other. The third reflective layer 1163 may be disposed between the first reflective layer 1161 and the second reflective layer 1162.

The first reflective layer 1161 may be disposed on the first region R1 of the ohmic contact layer 1130. The first reflective layer 1161 may be disposed on the first contact holes C1 provided in the ohmic contact layer 1130.

The second reflective layer 1162 may be disposed on the second region R2 of the ohmic contact layer 1130. The second reflective layer 1162 may be disposed on the second contact holes C2 provided in the ohmic contact layer 1130.

The third reflective layer 1163 may be disposed on the third region R3 of the ohmic contact layer 1130. The third reflective layer 1163 may be disposed on the third contact holes C3 provided in the ohmic contact layer 1130.

The second reflective layer 1162 may include openings. For example, the second reflective layer 1162 may include the first openings h1. The ohmic contact layer 1130 may be exposed through the first openings h1.

In addition, the first reflective layer 1161 may include the second openings h2. The upper surface of the first conductive semiconductor layer 1111 may be exposed through the plurality of second openings h2. The plurality of second openings h2 may be provided corresponding to the regions of the mesa openings M formed in the light emitting structure 1110. In addition, the plurality of second openings h2 may be provided corresponding to the regions of the openings M1 provided in the ohmic contact layer 1130.

In addition, according to the embodiment, the first reflective layer 1161 may be provided on the first region R1 of the ohmic contact layer 1130. In addition, the first reflective layer 1161 may make contact with the second conductive semiconductor layer 1113 through the first contact hole C1 provided in the ohmic contact layer 1130. Accordingly, the adhesive strength between the first reflective layer 1161 and the second conductive semiconductor layer 1113 may be improved, and the first reflective layer 1161 may be prevented from being peeled off from the ohmic contact layer 1130.

In addition, according to the embodiment, the second reflective layer 1162 may be provided on the second region R2 of the ohmic contact layer 1130. The second reflective layer 1162 may make contact with the second conductive semiconductor layer 1113 through the second contact hole C2 provided in the ohmic contact layer 1130. Accordingly, the adhesive strength between the second reflective layer 1162 and the second conductive semiconductor layer 1113 may be improved, and the second reflective layer 1162 may be prevented from being peeled off from the ohmic contact layer 1130.

In addition, according to the embodiment, the third reflective layer 1163 may be provided on the third region R3 of the ohmic contact layer 1130. The third reflective layer 1163 may make contact with the second conductive semiconductor layer 1113 through the third contact hole C3 provided in the ohmic contact layer 1130. Accordingly, the adhesive strength between the third reflective layer 1163 and the second conductive semiconductor layer 1113 may be improved, and the third reflective layer 1163 may be prevented from being peeled off from the ohmic contact layer 1130.

Figure 33A:
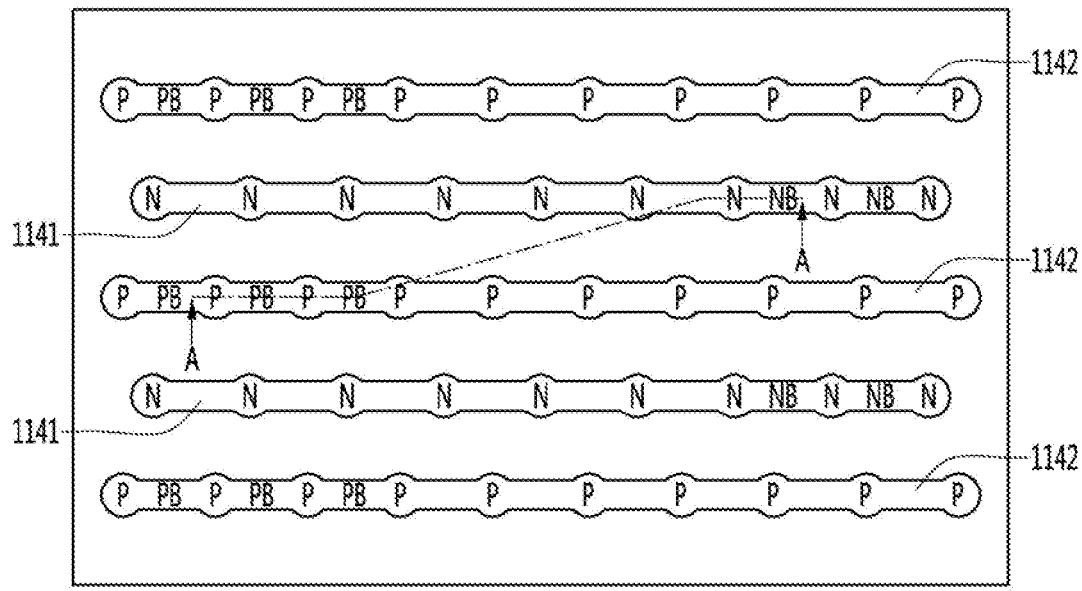
FIGS. 33a and 33b are views for describing a step in which a first sub-electrode and a second sub-electrode are formed by a method of manufacturing a light emitting device according to an embodiment of the present invention.
Figure 33B:
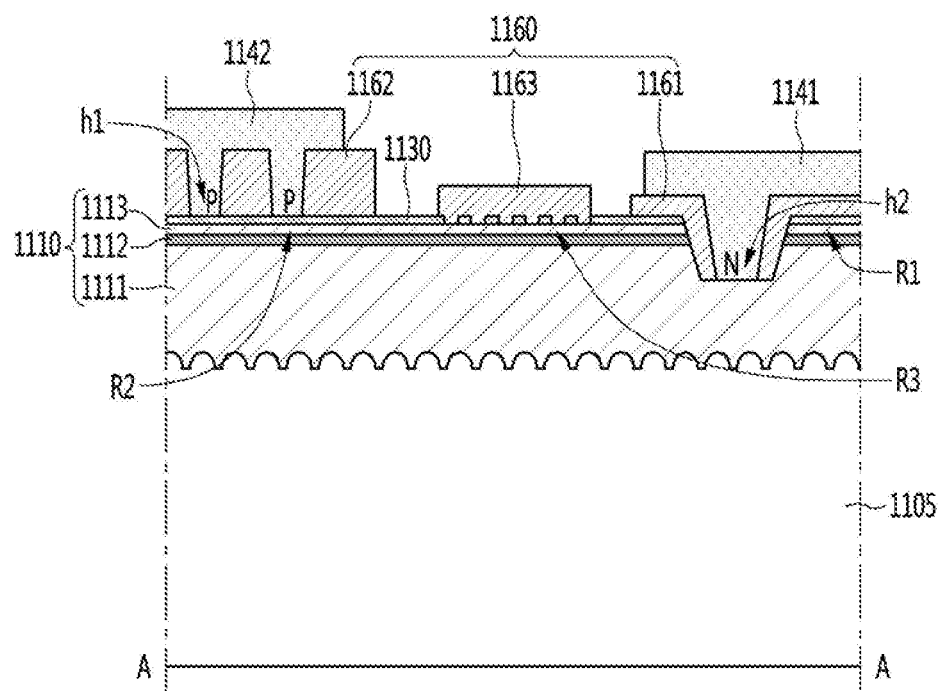

Subsequently, as shown in FIGS. 33a and 33b, the first sub-electrode 1141 and the second sub-electrode 1142 may be provided. FIG. 33a is a plan view showing shapes of the first sub-electrode 1141 and the second sub-electrode 1142 formed according to the method of manufacturing the light emitting device according to the embodiment, and FIG. 33b is a process sectional view taken along the line A-A of the light emitting device shown in FIG. 33a.

According to the embodiment, the first sub-electrode 1141 and the second sub-electrode 1142 may be spaced apart from each other.

The first sub-electrode 1141 may be electrically connected to the first conductive semiconductor layer 1111. The first sub-electrode 1141 may be disposed on the first conductive semiconductor layer 1111. For example, in the light emitting device 1100 according to the embodiment, the first sub-electrode 1141 may be disposed on the upper surface of the first conductive semiconductor layer 1111 which is exposed by removing a portion of the second conductive semiconductor layer 1113 and a portion of the active layer 1112.

For example, the first sub-electrode 1141 may be provided in a linear shape. In addition, the first sub-electrode 1141 may include an N region having an area relatively larger than other regions having the linear shape. The N region of the first sub-electrode 1141 may be electrically connected to the first electrode 1171 to be provided later.

The first sub-electrode 1141 may be electrically connected to the upper surface of the first conductive semiconductor layer 1111 through the second opening h2 provided in the first reflective layer 1161. For example, the first sub-electrode 1141 may make direct contact with the upper surface of the first conductive semiconductor layer 1111 in the N regions.

The second sub-electrode 1142 may be electrically connected to the second conductive semiconductor layer 1113. The second sub-electrode 1142 may be disposed on the second conductive semiconductor layer 1113. According to the embodiment, the ohmic contact layer 1130 may be disposed between the second sub-electrode 1142 and the second conductive semiconductor layer 1113.

For example, the second sub-electrode 1142 may be provided in a linear shape. In addition, the second sub-electrode 1142 may include a P region having an area relatively larger than other regions having the linear shape. The P region of the second sub-electrode 1142 may be electrically connected to the second electrode 1172 to be provided later.

The second sub-electrode 1142 may be electrically connected to the upper surface of the second conductive semiconductor layer 1113 through the first opening h1 provided in the second reflective layer 1162. For example, the second sub-electrode 1142 may be electrically connected to the second conductive semiconductor layer 1113 through the ohmic contact layer 1130 in the plurality of P regions. The second sub-electrode 1142 may make direct contact with the upper surface of the ohmic contact layer 1130 in the plurality of P regions.

Figure 34A:
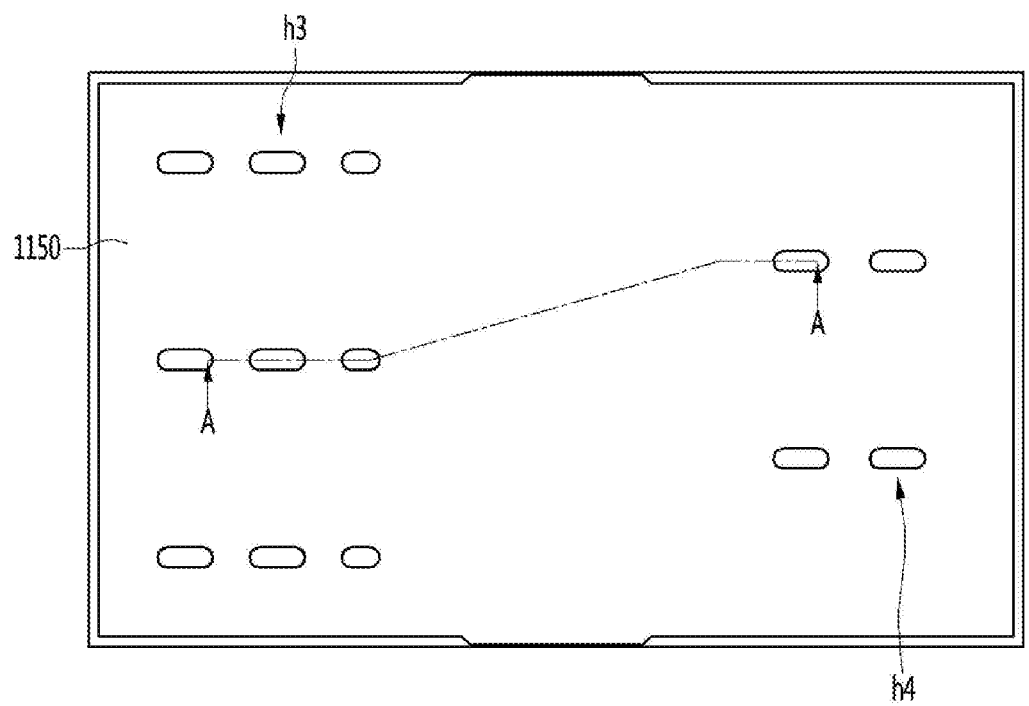
FIGS. 34a and 34b are views for describing a step in which a protective layer is formed by a method of manufacturing a light emitting device according to an embodiment of the present invention.
Figure 34B:
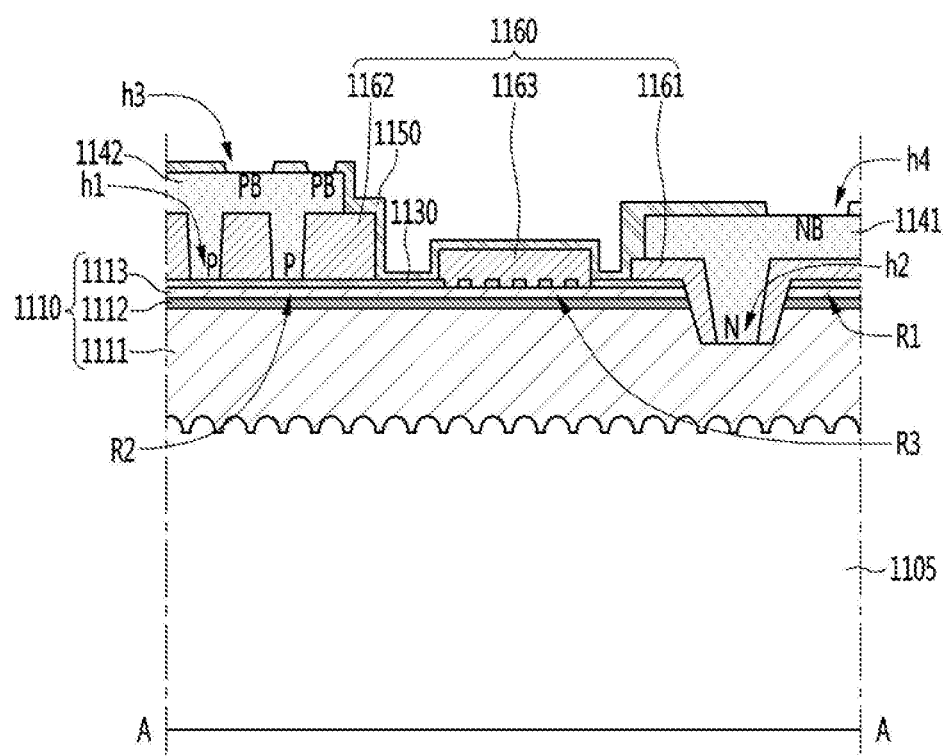

Next, as shown in FIGS. 34a and 34b, a reflective layer 1150 may be provided. FIG. 34a is a plan view showing a shape of the protective layer 1150 formed according to the method of manufacturing the light emitting device according to the embodiment, and FIG. 34b is a process sectional view taken along line A-A of the light emitting device shown in FIG. 34a.

The protective layer 1150 may be disposed on the first sub-electrode 1141 and the second sub-electrode 1142. The protective layer 1150 may be disposed on the reflective layer 1160.

The protective layer 1150 may include a fourth opening h4 for exposing the upper surface of the first sub-electrode 1141. The protective layer 1150 may include the fourth openings h4 for exposing a plurality of NB regions of the first sub-electrode 1141.

The fourth opening h4 may be provided on a region where the first reflective layer 1161 is disposed. In addition, the fourth opening h4 may be provided on the first region R1 of the ohmic contact layer 1130.

The protective layer 1150 may include the third opening h3 for exposing the upper surface of the second sub-electrode 1142. The protective layer 1150 may include the third openings h3 for exposing the PB regions of the second sub-electrode 1142.

The third opening h3 may be provided on a region where the second reflective layer 1162 is disposed. In addition, the third opening h3 may be provided on the second region R2 of the ohmic contact layer 1130.

Figure 35A:
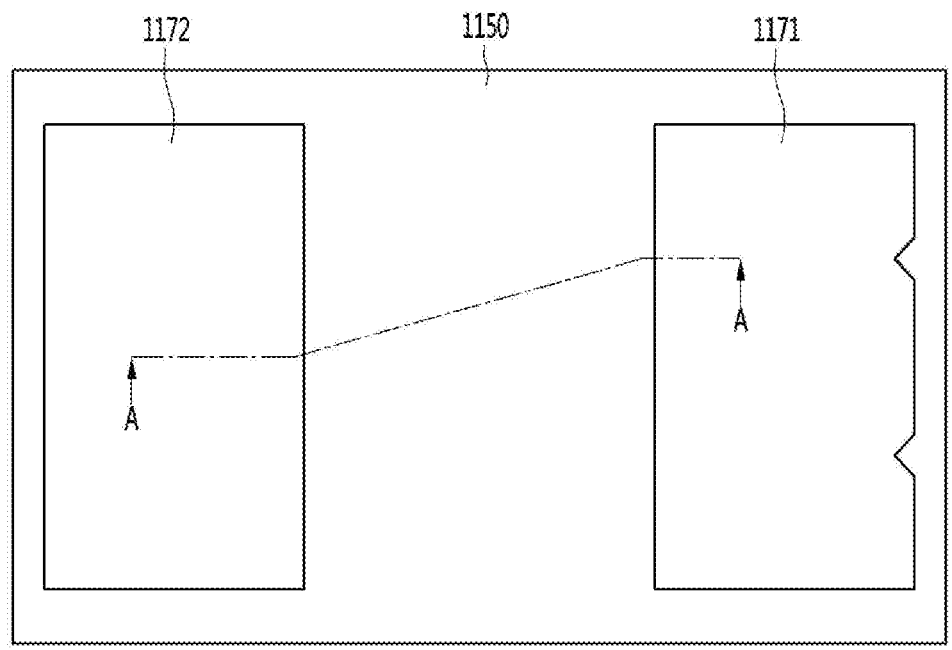
FIGS. 35a and 35b are views for describing a step in which a first electrode and a second electrode are formed by a method of manufacturing a light emitting device according to an embodiment of the present invention.
Figure 35B:
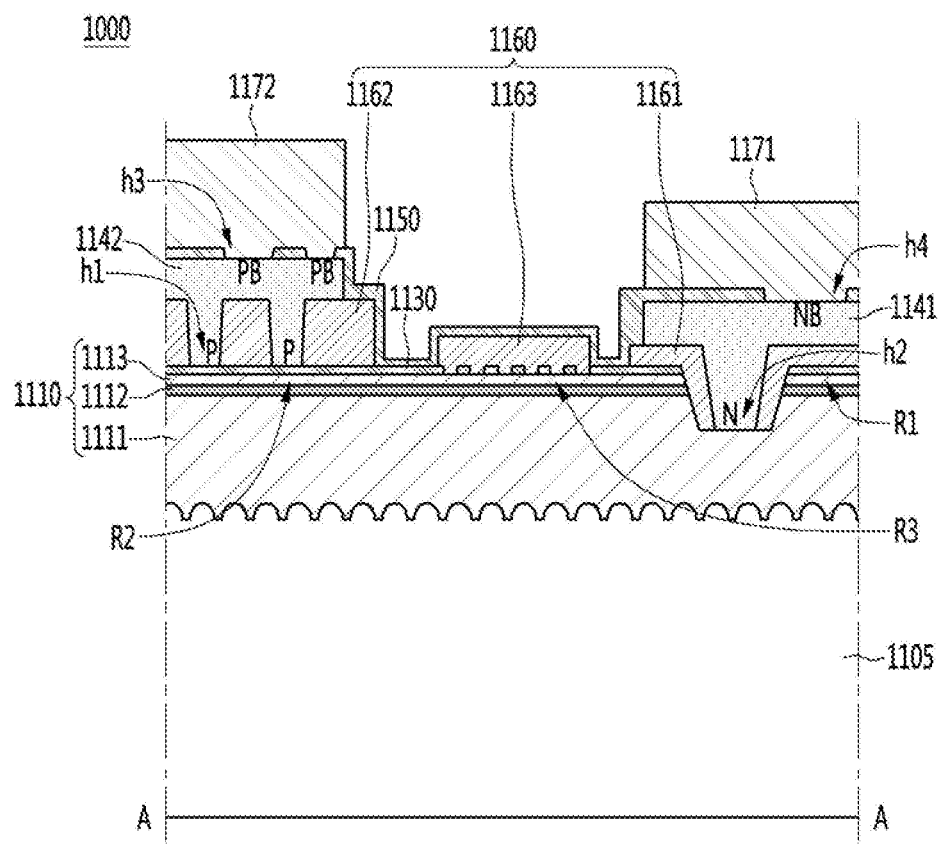

Subsequently, as shown in FIGS. 35a and 35b, the first electrode 1171 and the second electrode 1172 may be provided. FIG. 35a is a plan view showing shapes of the first electrode 1171 and the second electrode 1172 formed according to the method of manufacturing the light emitting device according to the embodiment, and FIG. 35b is a process sectional view taken along the line A-A of the light emitting device shown in FIG. 35a.

According to the embodiment, the first electrode 1171 and the second electrode 1172 may be provided in the shape shown in FIG. 35a. The first electrode 1171 and the second electrode 1172 may be disposed on the protective layer 1150.

The first electrode 1171 may be disposed on the first reflective layer 1161. The second electrode 1172 may be disposed on the second reflective layer 1162. The second electrode 1172 may be spaced apart from the first electrode 1171.

The first electrode 1171 may make contact with the upper surface of the first sub-electrode 1141 through the fourth opening h4 provided in the protective layer 1150 in the NB regions. The second electrode 1172 may make contact with the upper surface of the second sub-electrode 1142 through the third opening h3 provided in the protective layer 1150 in the PB regions.

According to the embodiment, the power is applied to the first electrode 1171 and the second electrode pad 172, so that the light emitting structure 1110 may emit light.

Thus, according to the light emitting device 1100 of the embodiment, the first electrode 1171 may make contact with the first sub-electrode 1141 in the multiple regions. In addition, the second electrode 1172 may make contact with the second sub-electrode 1142 in the multiple regions. Thus, according to the embodiment, because the power may be supplied through the regions, a current dispersion effect can be generated and an operating voltage can be reduced according to the increase of a contact area and the dispersion of a contact region.

INDUSTRIAL APPLICABILITY

The light emitting device package according to the embodiment may be applied to the light source apparatus.

Further, the light source apparatus may include a display apparatus, a lighting apparatus, a head lamp, and the like based on the industrial field.

As an example of the light source apparatus, the display apparatus includes a bottom cover, a reflective plate disposed on the bottom cover, a light emitting module emitting light and including a light emitting device, a light guide plate disposed on a front of the reflective plate and guiding light emitted from the light emitting module, an optical sheet including prism sheets disposed in front of the light guide plate, a display panel disposed in front of the optical sheet, an image signal output circuit connected to the display panel and supplying an image signal to the display panel, and a color filter disposed in front of the display panel. Herein, the bottom cover, the reflective plate, the light emitting module, the light guide plate, and the optical sheet may form a backlight unit. In addition, the display apparatus may have a structure in which light emitting devices each emitting red, green, and blue light are disposed without including the color filter.

As another example of the light source apparatus, the head lamp may include a light emitting module including a light emitting device package disposed on a substrate, a reflector for reflecting light emitted from the light emitting module in a predetermined direction, for example, in a forward direction, a lens for forwardly refracting the light, and a shade for blocking or reflecting a portion of the light reflected by the reflector and directed to the lens to form a light distribution pattern desired by a designer.

The lighting apparatus as another light source apparatus may include a cover, a light source module, a heat sink, a power supply, an inner case, and a socket. In addition, the light source apparatus according to an embodiment may further include at least one of a member and a holder. The light source module may include a light emitting device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by anyone having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

The invention claimed is:

1. A light emitting device package comprising:
first and second frames spaced apart from each other;
a package body including a body portion disposed between the first and second frames;
a light emitting device including first and second electrode pads;
a first through hole in the first frame;
a second through hole in the second frame;
a first resin disposed between the body portion of the package body and the light emitting device;
a conductive material disposed in the first and second through holes; and
a first recess disposed between the first frame and the second frame,
wherein the first recess is in an upper surface of the body portion,
wherein the first resin is in the first recess,
wherein the first electrode pad of the light emitting device overlaps with the first through hole in the first frame,
wherein the second electrode pad of the light emitting device overlaps with the second through hole in the second frame,
wherein the first and second electrode pads are spaced apart from each other, and
wherein the conductive material in the first and second through holes respectively contacts the first and second electrode pads, and a first side surface of the first electrode pad and a second side surface of the second electrode pad facing the first side surface both contact the first resin disposed between the body portion of the package body and the light emitting device.

2. The light emitting device package of claim 1, wherein the first recess extends past a first outer edge of the package body and a second outer edge of the package body opposite to the first outer edge.

3. The light emitting device package of claim 1, further comprising:
a second recess disposed in the first and second frames; and
a second resin disposed in the second recess,
wherein the second recess at least partially surrounds the first through hole in the first frame and the second through hole in the second frame.

4. The light emitting device package of claim 3, wherein the second recess includes a first part in the first frame and a second part in the second frame.

5. The light emitting device package of claim 4, wherein the first recess is connected to the second recess.

6. The light emitting device package of claim 5, wherein the first recess and the second recess surround the first through hole in the first frame and the second through hole in the second frame.

7. The light emitting device package of claim 3, wherein the first recess is separated from the second recess.

8. The light emitting device package of claim 3, wherein the second recess surrounds the first recess.

9. The light emitting device package of claim 3, wherein a first depth of the first recess is the same as a second depth of the second recess.

10. The light emitting device package of claim 3, wherein a first depth of the first recess is different than a second depth of the second recess.

11. The light emitting device package of claim 1, wherein a top of the first through hole in the first frame has a rectangular shape, and
wherein a top of the second through hole in the second frame has a rectangular shape.

12. A light emitting device package comprising:
first and second frames spaced apart from each other;
a package body including a body portion disposed between the first and second frames;
a light emitting device including first and second electrode pads;
a first resin disposed directly between the body portion of the package body and the light emitting device and making contact with the first and second electrode pads;
a first through hole in the first frame and including a first inner inclined surface having a first slope;
a second through hole in the second frame and including a second inner inclined surface having a second slope;
a conductive material disposed in the first and second through holes; and
a cavity in the package body and including a third inner inclined surface having a third slope,
wherein the body portion is between the first frame and the second frame,
wherein the light emitting device is disposed within the cavity in the package body,
wherein the first electrode pad of the light emitting device overlaps with the first through hole in the first frame,
wherein the second electrode pad of the light emitting device overlaps with the second through hole in the second frame, and
wherein the first and second electrode pads are spaced apart from each other.

13. The light emitting device package of claim 12, wherein the third slope of the third inner inclined surface of the cavity is different than the first and second slopes of the first and second inner inclined surfaces of the first and second through holes.

14. The light emitting device package of claim 12, wherein the third slope is a negative slope and the first and second slopes are positive slopes.

15. The light emitting device package of claim 12, wherein the third inner inclined surface is inclined in an opposite direction than the first and second inner inclined surfaces.

16. The light emitting device package of claim 12, further comprising:
a first recess disposed between the first frame and the second frame,
wherein the first recess is in an upper surface of the body portion, and
wherein the first resin is in the first recess.

17. The light emitting device package of claim 16, further comprising:
a second recess disposed in the first and second frames; and
a second resin disposed in the second recess,
wherein the second recess at least partially surrounds the first through hole in the first frame and the second through hole in the second frame, and
wherein the second recess includes a first part in the first frame and a second part in the second frame.

18. The light emitting device package of claim 17, wherein the first recess is connected to the second recess.

19. The light emitting device package of claim 16, wherein the first resin is further disposed outside the first recess on the body portion.

* * * * *